US008304168B2

(12) United States Patent
Taguchi

(10) Patent No.: US 8,304,168 B2
(45) Date of Patent: Nov. 6, 2012

(54) LITHOGRAPHIC PRINTING PLATE PRECURSOR AND PROCESS FOR PRODUCING LITHOGRAPHIC PRINTING PLATE

(75) Inventor: Yoshinori Taguchi, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 487 days.

(21) Appl. No.: 12/564,481

(22) Filed: Sep. 22, 2009

(65) Prior Publication Data

US 2010/0075255 A1 Mar. 25, 2010

(30) Foreign Application Priority Data

Sep. 25, 2008 (JP) ................................ 2008-246972

(51) Int. Cl.
*G03F 7/027* (2006.01)
*G03F 7/32* (2006.01)

(52) U.S. Cl. .................. 430/284.1; 430/273.1; 430/302; 522/90; 522/97

(58) Field of Classification Search ........................ None
See application file for complete search history.

(56) References Cited

U.S. PATENT DOCUMENTS

| | | | | | |
|---|---|---|---|---|---|
| 4,714,751 | A * | 12/1987 | Schornick et al. | ............ | 528/103 |
| 5,085,975 | A * | 2/1992 | Mueller | ..................... | 430/285.1 |
| 6,689,537 | B2 * | 2/2004 | Urano et al. | ............... | 430/273.1 |
| 7,169,534 | B2 * | 1/2007 | Baumann et al. | .......... | 430/276.1 |
| 2005/0031986 | A1 | 2/2005 | Kakino | | |

FOREIGN PATENT DOCUMENTS

| | | | |
|---|---|---|---|
| EP | 1 518 704 | A1 | 3/2005 |
| EP | 1 566 267 | A2 | 8/2005 |
| EP | 1 710 627 | A1 | 10/2006 |
| EP | 1868036 | A1 | 12/2007 |
| JP | 11-065126 | A | 3/1999 |
| JP | 2007-538279 | A | 12/2007 |
| WO | WO-2005/111727 | A1 * | 11/2005 |

OTHER PUBLICATIONS

Extended European Search Report dated Feb. 6, 2012 on EP Application No. 09012151.8.

* cited by examiner

*Primary Examiner* — Cynthia Hamilton
(74) *Attorney, Agent, or Firm* — Sughrue Mion, PLLC

(57) ABSTRACT

A lithographic printing plate precursor is provided that includes, above a support, a photosensitive layer including (i) a binder polymer, (ii) an ethylenically unsaturated compound, and (iii) a polymerization initiator, the ethylenically unsaturated compound (ii) including a compound represented by Formula (1) below.

(1)

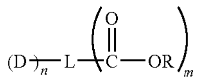

(In Formula (1), L denotes an (m+n)-valent linking group, the Ds independently denote a group selected from the group consisting of groups represented by Formulae (A) to (D) below, the Rs independently denote a monovalent substituent, m denotes an integer of 1 to 20, and n denotes an integer of 2 to 20.)

(A)

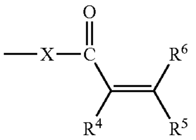

(B)

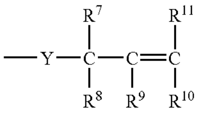

(C)

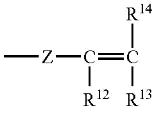

(D)

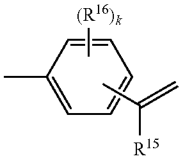

(In Formulae (A) to (D), X, Y, and Z independently denote an oxygen atom, a sulfur atom, or $NR^{17}$, $R^4$ to $R^{14}$ and $R^{17}$ independently denote a hydrogen atom or a monovalent substituent, $R^{15}$ denotes a hydrogen atom or a methyl group, $R^{16}$ denotes a monovalent substituent, and k denotes an integer of 0 to 4.)

There is also provided a process for producing a lithographic printing plate, including an exposure step of imagewise exposing the lithographic printing plate precursor and a development step of removing the photosensitive layer of a non-exposed portion in the presence of a developer having buffering capacity.

18 Claims, 1 Drawing Sheet

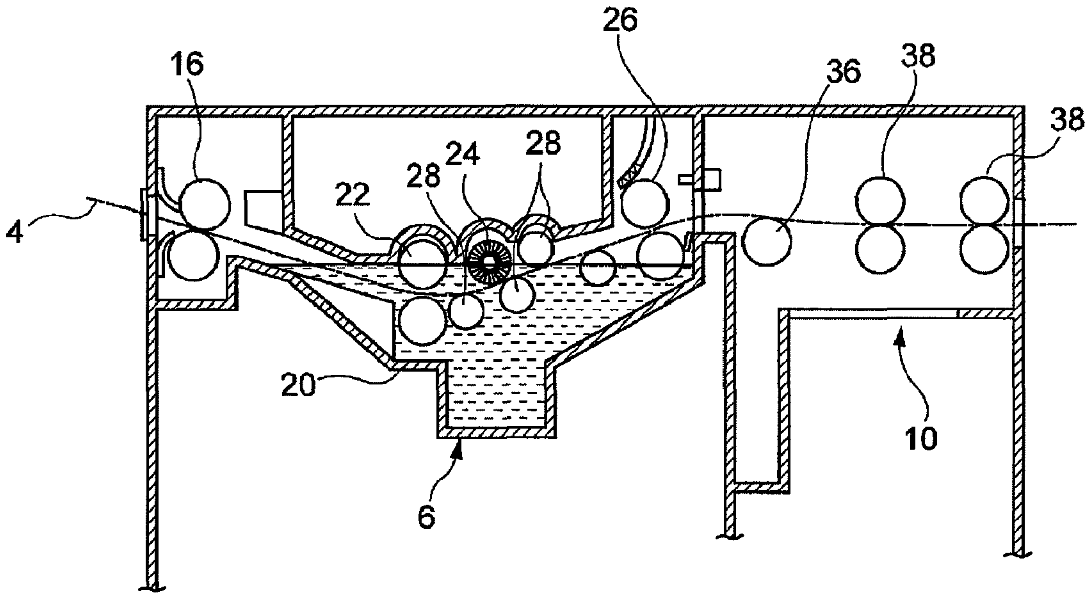
26
16
36
38
38
28
24
28
22
4
20
6
10

LITHOGRAPHIC PRINTING PLATE PRECURSOR AND PROCESS FOR PRODUCING LITHOGRAPHIC PRINTING PLATE

TECHNICAL FIELD

The present invention relates to a lithographic printing plate precursor and a process for producing a lithographic printing plate.

BACKGROUND ART

In general, a lithographic printing plate is formed from a lipophilic image area for accepting ink and a hydrophilic non-image area for accepting dampening water in a printing process. Lithographic printing is a printing process in which the property of water and printing ink repelling each other is utilized so as to cause a difference in ink attachment on the surface of a lithographic printing plate with a lipophilic image area of the lithographic printing plate as an ink-accepting area and a hydrophilic non-image area as a dampening water-accepting area (non-ink-accepting area), and after inking only the image area ink is transferred to a printing substrate such as paper.

In order to make this lithographic printing plate, a lithographic printing plate precursor (PS plate) formed by providing a lipophilic photosensitive resin layer (photosensitive layer, image recording layer) on a hydrophilic support is widely used in the art. A lithographic printing plate is usually obtained by a process in which, after the lithographic printing plate precursor is exposed through an original image such as a lith film, an area that becomes an image area of the image recording layer is made to remain, and unwanted image recording layer other than this is removed by dissolving using an alkaline developer or an organic solvent to thus form a non-image area in which the surface of the hydrophilic support is exposed.

In this way, in the conventionally known plate-making process of a lithographic printing plate precursor, after the exposure as described above, a step of removing unnecessary image recording layer by dissolving, for example, with a developer is required, but from the viewpoint of the environment and safety carrying out processing with a developer that is closer to neutral or reducing the amount of liquid waste are issues. In particular, since in recent years the disposal of liquid waste discharged accompanying wet treatment has become a great concern throughout the industrial world from the viewpoint of consideration for the global environment, the demand for a solution to the above-mentioned issues has been increasing more and more.

On the other hand, digitization techniques involving electronically processing, storing, and outputting image information by computer have spread widely in recent years, and various new image output methods used with such digitization techniques have been put into practical use. Accompanying this, a computer-to-plate (CTP) technique in which a lithographic printing plate is produced directly without a lith film by carrying digitalized image information in highly convergent radiant rays such as laser light and scanning and exposing a lithographic printing plate precursor with this light has been attracting attention.

JP-A-11-65126 (JP-A denotes a Japanese unexamined patent application publication) for example proposes a development method in which processing is carried out using a developer comprising an alkali metal carbonate and hydrogen carbonate, the developer having a pH of 8.5 to 11.5 and a conductivity of 3 to 30 mS/cm.

Furthermore, an example of EP-A-1868036 describes processing using a processing liquid comprising a water-soluble polymer compound and having a pH of 11.9 to 12.1.

Published Japanese translation 2007-538279 of a PCT application describes processing using a processing liquid comprising a water-soluble polymer compound and having a pH of 3 to 9.

DISCLOSURE OF INVENTION

Problems to be Solved by the Invention

As described above, there has been an increasingly strong desire for decreasing the alkalinity of a developer and simplifying the processing step both from the viewpoint of consideration of the global environment and from the viewpoint of accommodating space saving and low running cost. However, the conventional development process comprises three steps, that is, developing using an aqueous solution of an alkali having a pH of at least 11, then washing away alkali agent using a water washing bath, and subsequently treating using a gumming liquid containing a hydrophilic resin as a main component; because of this an automatic processor itself occupies a large space, and there are still problems in terms of the environment and running cost such as disposal of development effluent, water washing effluent, and gumming effluent.

In the lithographic printing plate precursor described in JP-A-11-65126, if processing is carried out using a developer having a reduced pH, when a large quantity is processed there is the problem that a residue originating from an ethylenically unsaturated compound is easily formed in the developer, and when printing is carried out using a printer after the exposure and development process, there is the problem that a halftone dot part (small dot part) becomes thinner.

Furthermore, in EP-A-1868036, alkali having a pH of 12 is attached to the plate surface of a printing plate thus obtained; there is a problem in terms of operator safety, and when after the printing plate is prepared there is a long time before printing, an image area gradually dissolves, thus leading to problems with reduced plate life or ink laydown.

Furthermore, in a process for producing a lithographic printing plate described in Published Japanese translation 2007-538279 of a PCT application, since the processing liquid does not contain a base component, it is necessary to make a polymer in a photosensitive layer hydrophilic so as to make it developable, and there is the problem that the plate life is greatly degraded.

The present invention has been accomplished in the light of the above-mentioned circumstances, and it is an object of the present invention to provide a lithographic printing plate precursor that has excellent halftone dot reproduction and that suppresses the formation of development residue in a developer during development, and a process for producing a lithographic printing plate.

Means for Solving the Problems

The object of the present invention has been attained by means described in <1> or <4>. They are described below together with <2>, <3>, and <5> to <10>, which are preferred embodiments.

<1> A lithographic printing plate precursor comprising above a support a photosensitive layer comprising (i) a binder polymer, (ii) an ethylenically unsaturated compound, and (iii) a polymerization initiator, the ethylenically unsaturated compound (ii) comprising a compound represented by Formula (1) below, (1)

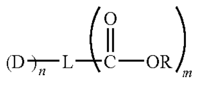

(In Formula (1), L denotes an (m+n)-valent linking group, the Ds independently denote a group selected from the group consisting of groups represented by Formulae (A) to (D) below, the Rs independently denote a monovalent substituent, m denotes an integer of 1 to 20, and n denotes an integer of 2 to 20.)

(A)

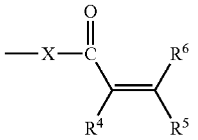

(B)

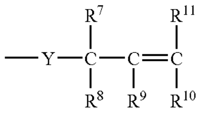

(C)

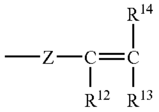

(D)

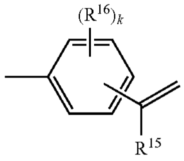

(In Formulae (A) to (D), X, Y, and Z independently denote an oxygen atom, a sulfur atom, or $NR^{17}$, $R^4$ to $R^{14}$ and $R^{17}$ independently denote a hydrogen atom or a monovalent substituent, $R^{15}$ denotes a hydrogen atom or a methyl group, $R^{16}$ denotes a monovalent substituent, and k denotes an integer of 0 to 4.)

<2> the lithographic printing plate precursor according to <1> above, wherein D in Formula (1) above is a group represented by Formula (A), <3> the lithographic printing plate precursor according to <1> or <2> above, wherein L in Formula (1) above is a group having a urethane bond, <4> a process for producing a lithographic printing plate, comprising an exposure step of imagewise exposing the lithographic printing plate precursor according to any one of <1> to <3> above and a development step of removing the photosensitive layer of a non-exposed portion in the presence of a developer having buffering capacity, <5> the process for producing a lithographic printing plate according to <4> above, wherein the developer having buffering capacity has a pH of 7.5 to 11.0, <6> the process for producing a lithographic printing plate according to <4> or <5> above, wherein the developer having buffering capacity is a developer comprising (a) a combination of carbonate ion-hydrogen carbonate ion, (b) borate ion, or (c) a combination of water-soluble amine compound-ion of the amine compound, <7> the process for producing a lithographic printing plate according to any one of <4> to <6> above, wherein the developer having buffering capacity is a developer comprising (a) a combination of carbonate ion-hydrogen carbonate ion, <8> the process for producing a lithographic printing plate according to any one of <4> to <7> above, wherein the developer having buffering capacity comprises a water-soluble polymer compound, <9> the process for producing a lithographic printing plate according to any one of <4> to <8> above, wherein the development step is a step of carrying out using a single liquid removal of the photosensitive layer of a non-exposed portion and a gumming treatment, and <10> the process for producing a lithographic printing plate according to any one of <4> to <9> above, wherein a water-washing step is not carried out either prior to or subsequent to the development step.

BRIEF DESCRIPTION OF DRAWINGS

FIG. 1 is an explanatory diagram showing the structure of an automatic development processor.

EXPLANATION OF REFERENCE NUMERALS AND SYMBOLS

| | |
|---|---|
| 4 | Lithographic printing plate precursor |
| 6 | Development section |
| 10 | Drying section |
| 16 | Transport roller |
| 20 | Development tank |
| 22 | Transport roller |
| 24 | Brush roller |
| 26 | Squeegee roller |
| 28 | Backup roller |
| 36 | Guide roller |
| 38 | Skewer roller |

BEST MODE FOR CARRYING OUT THE INVENTION

The lithographic printing plate precursor and the process for producing a lithographic printing plate of the present invention are explained in detail below.

Lithographic Printing Plate Precursor

The lithographic printing plate precursor of the present invention comprises above a support a photosensitive layer comprising (i) a binder polymer, (ii) an ethylenically unsaturated compound, and (iii) a polymerization initiator, the ethylenically unsaturated compound (ii) comprising a compound represented by Formula (1) below.

(1)

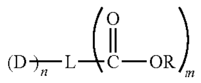

(In Formula (1), L denotes an (m+n)-valent linking group, the Ds independently denote a group selected from the group consisting of groups represented by Formulae (A) to (D)

below, R denotes a monovalent substituent, m denotes an integer of 1 to 20, and n denotes an integer of 2 to 20.)

(A)

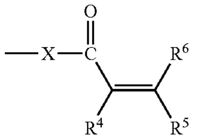

(B)

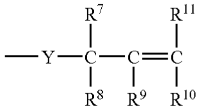

(C)

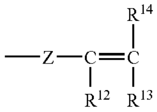

(D)

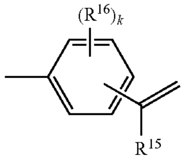

(In Formulae (A) to (D), X, Y, and Z independently denote an oxygen atom, a sulfur atom, or $NR^{17}$, $R^4$ to $R^{14}$ and $R^{17}$ independently denote a hydrogen atom or a monovalent substituent, $R^{15}$ denotes a hydrogen atom or a methyl group, $R^{16}$ denotes a monovalent substituent, and k denotes an integer of 0 to 4.)

The lithographic printing plate precursor of the present invention is a negative-working lithographic printing plate precursor and can suitably be developed using a developer having buffering capacity.

Since the lithographic printing plate precursor of the present invention comprises a photosensitive layer having the above-mentioned constitution, it has excellent developability, sensitivity, plate life, and halftone dot reproduction and can suppress the formation of development residue in a developer during development.

Although the mechanism of action in the lithographic printing plate precursor of the present invention is not clear, it is surmised to be as follows.

The ethylenically unsaturated compound is heavily involved in the penetrability of the developer and greatly influences the developability. When the hydrophilicity of the ethylenically unsaturated compound is increased, the developability improves, but since the plate life is greatly degraded (it is surmised that this is due to improvement in the penetrability of the developer to an image area and compatibility with a binder polymer), from the viewpoint of plate life a hydrophobic (meth)acryloyl compound has suitably been used as a conventional ethylenically unsaturated compound.

It is surmised that, in the present invention, in accordance with the use of a specific ethylenically unsaturated compound having an ester bond introduced thereinto, a hydrolysis reaction of the ester bond progresses in the developer to thus turn it into a carboxylic acid salt, thereby greatly improving the hydrophilicity and suppressing development residue. In particular, the lithographic printing plate precursor of the present invention can suppress development residue even when a low alkalinity developer (pH=7.5 to 11.0), which easily forms development residue, is used for development. Furthermore, it is surmised that since polarity conversion (hydrophobic→hydrophilic) in which the ester bond is hydrolyzed in the developer is utilized, penetration of the developer to an image area is unlikely, and development residue can be suppressed while maintaining sensitivity and plate life.

Furthermore, when the pH of the developer is decreased, the penetrability of the developer to the interior of a printing plate is degraded. A side-edge part that has a low degree of curing and is not cured well, which would be developed when developed in a high pH region, is hardly developed in a low pH region and remains. It is surmised that the side-edge part that is not well cured is broken by pressure, etc. during printing, and narrowing of a halftone dot part occurs.

It is surmised that, since adding at least one type of compound containing a carboxylic acid ester bond represented by Formula (1) as the ethylenically unsaturated compound enables the penetrability of the developer to be improved and the side-edge part to be removed by development, narrowing of a halftone dot part during printing can be suppressed.

On the other hand, the developer penetrability can also be improved by adding a surfactant, etc., but although the developability improves, penetration of the developer to an image area is also promoted, and the plate life is thereby degraded.

By adding at least one type of compound represented by Formula (1), it becomes possible to improve the developability of a non-image area only when an alkaline developer penetrates, and in an image area the developer penetrability can be suppressed by means of curing by an ethylenically unsaturated group undergoing a polymerization reaction. It is surmised that in this way, since in a non-image area penetration of developer can be promoted and in an image area penetration of developer can be suppressed, narrowing of a halftone dot part during printing can be suppressed while maintaining plate life.

Support

A support that can be used for a lithographic printing plate precursor of the present invention is not particularly limited, and a dimensionally stable sheet-form support may be used. The support is preferably a hydrophilic support. It is preferable that a material forming the support has a hydrophilic surface from the viewpoint of the image quality of the printed material thus obtained.

Examples of materials forming the support include paper, paper laminated with a plastic (e.g. polyethylene, polypropylene, polystyrene, etc.), a metal sheet (e.g. aluminum, zinc, copper, etc.), a plastic film (e.g. cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, polyvinyl acetal, etc.), and paper or plastic film on which the above-mentioned metal is laminated or vapor-deposited. Preferred examples of the support include a polyester film and aluminum sheet. Among these, aluminum sheet is particularly preferable since the dimensional stability is good and it is relatively inexpensive.

The aluminum sheet is a pure aluminum sheet, an alloy sheet containing aluminum as a main component and a small amount of a different element, or a thin film of aluminum or an aluminum alloy laminated with a plastic. Examples of the different element contained in the aluminum alloy include silicon, iron, manganese, copper, magnesium, chromium, zinc, bismuth, nickel, and titanium. The content of the different element in the alloy is preferably equal to or less than 10 wt %. In the present invention, a pure aluminum sheet is preferable, but since it is difficult to produce completely pure aluminum because of the refining technique, a trace amount of a different element may be contained. The composition of the aluminum sheet is not specified, and a known generally used material may be utilized as appropriate.

The support preferably has a thickness of 0.1 to 0.6 mm, more preferably 0.15 to 0.4 mm, and yet more preferably 0.2 to 0.3 mm.

Prior to the aluminum sheet being used, it is preferably subjected to a surface treatment such as a surface roughening treatment or an anodizing treatment. Surface treatment makes it easy to improve the hydrophilicity and ensure that there is good adhesion between an image-forming layer and the support. Prior to the aluminum sheet being subjected to the surface roughening treatment, it may be subjected as desired to a degreasing treatment using a surfactant, an organic solvent, an aqueous alkaline solution, etc. in order to remove rolling oil on the surface.

The surface roughening treatment for the aluminum sheet surface may be carried out by various types of methods, and examples thereof include a mechanical surface roughening treatment, an electrochemical surface roughening treatment (a surface roughening treatment involving dissolving the surface electrochemically), and a chemical surface roughening treatment (a surface roughening treatment involving selectively dissolving the surface chemically).

As a method for the mechanical surface roughening treatment, a known method such as a ball grinding method, a brush grinding method, a blast grinding method, or a buff grinding method may be used.

As a method for the electrochemical surface roughening treatment, for example, a method in which alternating current or direct current is applied in an electrolyte solution containing an acid such as hydrochloric acid or nitric acid can be cited. It is also possible to employ a method as described in JP-A-54-63902 in which a mixed acid is used.

The aluminum sheet subjected to a surface roughening treatment is subjected as necessary to an alkali etching treatment using an aqueous solution of potassium hydroxide, sodium hydroxide, etc.; furthermore, after neutralization, it may be subjected to an anodizing treatment as desired in order to improve the abrasion resistance.

As an electrolyte that may be used for the anodizing treatment of the aluminum sheet, various types of electrolytes that form a porous oxide film may be used. In general, sulfuric acid, hydrochloric acid, oxalic acid, chromic acid, or a mixed acid thereof may be used. The concentration of the electrolyte may be determined as appropriate according to the type of electrolyte.

Conditions for the anodizing treatment depend on the type of electrolyte used and cannot be specified, but in general the electrolyte solution concentration is 1 to 80 wt %, the solution temperature is 5° C. to 70° C., the current density is 5 to 60 $A/dm^2$, the voltage is 1 to 100V, and the electrolysis time is 10 sec. to 5 min. The amount of anodized film formed is preferably 1.0 to 5.0 $g/m^2$, and more preferably 1.5 to 4.0 $g/m^2$. It is preferable for it to be in this range since good plate life and good scratch resistance of a non-image area of a lithographic printing plate can be obtained.

As the support that can be used in the present invention, a substrate that has been subjected to the above-mentioned surface treatment and has an anodized film may be used as it is, but in order to further improve the adhesion to the upper layer, and the hydrophilicity, the contamination resistance, insulation ability, etc., the substrate may appropriately be subjected as necessary to a treatment for enlarging micropores of the anodized film, a sealing treatment, or a surface hydrophilization treatment involving immersion in an aqueous solution containing a hydrophilic compound, which are described in JP-A-2001-253181 or JP-A-2001-322365. These enlarging and sealing treatments are not limited to those described therein, and any conventionally known methods may be employed.

The sealing treatment may be vapor sealing, a treatment with an aqueous solution containing an inorganic fluorine compound such as a single treatment with fluorozirconic acid or a treatment with sodium fluoride, vapor sealing with added lithium chloride, or a sealing treatment with hot water.

Among these, the sealing treatment with an aqueous solution containing an inorganic fluorine compound, the sealing treatment with vapor, and the sealing treatment with hot water are preferable.

With regard to a hydrophilization treatment, there is an alkali metal silicate method, as disclosed in U.S. Pat. Nos. 2,714,066, 3,181,461, 3,280,734, and 3,902,734. In this method, a support is immersed in an aqueous solution of sodium silicate, etc., or subjected to electrolysis. In addition, there is a method in which a support is treated with potassium fluorozirconate, as described in JP-B-36-22063, and a method in which a support is treated with polyvinylphosphonic acid, as described in U.S. Pat. Nos. 3,276,868, 4,153,461, and 4,689,272.

When a support having insufficient surface hydrophilicity such as a polyester film is used as a support, it is preferable to coat the surface with a hydrophilic layer so as to make the surface hydrophilic.

As the hydrophilic layer, a hydrophilic layer, described in JP-A-2001-199175, formed by coating with a coating liquid containing a colloid of an oxide or hydroxide of at least one element selected from the group consisting of beryllium, magnesium, aluminum, silicon, titanium, boron, germanium, tin, zirconium, iron, vanadium, antimony, and a transition metal, a hydrophilic layer, described in JP-A-2002-79772, having an organic hydrophilic matrix obtained by crosslinking or pseudo-crosslinking an organic hydrophilic polymer, a hydrophilic layer having an inorganic hydrophilic matrix obtained by sol-gel exchange involving dehydration and condensation reactions of a polyalkoxysilane, titanate, zirconate or aluminate, or a hydrophilic layer formed from an organic thin film having a surface containing a metal oxide is preferable. Among them, a hydrophilic layer formed by coating with a coating liquid containing a colloid of an oxide or hydroxide of silicon is preferable.

Furthermore, when a polyester film, etc. is used as a support, it is preferable to provide an antistatic layer on a hydrophilic layer side, the opposite side, or both sides of the support. When an antistatic layer is provided between the support and a hydrophilic layer, it also contributes to an improvement in adhesion to the hydrophilic layer. As an antistatic layer, a polymer layer, described in JP-A-2002-79772, in which metal oxide microparticles or a matting agent are dispersed, etc. may be used.

The support preferably has a center line average roughness of 0.10 to 1.2 μm. When in the above-mentioned range, good adhesion to the photosensitive layer, good plate life, and good stain resistance can be obtained.

Moreover, the color density of the support is preferably 0.15 to 0.65 as a reflection density value. When in the above-mentioned range, it is possible to obtain good image formation properties by preventing halation during imagewise exposure and to obtain good ease of plate inspection after development.

Image-forming Layer

An image-forming layer (hereinafter, also called a ‘photosensitive layer’) in the lithographic printing plate precursor of the present invention comprises as fundamental components (i) a binder polymer, (ii) an ethylenically unsaturated compound, and (iii) a polymerization initiator.

(i) Binder Polymer

The photosensitive layer in the lithographic printing plate precursor of the present invention comprises a binder polymer.

The binder polymer is a polymer that functions as a film-forming agent of the photosensitive layer, and preferably comprises a linear organic polymer. As such a 'linear organic polymer', a known polymer may be used.

Such a binder polymer is preferably a polymer selected from the group consisting of an acrylic resin, a polyvinylacetal resin, a polyurethane resin, a polyamide resin, an epoxy resin, a styrene-based resin, a polyester resin, and a butyral resin. Among them, an acrylic resin, a polyurethane resin and a butyral resin are more preferable. The 'acrylic resin' referred to here means an acrylic polymer having acrylic acid, methacrylic acid, and/or a derivative thereof as a (co)polymer component. The 'polyurethane resin' referred to here means a polymer formed by a condensation reaction of a compound having two isocyanate groups and a compound having two or more hydroxy groups.

Crosslinking properties may be imparted to the binder polymer in order to increase the film strength of the image area.

In order to impart crosslinking properties to the binder polymer, a crosslinkable functional group such as an ethylenically unsaturated bond, is introduced into a main chain or side chain of the polymer. The crosslinkable functional group may be introduced by copolymerization or a polymer reaction.

The term 'crosslinkable group' as used herein means a group capable of crosslinking the binder polymer in the process of a radical polymerization reaction caused in the photosensitive layer when the lithographic printing plate precursor is exposed. The crosslinkable group is not particularly restricted as long as it has such a function and includes, for example, an ethylenically unsaturated bond group, an amino group, or an epoxy group as a functional group capable of undergoing an addition polymerization reaction. Also, a functional group capable of forming a radical upon irradiation with light may be used and such a crosslinkable group includes, for example, a thiol group, a halogen atom, and an onium salt structure. Among them, the ethylenically unsaturated bond group is preferable, and functional groups represented by formulae (1') to (3') below are particularly preferable.

(1')

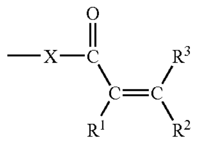

In formula (1') above, $R^1$ to $R^3$ independently denote a monovalent substituent.

$R^1$ preferably includes, for example, a hydrogen atom or an optionally substituted alkyl group, and more preferably includes a hydrogen atom or an optionally substituted alkyl group having 1 to 8 carbon atoms. Among them, a hydrogen atom or a methyl group is preferable because of high radical reactivity.

$R^2$ and $R^3$ independently denote a hydrogen atom, a halogen atom, an amino group, a carboxy group, an alkoxycarbonyl group, a sulfo group, a nitro group, a cyano group, an optionally substituted alkyl group, an optionally substituted aryl group, an optionally substituted alkoxy group, an optionally substituted aryloxy group, an optionally substituted alkylamino group, an optionally substituted arylamino group, an optionally substituted alkylsulfonyl group, an optionally substituted arylsulfonyl group, etc., and preferably denote a hydrogen atom, a halogen atom, an amino group, a carboxy group, an alkoxycarbonyl group having 2 to 20 carbon atoms, a sulfo group, a nitro group, a cyano group, an optionally substituted alkyl group having 1 to 20 carbon atoms, an optionally substituted aryl group having 6 to 20 carbon atoms, an optionally substituted alkoxy group having 1 to 20 carbon atoms, an optionally substituted aryloxy group having 6 to 20 carbon atoms, an optionally substituted alkylamino group having 1 to 20 carbon atoms, an optionally substituted arylamino group having 6 to 20 carbon atoms, an optionally substituted alkylsulfonyl group having 1 to 20 carbon atoms, an optionally substituted arylsulfonyl group having 6 to 20 carbon atoms. Among them, a hydrogen atom, a carboxy group, an alkoxycarbonyl group, an optionally substituted alkyl group having 1 to 20 carbon atoms, or an optionally substituted aryl group having 6 to 20 carbon atoms is more preferable because of high radical reactivity.

X denotes an oxygen atom, a sulfur atom, or $—N(R^{12})—$, and $R^{12}$ denotes a hydrogen atom or a monovalent substituent. The monovalent substituent denoted by $R^{12}$ includes, for example, an optionally substituted alkyl group having 1 to 8 carbon atoms. Among them, a hydrogen atom, a methyl group, an ethyl group, or an isopropyl group is preferable because of high radical reactivity.

Examples of the substituent that can be introduced include an alkyl group, an alkenyl group, an alkynyl group, an aryl group, an alkoxy group, an aryloxy group, a halogen atom, an amino group, an alkylamino group, an arylamino group, a carboxy group, an alkoxycarbonyl group, a sulfo group, a nitro group, a cyano group, an amide group, an alkylsulfonyl group, and an arylsulfonyl group. The substituent preferably has 0 to 20 carbon atoms.

(2')

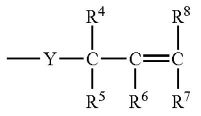

In formula (2') above, $R^4$ to $R^8$ independently denote a hydrogen atom or a monovalent substituent.

$R^4$ to $R^8$ are preferably, for example, a hydrogen atom, a halogen atom, an amino group, a dialkylamino group, a carboxy group, an alkoxycarbonyl group, a sulfo group, a nitro group, a cyano group, an optionally substituted alkyl group, an optionally substituted aryl group, an optionally substituted alkoxy group, an optionally substituted aryloxy group, an optionally substituted alkylamino group, an optionally substituted arylamino group, an optionally substituted alkylsulfonyl group, or an optionally substituted arylsulfonyl group, and more preferably a hydrogen atom, a halogen atom, an amino group, a dialkylamino group having 2 to 20 carbon atoms, a carboxy group, an alkoxycarbonyl group having 2 to 20 carbon atoms, a sulfo group, a nitro group, a cyano group, an optionally substituted alkyl group having 1 to 20 carbon atoms, an optionally substituted aryl group having 6 to 20 carbon atoms, an optionally substituted alkoxy group having 1 to 20 carbon atoms, an optionally substituted aryloxy group having 6 to 20 carbon atoms, an optionally substituted alkylamino group having 1 to 20 carbon atoms, an optionally substituted arylamino group having 6 to 20 carbon atoms, an optionally substituted alkylsulfonyl group having 1 to 20 carbon atoms, or an optionally substituted arylsulfonyl group having 6 to 20 carbon atoms. Among them, a hydrogen atom, a carboxy group, an alkoxycarbonyl group having 2 to 20 carbon atoms, an optionally substituted alkyl group having 1 to 20 carbon atoms, or an optionally substituted aryl group having 6 to 20 carbon atoms is yet more preferable.

Examples of the substituent that can be introduced include those described for Formula (1').

Y denotes an oxygen atom, a sulfur atom, or $N(R^{12})$. $R^{12}$ has the same meaning as $R^{12}$ defined in Formula (1), and preferred examples thereof are also the same.

(3')

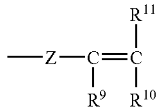

In formula (3') above, $R^9$ to $R^{11}$ independently denote a monovalent substituent.

$R^9$ preferably denotes a hydrogen atom or an optionally substituted alkyl group, and more preferably denotes a hydrogen atom or an optionally substituted alkyl group having 1 to 8 carbon atoms. Among them, a hydrogen atom or a methyl group is preferable because of high radical reactivity.

$R^{10}$ and $R^{11}$ independently denote, for example, a hydrogen atom, a halogen atom, an amino group, a dialkylamino group, a carboxy group, an alkoxycarbonyl group, a sulfo group, a nitro group, a cyano group, an optionally substituted alkyl group, an optionally substituted aryl group, an optionally substituted alkoxy group, an optionally substituted aryloxy group, an optionally substituted alkylamino group, an optionally substituted arylamino group, an optionally substituted alkylsulfonyl group, or an optionally substituted arylsulfonyl group, and preferably denotes a hydrogen atom, a halogen atom, an amino group, a dialkylamino group having 2 to 20 carbon atoms, a carboxy group, an alkoxycarbonyl group having 2 to 20 carbon atoms, a sulfo group, a nitro group, a cyano group, an optionally substituted alkyl group having 1 to 20 carbon atoms, an optionally substituted aryl group having 6 to 20 carbon atoms, an optionally substituted alkoxy group having 1 to 20 carbon atoms, an optionally substituted aryloxy group having 6 to 20 carbon atoms, an optionally substituted alkylamino group having 1 to 20 carbon atoms, an optionally substituted arylamino group having 6 to 20 carbon atoms, an optionally substituted alkylsulfonyl group having 1 to 20 carbon atoms, or an optionally substituted arylsulfonyl group having 6 to 20 carbon atoms. Among them, a hydrogen atom, a carboxy group, an alkoxycarbonyl group having 2 to 20 carbon atoms, an optionally substituted alkyl group having 1 to 20 carbon atoms, or an optionally substituted aryl group having 6 to 20 carbon atoms is more preferable because of high radical reactivity.

Examples of the substituent that can be introduced include those described in Formula (1).

Z denotes an oxygen atom, a sulfur atom, $N(R^{13})$, or an optionally substituted phenylene group.

$R^{13}$ denotes an optionally substituted alkyl group, etc., and preferably denotes an optionally substituted alkyl group having 1 to 8 carbon atoms. Among them, a methyl group, an ethyl group, or an isopropyl group is preferable because of high radical reactivity.

Among the polymers, a (meth)acrylic acid copolymer and a polyurethane, each having a crosslinkable group in a side chain thereof, are more preferable.

In the binder polymer having crosslinking properties, for example, a free radical (a polymerization initiating radical or a propagating radical in the process of polymerization of the polymerizable compound) is added to the crosslinkable functional group to cause addition-polymerization between polymers directly or through a polymerization chain of the polymerizable compound; as a result, crosslinking is formed between polymer molecules to effect curing. Alternatively, an atom (for example, a hydrogen atom on a carbon atom adjacent to the functional crosslinkable group) in the polymer is abstracted by a free radical to produce a polymer radical, and polymer radicals combine with each other to form crosslinking between polymer molecules to effect curing.

The content of the crosslinkable group (content of radically polymerizable unsaturated double bond determined by iodine titration) in the binder polymer is preferably 0.1 to 10.0 mmol, more preferably 1.0 to 7.0 mmol, and most preferably 2.0 to 5.5 mmol, per g of the binder polymer.

Furthermore, the binder polymer used is appropriately selected according to the mode of development processing so that a non-image area of the photosensitive layer is removed well in a plate making process for the lithographic printing plate precursor. Details are described below.

(i-1) Alkali-soluble Binder Polymer

In a mode in which development processing is carried out using an alkaline developer, since it is necessary for a binder polymer to be dissolved in an alkaline developer, an organic polymer that is soluble in an aqueous alkali is preferably used, and an organic polymer that is soluble in an aqueous alkali having a pH of 8 to 10 is more preferably used.

In order to be soluble in an aqueous alkali, it is preferable to have an alkali-soluble group. The alkali-soluble group is preferably an acid group, and examples thereof include a carboxy group, a sulfonic acid group, a phosphoric acid group, and a hydroxy group. Among them, from the viewpoint of achieving a balance between film-forming properties, plate life, and developability, a binder polymer having a carboxy group is particularly preferable.

As the carboxy group-containing binder polymer, a binder polymer having (meth)acrylic acid as a monomer unit is particularly preferable. The binder polymer having (meth)acrylic acid as a monomer unit is more preferably a binder polymer having a (meth)acrylic acid alkyl ester as a monomer unit, and the alkyl group of the alkyl ester is preferably an alkyl group having 1 to 5 carbon atoms.

Furthermore, crosslinking properties may be imparted to the alkali-soluble binder polymer as described above in order to improve the film strength of an image area. In order to impart crosslinking properties to the binder polymer, a crosslinkable functional group such as an ethylenically unsaturated bond is introduced into a main chain or side chain of the polymer. The crosslinkable functional group may be introduced by copolymerization or a polymer reaction.

The alkali-soluble binder polymer preferably has a weight-average molecular weight of 5,000 or more, and more preferably 10,000 to 300,000, and a number-average molecular weight of 1,000 or more, and more preferably 2,000 to 250,000. The polydispersity (weight-average molecular weight/number-average molecular weight) is preferably 1.1 to 10.

The alkali-soluble binder polymer may be any of a random polymer, a block polymer, a graft polymer, etc., and is preferably a random polymer.

The alkali-soluble binder polymer may be used singly or in a combination of two or more types as a mixture.

The content of the alkali-soluble binder polymer is preferably 5 to 90 wt % relative to the total solids content of the photosensitive layer, more preferably 10 to 70 wt %, and yet more preferably 10 to 60 wt %. When in the above-mentioned range, good strength for an image area and good image formation properties are obtained.

(D-2) Hydrophilic Group-containing Binder Polymer

As a binder polymer that can be used in the photosensitive layer, in order to improve developability by the developer, a binder polymer having a hydrophilic group (hydrophilic group-containing binder polymer) may be used. In particular, when an acidic to weakly alkaline developer is used, a hydrophilic group-containing binder polymer is preferably used.

The hydrophilic group is selected from monovalent and di- or higher-valent hydrophilic groups, and preferred examples thereof include a hydroxy group, a sulfonic acid group, a carboxylic acid group, a phosphoric acid group, an alkyleneoxy group such as an ethyleneoxy group or a propyleneoxy group, a primary amino group, a secondary amino group, a tertiary amino group, a salt formed by neutralizing an amino group with an acid, a quaternary ammonium group, a sulfonium group, an iodonium group, a phosphonium group, an amide group, an ether group, and a salt formed by neutralizing an acid group such as a carboxylic acid, sulfonic acid, or phosphoric acid; particularly preferred examples thereof include a primary amino group, a secondary amino group, a tertiary amino group, a salt formed by neutralizing an amino group with an acid, a quaternary ammonium group, an amide group, a hydroxy group, a $—CH_2CH_2O—$ repeating unit, and a $—CH_2CH_2NH—$ repeating unit, and most preferred examples thereof include a tertiary amino group, a salt formed by neutralizing an acid group with an amino group-containing compound, a salt formed by neutralizing an amino group with an acid, and a quaternary ammonium group.

The hydrophilic group-containing binder polymer is preferably a copolymer, and from the viewpoint of developability the proportion of the copolymer component having a hydrophilic group described above in the total copolymer components of the copolymer is preferably 1 to 70% relative to the total monomer units forming the copolymer, and from the viewpoint of a balance being achieved between developability and plate life it is preferably 1 to 50% and particularly preferably 1 to 30%.

With regard to the skeleton of such a hydrophilic group-containing binder polymer, a polymer selected from the group consisting of an acrylic resin, a polyvinylacetal resin, a polyvinyl alcohol resin, a polyurethane resin, a polyamide resin, an epoxy resin, a methacrylic resin, a styrene-based resin, and a polyester resin is preferable. Among them, a vinyl copolymer such as an acrylic resin, a methacrylic resin, or a styrene-based resin or polyurethane resin is particularly preferable.

The hydrophilic group-containing binder polymer preferably has the type of crosslinkable group described above.

The content of the crosslinkable group (content of radically polymerizable unsaturated double bond determined by iodine titration) in the hydrophilic group-containing binder polymer is preferably 0.01 to 10.0 mmol, more preferably 0.05 to 5.0 mmol, and yet more preferably 0.1 to 2.0 mmol, per g of the hydrophilic group-containing binder polymer.

From the viewpoint of improvement of plate life, the crosslinkable group is desirably in the vicinity of the hydrophilic group, and the hydrophilic group and the crosslinkable group may be present on the same monomer unit.

The hydrophilic group-containing binder polymer preferably has, in addition to the above-mentioned hydrophilic group-containing unit, crosslinkable group-containing unit, and hydrophilic group- and crosslinkable group-containing unit, an alkyl or aralkyl (meth)acrylate unit. The alkyl group of the alkyl (meth)acrylate is preferably an alkyl group having 1 to 5 carbon atoms, and more preferably a methyl group. Examples of the aralkyl (meth)acrylate include benzyl (meth) acrylate.

The hydrophilic group-containing binder polymer preferably has a weight-average molecular weight of 5,000 or more, and more preferably of 10,000 to 300,000, and a number-average molecular weight of 1,000 or more, and more preferably 2,000 to 250,000. The polydispersity (weight-average molecular weight/number-average molecular weight) is preferably 1.1 to 10.

The hydrophilic group-containing binder polymer may be any of a random polymer, a block polymer, a graft polymer, etc.

The hydrophilic group-containing binder polymer may be used singly or in a combination of two or more thereof.

From the viewpoint of strength of the image area and good image-forming properties, the content of the hydrophilic group-containing binder polymer is preferably 5 to 75 wt %, more preferably 10 to 70 wt %, and yet more preferably 10 to 60 wt %, relative to the total solids content of the photosensitive layer.

Furthermore, the total content of the polymerizable compound and the binder polymer is preferably no greater than 80 wt % relative to the total solids content of the photosensitive layer, and more preferably 35 to 75 wt %. When in the above-mentioned range, sensitivity and developability are excellent.

Specific examples of monomer units constituting the hydrophilic group-containing binder polymer and specific examples of the hydrophilic group-containing binder polymer are shown below, but the present invention is not limited by these examples. Weight-average molecular weight (Mw, also expressed simply as 'molecular weight' in the table below) in the table below is measured by gel permeation chromatography (GPC) using polystyrene as a reference material. In the chemical formulae below, $TsO^-$ is an abbreviation for $p\text{-}CH_3C_6H_4SO_3^-$. The number given below each monomer unit denotes the molar ratio of the monomer unit relative to the entire polymer.

| Polymer No. | Binder Structure (mol %) | Molecular weight |
|---|---|---|
| P-1 | 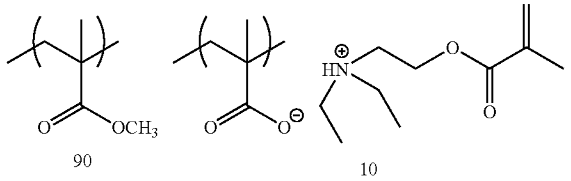 | 80,000 |

-continued
| | | | |
|---|---|---|---|
| P-2 | 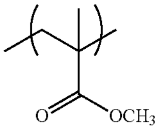<br>90 | 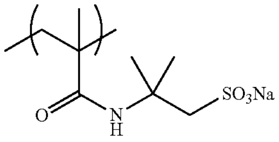<br>5 | 72,000 |
| Polymer No. | Diisocyanate compound used (mol %) | Diol compound used (mol %) | Molecular weight |
|---|---|---|---|
| P-3 | 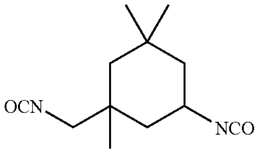<br>70<br>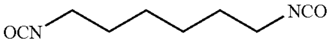<br>30 | 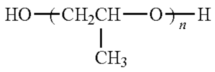<br>40<br>(Mw = 400)<br>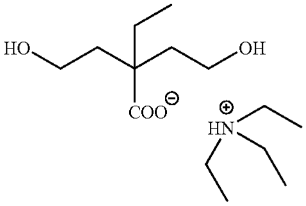<br>30<br>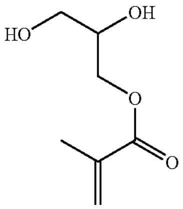<br>30 | 60,000 |
| Polymer No. | Binder structure (mol %) | | | Molecular weight |
|---|---|---|---|---|
| P-4 | 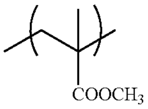<br>90 | 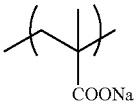<br>10 | | 50,000 |
| P-5 | 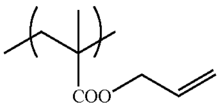<br>90 | 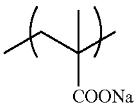<br>10 | | 60,000 |
| P-6 | 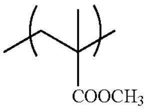<br>65 | 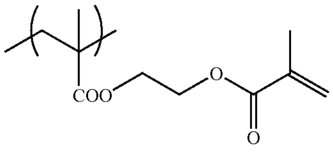<br>20 | 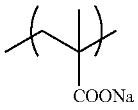<br>15 | 65,000 |
| P-7 | 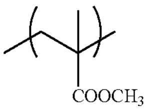<br>85 | 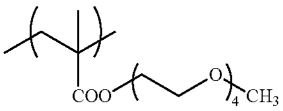<br>10 | 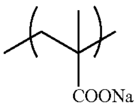<br>5 | 60,000 |

-continued
| | | |
|---|---|---|
| P-8 | 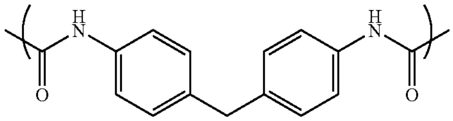 40 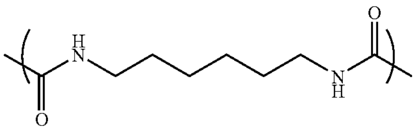 10 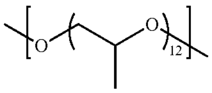 20 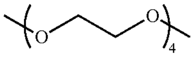 20 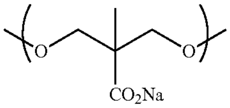 10 | 63,000 |
| P-9 | 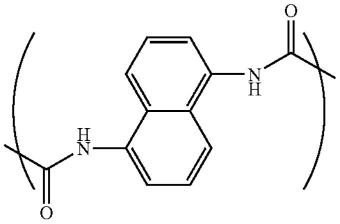 20 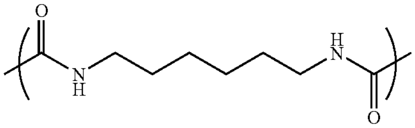 30 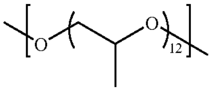 20 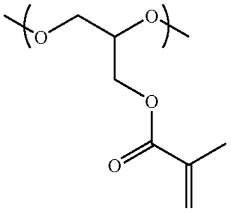 15 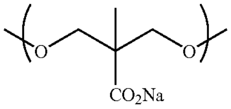 15 | 60,000 |
| Polymer No. | Polymer structure | Composition ratio | Molecular weight |
|---|---|---|---|
| P-10 | 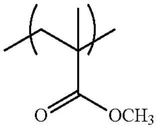 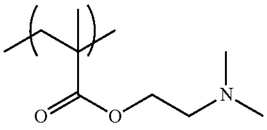 | 90/10 | 70,000 |
| P-11 | 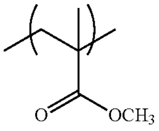 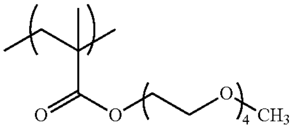 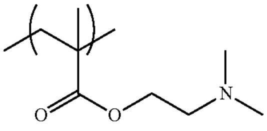 | 90/5/5 | 80,000 |
| P-12 | 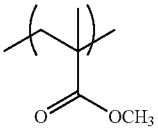 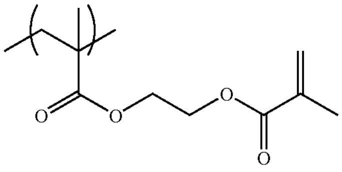 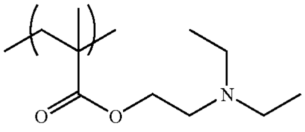 | 60/35/5 | 80,000 |

-continued
| Polymer No. | Diisocyanate compound used (mol %) | Diol compound used (mol %) | Molecular weight |
|---|---|---|---|
| P-13 | 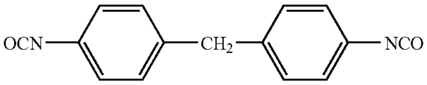 80 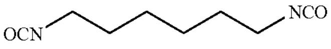 20 | 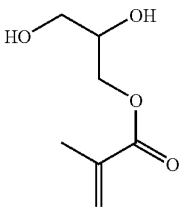 30 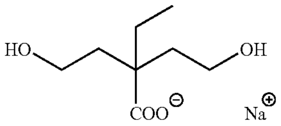 30 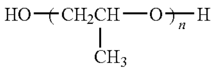 40 (Mw = 400) | 57,000 |
| Polymer No. | Polymer structure | Composition ratio | Molecular weight |
|---|---|---|---|
| P-14 | 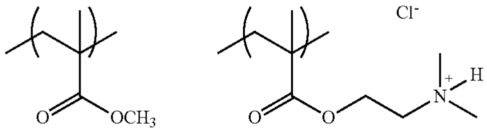 | 90/10 | 70,000 |
| P-15 | 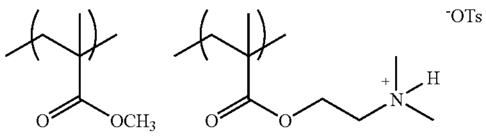 | 90/10 | 58,000 |
| P-16 | 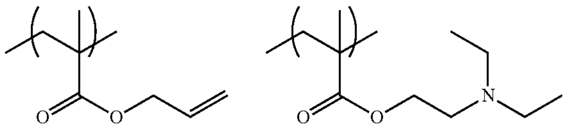 | 90/10 | 90,000 |
| P-17 | 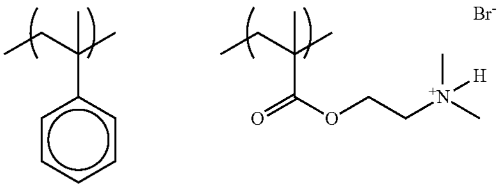 | 70/30 | 62,000 |
| P-18 | 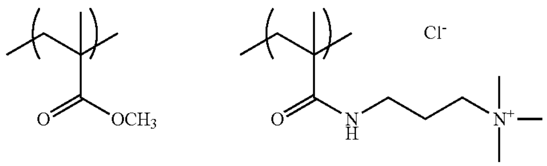 | 70/30 | 58,000 |
| P-19 | 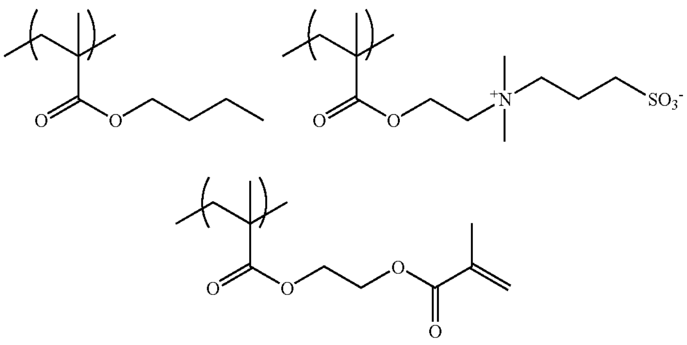 | 50/25/25 | 49,000 |

-continued
| Polymer No. | Diisocyanate structure (mol %) | |
|---|---|---|
| P-20 | 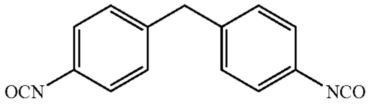 40 | 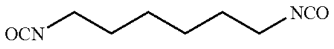 10 |
| P-21 | 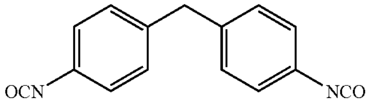 40 | 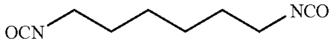 10 |
| P-22 | 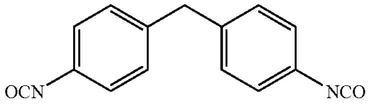 40 | 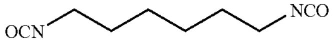 10 |
| P-23 | 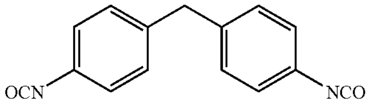 40 | 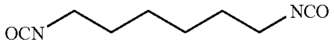 10 |
| Polymer No. | Diol structure (mol %) | | | Mw |
|---|---|---|---|---|
| P-20 | 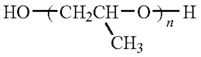 10 (Mw = 1000) | 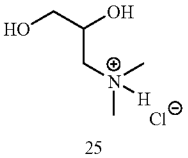 25 | 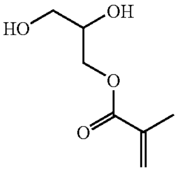 15 | 59,000 |
| P-21 | 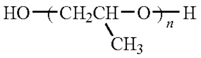 10 (Mw = 1000) | 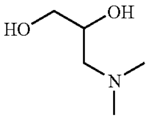 25 | 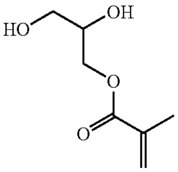 15 | 59,000 |
| P-22 | 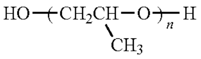 10 (Mw = 1000) | 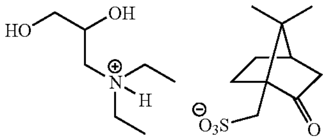 25 | 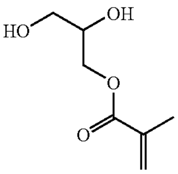 15 | 62,000 |
| P-23 | 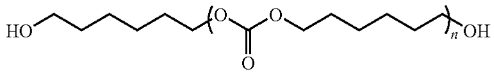 10 | 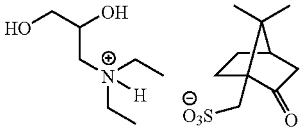 25 | 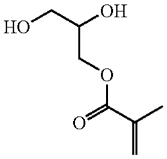 15 | 53,000 |

-continued

| Polymer No. | Binder structure (mol %) | Molecular weight |
|---|---|---|
| P-24 | 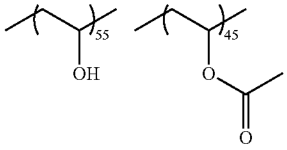 | 80,000 |
| P-25 | 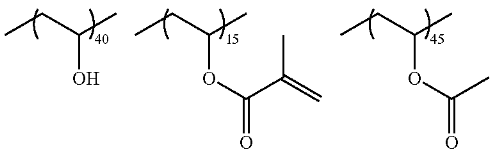 | 100,000 |

(ii) Ethylenically Unsaturated Compound

The ethylenically unsaturated compound referred to in the present invention is a compound having one or more ethylenic double bonds that undergoes addition-polymerization and cures by the action of a photopolymerization initiator, which is described later, when the lithographic printing plate precursor of the present invention is exposed to actinic radiation. In addition, 'monomer' referred to in the present invention means a concept relative to a so-called polymer and means a concept that includes, in addition to 'monomer' in the narrow sense, 'dimer', 'trimer', and 'oligomer'.

Furthermore, the ethylenically unsaturated compound used in the photosensitive layer comprises at least one compound represented by Formula (1) (hereinafter, also called a 'specific ethylenically unsaturated compound').

(1)

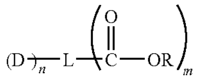

(In Formula (1), L denotes an (m+n)-valent linking group, the Ds independently denote a group selected from the group consisting of groups represented by Formulae (A) to (D) below, the Rs independently denote a monovalent substituent, m denotes an integer of 1 to 20, and n denotes an integer of 2 to 20.)

(A)

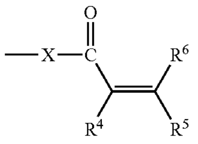

(B)

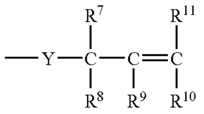

(C)

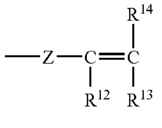

-continued (D)

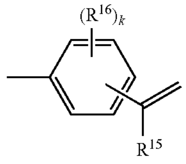

(In Formulae (A) to (D), X, Y, and Z independently denote an oxygen atom, a sulfur atom, or $NR^{17}$, $R^4$ to $R^{14}$ and $R^{17}$ independently denote a hydrogen atom or a monovalent substituent, $R^{15}$ denotes a hydrogen atom or a methyl group, $R^{16}$ denotes a monovalent substituent, and k denotes an integer of 0 to 4.)

L in Formula (1) is an (m+n)-valent linking group formed from any atom or atomic group, and the manner of bonding, etc. is not particularly limited.

Moreover, from the viewpoint of miscibility with another material in the photosensitive layer, image-forming properties, and plate life, the (m+n)-valent linking group L is preferably a group having an ether bond, an ester bond, a urethane bond, an aromatic ring, and/or a hetero ring, more preferably a group having an ether bond, an ester bond, and/or a urethane bond, yet more preferably a group having an urethane bond, and particularly preferably a group having two urethane bonds. The ester bond is preferably a carboxylic acid ester bond. The number of carbons of L in Formula (1) is preferably 1 to 200, and more preferably 1 to 100.

The Rs in Formula (1) independently denote a monovalent substituent; an atomic group comprising hydrogen, carbon, nitrogen, oxygen, sulfur, silicon, and/or halogen atoms is preferable, and an atomic group comprising hydrogen, carbon, nitrogen, oxygen, sulfur, and/or silicon atoms is more preferable. The number of carbons of R in Formula (1) is preferably 1 to 50, and more preferably 1 to 30.

From the viewpoint of hydrolyzability, preferred examples of R include an alkyl group (e.g. a methyl group, an ethyl group, a propyl group, a butyl group, an isopropyl group, an isobutyl group, an s-butyl group, a t-butyl group, a cyclohexyl group), a substituted methyl group (a 9-fluorenylmethyl group, a methoxymethyl group, a methylthiomethyl group, a tetrahydropyranylmethyl group, a tetrahydrofuranylmethyl group, a methoxyethoxymethyl group, a 2-(trimethylsilyl)ethoxymethyl group, a benzyloxymethyl group, a pivaloyloxymethyl group, a phenylacetoxymethyl group, a triisopropylsilylmethyl group, a cyanomethyl group, an acetol group, a phenacyl group, a p-bromophenacyl group, an α-methylphenacyl group, a p-methoxyphenacyl group, a decyl group, a carboxyamidomethyl group, a p-azobenzenecarboxyamidomethyl group, an N-phthalimidomethyl group, a chloromethyl group), a 2-substituted ethyl group (a 2,2,2-trichloroethyl group, a 2,2,2-trifluoroethyl group, a 2-chloroethyl group, a 2-bromoethyl group, a 2-iodoethyl group, a 4-chlorobutyl group, a 5-chloropentyl group, a 2-(trimethylsilyl)ethyl group, a 2-methoxythioethyl group, a 1,3-dithianyl-2-methyl group, a 2-(p-nitrophenylsulfenyl)ethyl group, a 2-(p-toluenesulfonyl)ethyl group, a 2-(2'-pyridyl) ethyl group, a 2-(p-methoxyphenyl)ethyl group, a 1-methyl-1-phenylethyl group, a 2-(4-acetyl-2-nitrophenyl)ethyl group, a 2-cyanoethyl group, a phenoxyethyl group), an allyl group, a methallyl group, a 2-methyl-3-buten-1-yl group, a 3-buten-1-yl group, a 4-(trimethylsilyl)-2-buten-1-yl group, a cinnamyl group, an α-methylcinnamyl group, a propargyl group, a phenyl group, a substituted phenyl group (a 2,6-dimethylphenyl group, a 2,6-di-tert-butyl-4-methoxyphenyl group, a p-(methylthio)phenyl group, a pentafluorophenyl group), a benzyl group, a substituted benzyl group (a triphenylmethyl group, a diphenylmethyl group, a bis(o-nitrophenyl)methyl group, an 9-anthrylmethyl group, a 2-(9,10-dioxo)anthrylmethyl group, a 5-dibenzosuberyl group, a 1-pyrenylmethyl group, a 2-(trifluoromethyl)-6-chromonylmethyl group, a 2,4,6-trimethylbenzyl group, a p-bromobenzyl group, an o-nitrobenzyl group, a p-nitrobenzyl group, a p-methoxybenzyl group, a 2,6-dimethoxybenzyl group, a 4-(methylsulfinyl)benzyl group, a 4-sulfobenzyl group, a 4-azidomethoxybenzyl group, a piperonyl group, a 4-picolyl group), and a silyl group (a trimethylsilyl group, a triethylsilyl group, a tert-butyldimethylsilyl group, a phenyldimethylsilyl group, a triisopropylsilyl group).

Furthermore, from the viewpoint of hydrolyzability under low alkalinity conditions, a methyl group, a tetrahydropyranylmethyl group, a phenacyl group, an N-phthalimidomethyl group, a chloromethyl group, a 2-chloroethyl group, a 2-bromoethyl group, a 2-cyanoethyl group, a 2,2,2-trichloroethyl group, a 2,2,2-trifluoroethyl group, a 2-(p-toluenesulfonyl) ethyl group, a phenoxyethyl group, a cinnamyl group, a benzyl group, a triphenylmethyl group, an o-nitrobenzyl group, a bis(o-nitrophenyl)methyl group, a 2-(9,10-dioxo)anthrylmethyl group, a piperonyl group, a trimethylsilyl group, and a triisopropylsilyl group are more preferable, and a methyl group is yet more preferable.

From the viewpoint of developability, plate life, and hydrolyzability, R in Formula (1) is preferably a group represented by Formula (R-1) below.

(R-1)

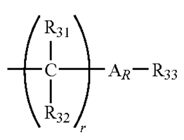

$A_R$ in Formula (R-1) denotes an oxygen atom, a sulfur atom, or $NR_{34}$.

$R_{31}$, $R_{32}$, and $R_{34}$ in Formula (R-1) independently denote a monovalent substituent, and preferred examples of the monovalent substituent include a hydrogen atom and an alkyl group such as a methyl group or an ethyl group. The number of carbons of the monovalent substituent of $R_{31}$, $R_{32}$, and $R_{34}$ is preferably 1 to 8.

$R_{33}$ in Formula (R-1) denotes a monovalent substituent, and preferred examples of the monovalent substituent include an alkyl group, an alkenyl group, an alkynyl group, a poly (oxyalkylene) group, an aromatic group, and a heterocyclic group, and more preferred examples of the monovalent substituent include an alkyl group having 1 to 20 carbon atoms, an alkenyl group having 2 to 20 carbon atoms, an alkynyl group having 2 to 20 carbon atoms, a poly(oxyalkylene) group having 2 to 20 carbon atoms, an aromatic group having 6 to 20 carbon atoms, and a heterocyclic group having 1 to 20 carbon atoms.

r in (R-1) denotes an integer of 1 or greater and is preferably an integer of 2 to 8, and more preferably an integer of 2 to 4.

Specific examples of a group represented by Formula (R-1) above include a methoxyethyl group, an ethoxyethyl group, a methoxyethoxyethyl group, an ethoxyethoxyethyl group, a methoxypoly(ethyleneoxy)ethyl group, a methylsulfanylethyl group, an ethylsulfanylethyl group, a dimethylaminoethyl group, and a diethylaminoethyl group.

m in Formula (1) denotes an integer of 1 to 20, and is preferably an integer of 1 to 10, more preferably an integer of 1 to 5.

n in Formula (1) denotes an integer of 2 to 20, and from the viewpoint of plate life and developability it is preferably an integer of 2 to 10, more preferably an integer of 2 to 5.

The Ds in Formula (1) independently denote a group selected from the group consisting of groups represented by Formulae (A) to (D) above.

In Formula (A) above, $R^4$ to $R^6$ independently denote a hydrogen atom or a monovalent substituent.

As $R^4$, a hydrogen atom, an optionally substituted alkyl group, etc. can be cited. The number of carbons of the optionally substituted alkyl group of $R^4$ is preferably 1 to 8. Among them, specifically, a hydrogen atom, a methyl group, a methylalkoxy group, and a methyl ester group are preferable.

Furthermore, specific examples of $R^5$ and $R^6$ include a hydrogen atom, a halogen atom, an amino group, a dialkylamino group, a carboxy group, an alkoxycarbonyl group, a sulfo group, a nitro group, a cyano group, an optionally substituted alkyl group, an optionally substituted aryl group, an optionally substituted alkoxy group, an optionally substituted aryloxy group, an optionally substituted alkylamino group, an optionally substituted arylamino group, an optionally substituted alkylsulfonyl group, and an optionally substituted arylsulfonyl group, and preferably examples of $R^5$ and $R^6$ include a hydrogen atom, a halogen atom, an amino group, a dialkylamino group having 2 to 20 carbon atoms, a carboxy group, an alkoxycarbonyl group having 2 to 20 carbon atoms, a sulfo group, a nitro group, a cyano group, an optionally substituted alkyl group having 1 to 20 carbon atoms, an optionally substituted aryl group having 6 to 20 carbon atoms, an optionally substituted alkoxy group having 1 to 20 carbon atoms, an optionally substituted aryloxy group having 6 to 20 carbon atoms, an optionally substituted alkylamino group having 1 to 20 carbon atoms, an optionally substituted arylamino group having 6 to 20 carbon atoms, an optionally substituted alkylsulfonyl group having 1 to 20 carbon atoms, and an optionally substituted arylsulfonyl group having 6 to 20 carbon atoms. Among them, a hydrogen atom, a carboxy group, an alkoxycarbonyl group having 2 to 20 carbon atoms, an optionally substituted alkyl group having 1 to 20 carbon atoms, or an optionally substituted aryl group having 6 to 20 carbon atoms is more preferable.

Here, as the substituent that can be introduced into these groups, there can be cited a methoxycarbonyl group, an ethoxycarbonyl group, an isopropoxycarbonyl group, a methyl group, an ethyl group, a phenyl group, etc.

X in Formula (A) denotes an oxygen atom, a sulfur atom, or $NR^{17}$, and is preferably an oxygen atom or $NR^{17}$, and more preferably an oxygen atom. $R^{17}$ denotes a hydrogen atom or a monovalent substituent, and is preferably, for example, an optionally substituted alkyl group.

In Formula (B) above $R^7$ to $R^{11}$ independently denote a hydrogen atom or a monovalent substituent.

Specific examples of $R^7$ to $R^{11}$ include a hydrogen atom, a halogen atom, an amino group, a dialkylamino group, a carboxy group, an alkoxycarbonyl group, a sulfo group, a nitro group, a cyano group, an optionally substituted alkyl group, an optionally substituted aryl group, an optionally substituted alkoxy group, an optionally substituted aryloxy group, an optionally substituted alkylamino group, an optionally substituted arylamino group, an optionally substituted alkylsulfonyl group, and an optionally substituted arylsulfonyl group, and preferably include a hydrogen atom, a halogen atom, an amino group, a dialkylamino group having 2 to 20 carbon atoms, a carboxy group, an alkoxycarbonyl group having 2 to 20 carbon atoms, a sulfo group, a nitro group, a cyano group, an optionally substituted alkyl group having 1 to 20 carbon atoms, an optionally substituted aryl group having 6 to 20 carbon atoms, an optionally substituted alkoxy group having 1 to 20 carbon atoms, an optionally substituted aryloxy group having 6 to 20 carbon atoms, an optionally substituted alkylamino group having 1 to 20 carbon atoms, an optionally substituted arylamino group having 6 to 20 carbon atoms, an optionally substituted alkylsulfonyl group having 1 to 20 carbon atoms, and an optionally substituted arylsulfonyl group having 6 to 20 carbon atoms. Among them, a hydrogen atom, a carboxy group, an alkoxycarbonyl group having 2 to 20 carbon atoms, an optionally substituted alkyl group having 1 to 20 carbon atoms, or an optionally substituted aryl group having 6 to 20 carbon atoms is more preferable.

Examples of the substituent that can be introduced to these groups include those cited as the substituent that can be introduced into Formula (A) above.

Y in Formula (B) denotes an oxygen atom, a sulfur atom, or $NR^{17}$, and is preferably an oxygen atom or $NR^{17}$, and more preferably an oxygen atom. As $R^{17}$, the same examples as for $R^{17}$ in Formula (A) above can be cited.

In Formula (C) above, $R^{12}$ to $R^{14}$ independently denote a hydrogen atom or a monovalent substituent.

Specific examples of $R^{12}$ to $R^{14}$ include a hydrogen atom, a halogen atom, an amino group, a dialkylamino group, a carboxy group, an alkoxycarbonyl group, a sulfo group, a nitro group, a cyano group, an optionally substituted alkyl group, an optionally substituted aryl group, an optionally substituted alkoxy group, an optionally substituted aryloxy group, an optionally substituted alkylamino group, an optionally substituted arylamino group, an optionally substituted alkylsulfonyl group, and an optionally substituted arylsulfonyl group, and preferably include a hydrogen atom, a halogen atom, an amino group, a dialkylamino group having 2 to 20 carbon atoms, a carboxy group, an alkoxycarbonyl group having 2 to 20 carbon atoms, a sulfo group, a nitro group, a cyano group, an optionally substituted alkyl group having 1 to 20 carbon atoms, an optionally substituted aryl group having 6 to 20 carbon atoms, an optionally substituted alkoxy group having 1 to 20 carbon atoms, an optionally substituted aryloxy group having 6 to 20 carbon atoms, an optionally substituted alkylamino group having 1 to 20 carbon atoms, an optionally substituted arylamino group having 6 to 20 carbon atoms, an optionally substituted alkylsulfonyl group having 1 to 20 carbon atoms, and an optionally substituted arylsulfonyl group having 6 to 20 carbon atoms. Among them, a hydrogen atom, a carboxy group, an alkoxycarbonyl group having 2 to 20 carbon atoms, an optionally substituted alkyl group having 1 to 20 carbon atoms, or an optionally substituted aryl group having 6 to 20 carbon atoms is more preferable.

Examples of the substituent that can be introduced into these groups include those cited as the substituent that can be introduced into Formula (A) above.

Z in Formula (C) denotes an oxygen atom, a sulfur atom, or $NR^{17}$, is preferably an oxygen atom or $NR^{17}$, and is more preferably an oxygen atom. As $R^{15}$, the same examples as for $R^{17}$ in Formula (A) above can be cited.

Furthermore, $R^{15}$ in Formula (D) denotes a hydrogen atom or a methyl group, and is preferably a hydrogen atom. Moreover, $R^{15}$ may be bonded to any position on the benzene ring.

$R^{16}$ in Formula (D) denotes a monovalent substituent, and preferred examples thereof include a halogen atom, an amino group, a dialkylamino group, a carboxy group, an alkoxycarbonyl group, a sulfo group, a nitro group, a cyano group, an optionally substituted alkyl group, an optionally substituted aryl group, an optionally substituted alkoxy group, an optionally substituted aryloxy group, an optionally substituted alkylamino group, an optionally substituted arylamino group, an optionally substituted alkylsulfonyl group, and an optionally substituted arylsulfonyl group, and more preferred examples thereof include a halogen atom, an amino group, a dialkylamino group having 2 to 20 carbon atoms, a carboxy group, an alkoxycarbonyl group having 2 to 20 carbon atoms, a sulfo group, a nitro group, a cyano group, an optionally substituted alkyl group having 1 to 20 carbon atoms, an optionally substituted aryl group having 6 to 20 carbon atoms, an optionally substituted alkoxy group having 1 to 20 carbon atoms, an optionally substituted aryloxy group having 6 to 20 carbon atoms, an optionally substituted alkylamino group having 1 to 20 carbon atoms, an optionally substituted arylamino group having 6 to 20 carbon atoms, an optionally substituted alkylsulfonyl group having 1 to 20 carbon atoms. Furthermore, when there are two or more $R^{16}$s, they may be identical to or different from each other.

k in Formula (D) denotes an integer of 0 to 4, is preferably 0 or 1, and is more preferably 0.

From the viewpoint of compatibility with other materials in the photosensitive layer, image-forming properties, and plate life, D in Formula (1) is preferably a group represented by Formula (A).

The specific ethylenically unsaturated compound may be used singly or in a combination of two or more types.

The molecular weight of the specific ethylenically unsaturated compound is preferably 100 to 10,000, more preferably 200 to 5,000, and yet more preferably 250 to 2,000.

A method for synthesizing the specific ethylenically unsaturated compound is not particularly limited, and it may be synthesized by a known method.

A combination of D, L and R in Formula (1) is preferably a combination of

D: a group represented by Formula (A),

L: a group having a bond selected from the group consisting of an ether bond, an ester bond and a urethane bond, and R: a group selected from the group consisting of a methyl group, a tetrahydropyranylmethyl group, a phenacyl group, an N-phthalimidomethyl group, a chloromethyl group, a 2-chloroethyl group, a 2-bromoethyl group, a 2-cyanoethyl group, a 2,2,2-trichloroethyl group, a 2,2,2-trifluoroethyl group, a 2-(p-toluenesulfonyl)ethyl group, a phenoxyethyl group, a cinnamyl group, a benzyl group, a triphenylmethyl group, an o-nitrobenzyl group, a bis(o-nitrophenyl)methyl group, a 2-(9,10-dioxo)anthrylmethyl group, a piperonyl group, a trimethylsilyl group, a triisopropylsilyl group, methoxyethyl group, an ethoxyethyl group, a methoxyethoxyethyl group, an ethoxyethoxyethyl group, a methoxypoly(ethyleneoxy)ethyl group, a methylsulfanylethyl group, an ethylsulfanylethyl group, a dimethylaminoethyl group and a diethylaminoethyl group;

is more preferably a combination of

D: an acryloyloxy group and/or a methacryloyloxy group,

L: a group having a urethane bond, and

R: a group selected from the group consisting of a methyl group, a methoxyethyl group, an ethoxyethyl group, a methoxyethoxyethyl group, an ethoxyethoxyethyl group, a methoxypoly(ethyleneoxy)ethyl group, a methylsulfanylethyl group, an ethylsulfanylethyl group, a dimethylaminoethyl group and a diethylaminoethyl group; and is yet more preferably a combination of D: a methacryloyloxy group, L: a group having a urethane bond, and R: a group selected from the group consisting of a methyl group, a methoxyethyl group, an ethoxyethoxyethyl group, a dimethylaminoethyl group and a diethylaminoethyl group.

Furthermore, the compound represented by Formula (1) is preferably a compound represented by Formulae (2) to (4) below, is more preferably a compound represented by Formula (3) or (4), and from the viewpoint of synthesis is yet more preferably a compound represented by Formula (4).

(2)

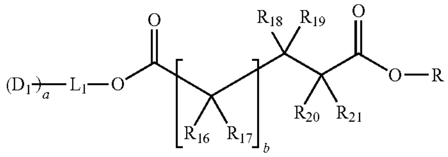

(3)

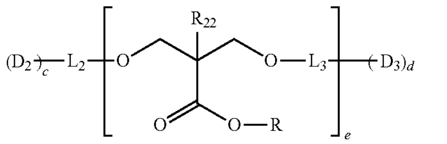

(4)

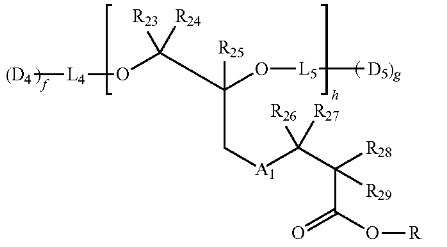

$D_1$ to $D_5$ in Formulae (2) to (4) independently have the same meaning as D in Formula (1) above, and preferred examples are also the same.

R in Formulae (2) to (4) has the same meaning as R in Formula (1) above, and preferred examples are also the same.

$R_{16}$ to $R_{21}$ in Formula (2) independently denote a monovalent substituent, and preferred examples of the monovalent substituent include a hydrogen atom, a halogen atom, an alkyl group, an alkylene group, and an aromatic group, and more preferred examples of the monovalent substituent include a hydrogen atom, a halogen atom, an alkyl group having 1 to 20 carbon atoms, an alkylene group having 1 to 20 carbon atoms, and an aromatic group having 6 to 20 carbon atoms. $R_{18}$ or $R_{19}$ and $R_{20}$ or $R_{21}$ may form a ring structure.

$R_{22}$ in Formula (3) denotes a monovalent substituent, and preferred examples of the monovalent substituent include a hydrogen atom and an alkyl group such as a methyl group or an ethyl group.

$R_{23}$ to $R_{29}$ in Formula (4) independently denote a monovalent substituent, and preferred examples of the monovalent substituent include a hydrogen atom and an alkyl group such as a methyl group or an ethyl group.

a, c, d, f, and g in Formulae (2) to (4) independently denote an integer of 1 to 19, and is preferably an integer of 1 to 10, more preferably an integer of 1 to 5.

b in Formula (2) denotes an integer of 0 to 3.

e in Formula (3) denotes an integer of 1 to 10, and is preferably an integer of 1 to 5, more preferably 1 or 2, yet more preferably 1.

h in Formula (4) denotes an integer of 1 to 10, and is preferably an integer of 1 to 5, more preferably 1 or 2, yet more preferably 1.

$L_1$ in Formula (2) denotes an (a+1)-valent linking group, and the preferred examples cited for L in Formula (1) above are also preferable for $L_1$.

$L_2$ in Formula (3) denotes a (c+1)-valent linking group, and the preferred examples cited for L in Formula (1) above are also preferable for $L_2$.

$L_3$ in Formula (3) denotes a (d+1)-valent linking group, and the preferred examples cited for L in Formula (1) above are also preferable for $L_3$.

$L_4$ in Formula (4) denotes an (f+1)-valent linking group, and the preferred examples cited for L in Formula (1) above are also preferable for $L_4$.

$L_5$ in Formula (4) denotes a (g+1)-valent linking group, and the preferred examples cited for L in Formula (1) above are also preferable for $L_5$.

$A_1$ in Formula (4) denotes an oxygen atom, a sulfur atom, or $NR_{30}$. $R_{30}$ denotes a monovalent substituent, and preferred examples of the monovalent substituent include a hydrogen atom and an alkyl group such as a methyl group or an ethyl group.

Specific examples of the specific ethylenically unsaturated compound suitably used in the present invention are listed below, but the present invention is not limited thereby.

(1)

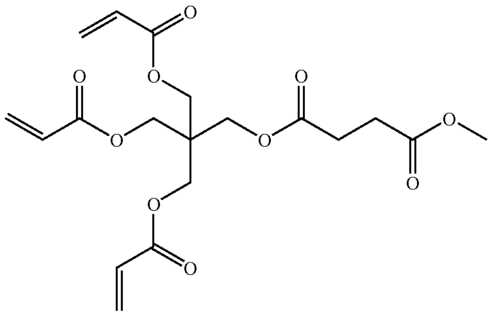

(2)

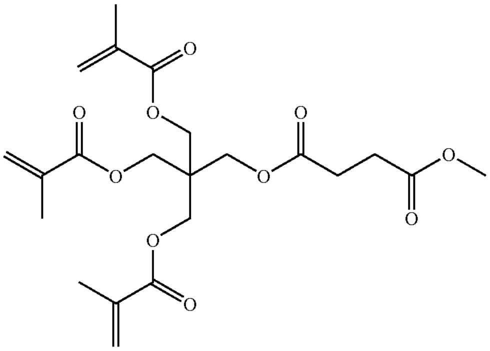

-continued
(3)
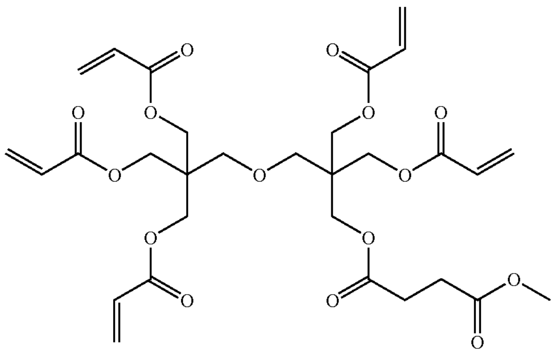
(4)
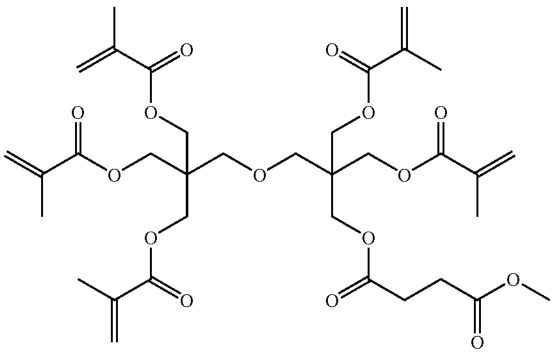
(5)
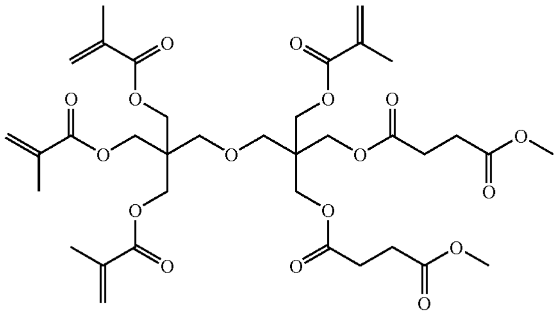
(6)
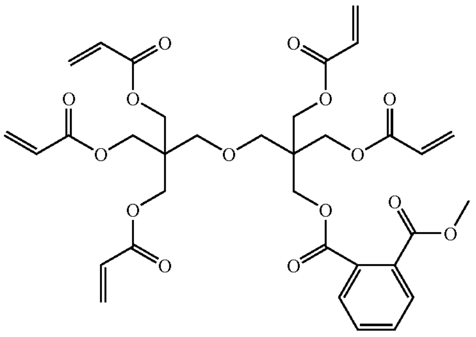
(7)
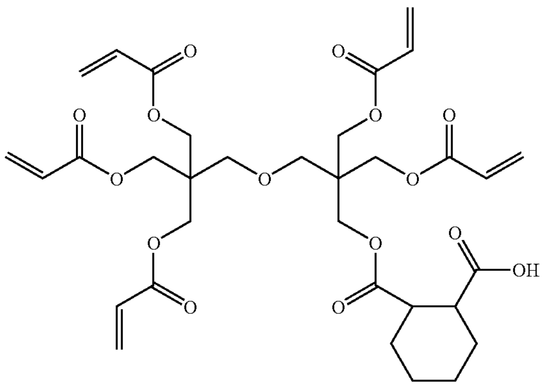
(8)
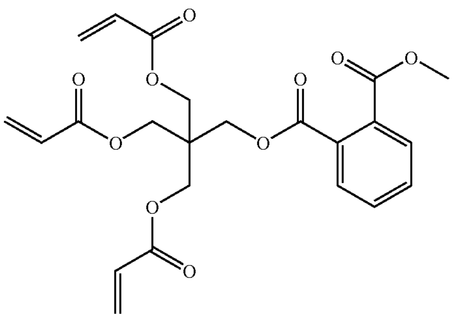
(9)
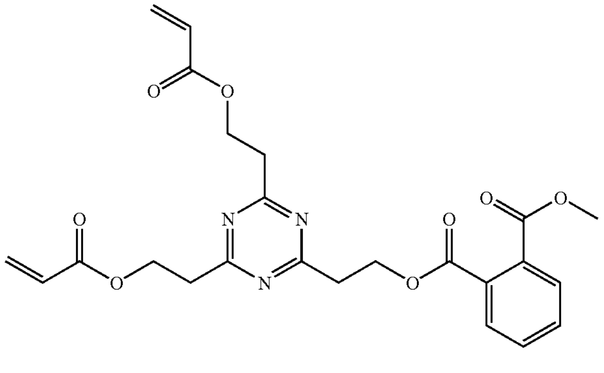

-continued
(10)
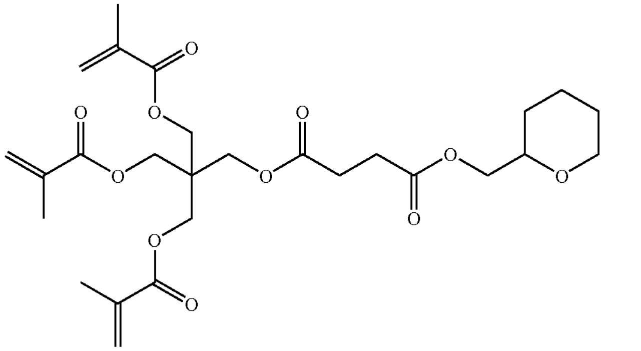
(11)
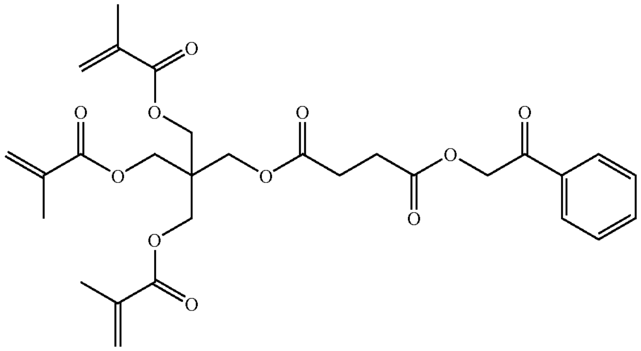
(12)
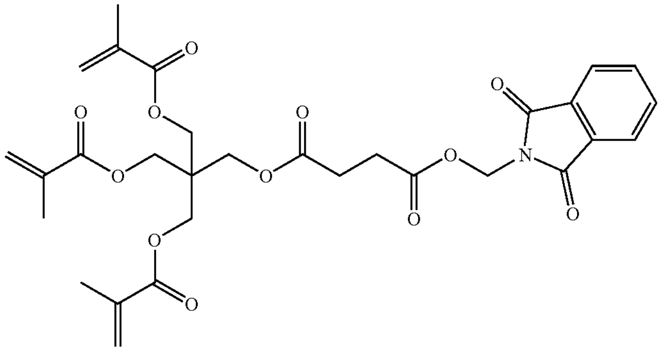
(13)
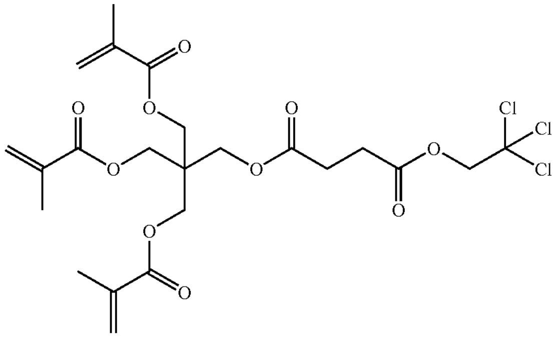
(14)
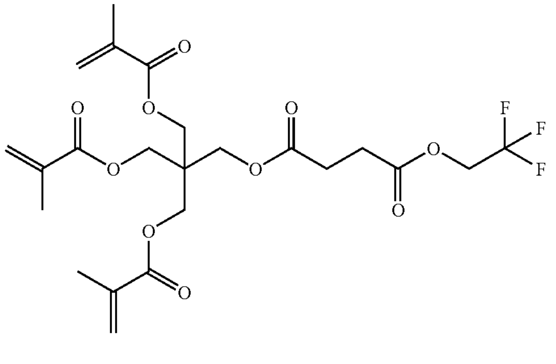

-continued
(15)
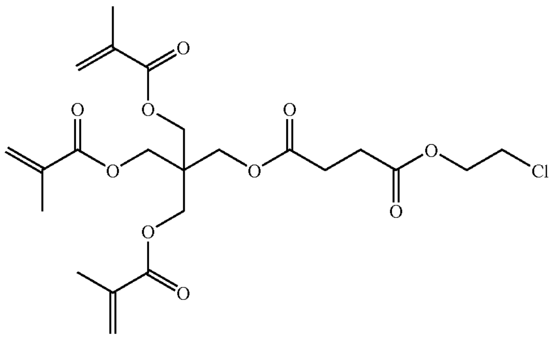
(16)
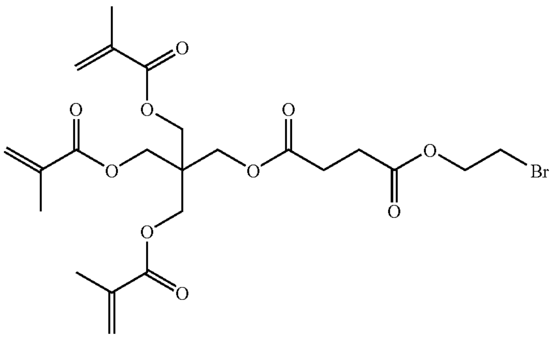
(17)
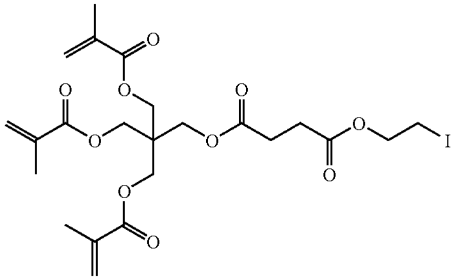
(18)
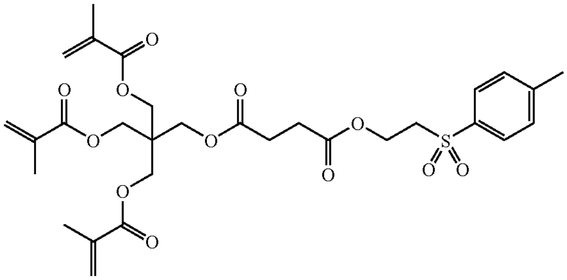
(19)
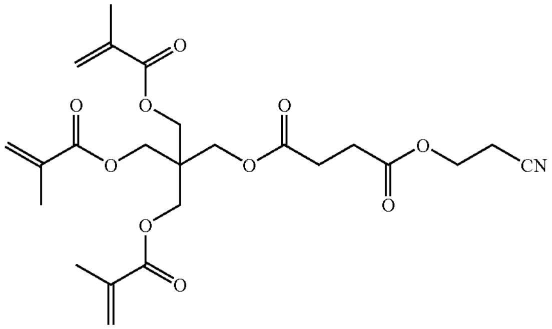
(20)
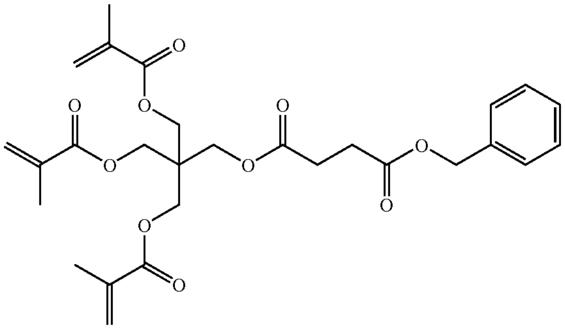
(21)
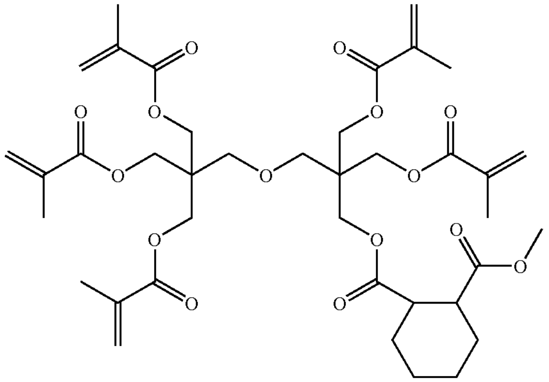
(22)
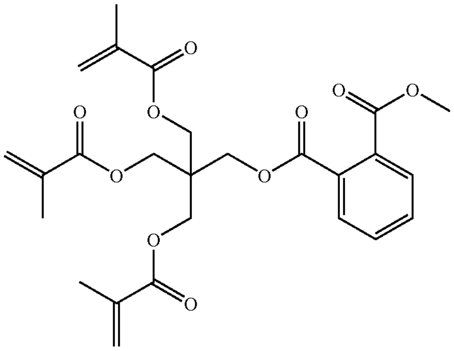

-continued
(23)
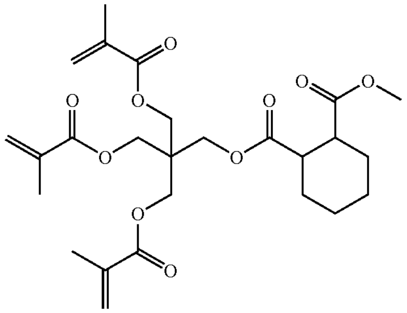
(24)
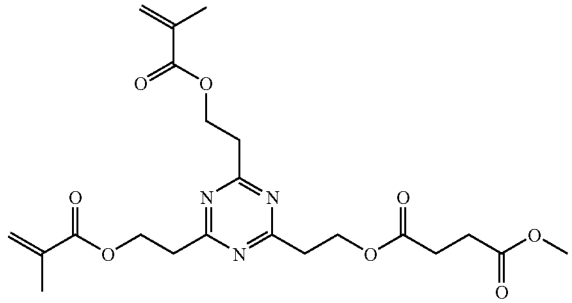
(25)
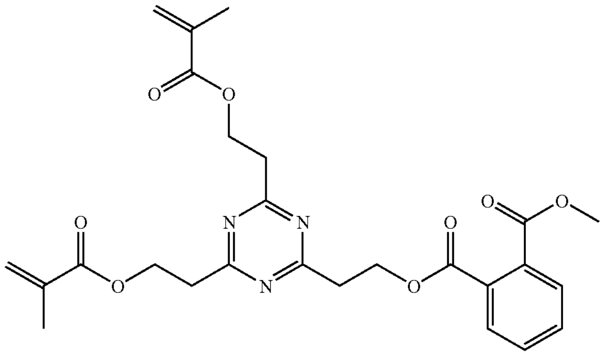
(26)
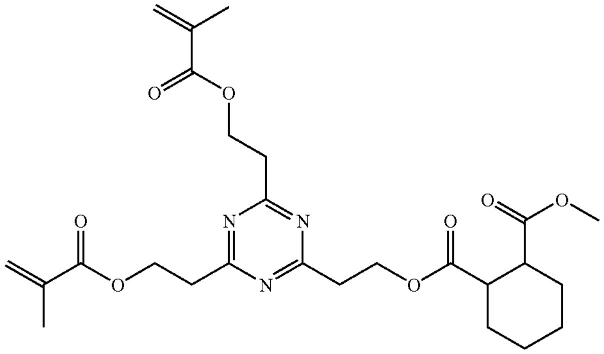
(27)
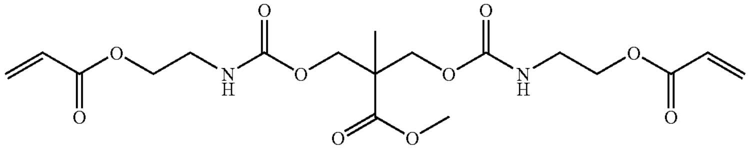
(28)
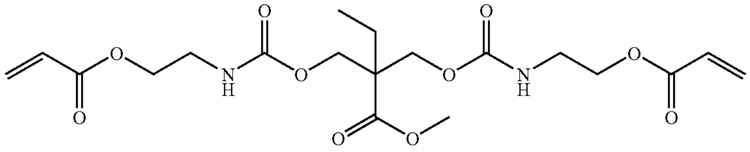
(29)
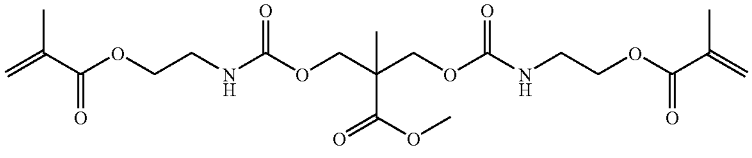

-continued
(30)
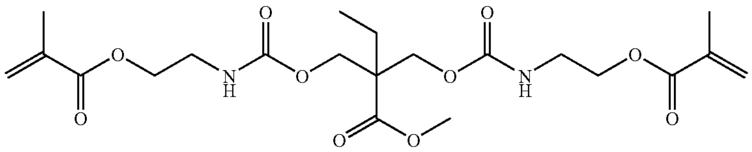
(31)
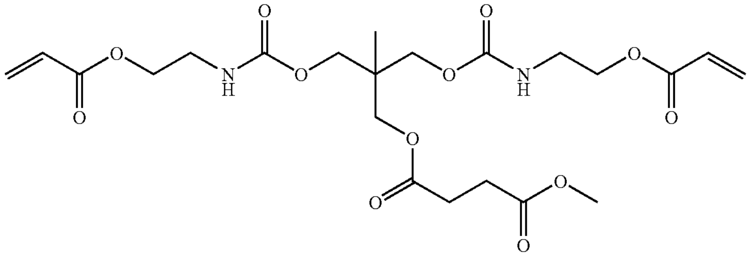
(32)
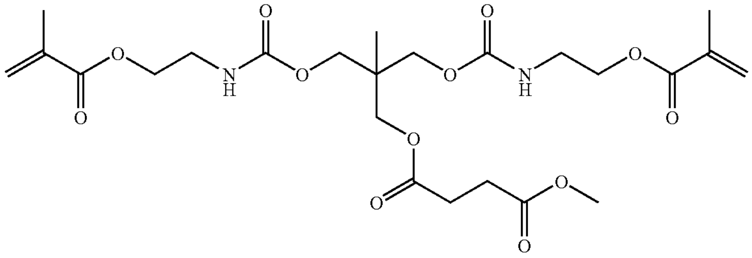
(33)
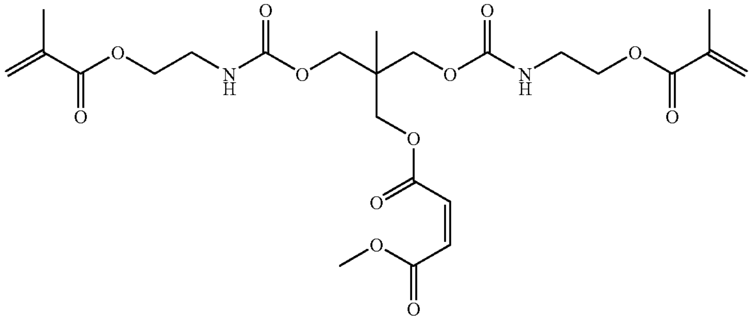
(34)
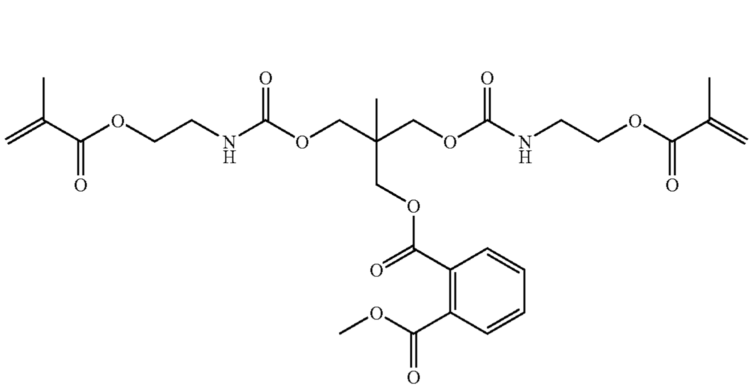

-continued
(35)
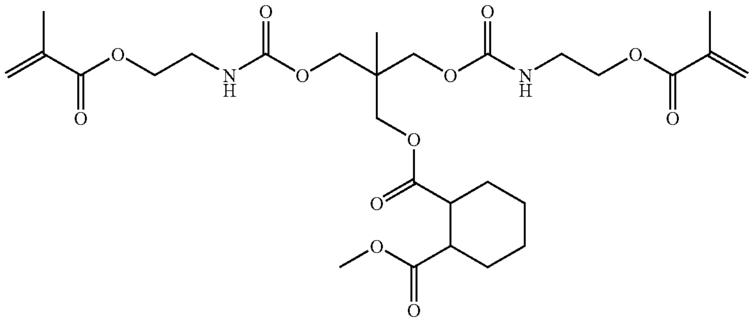
(36)
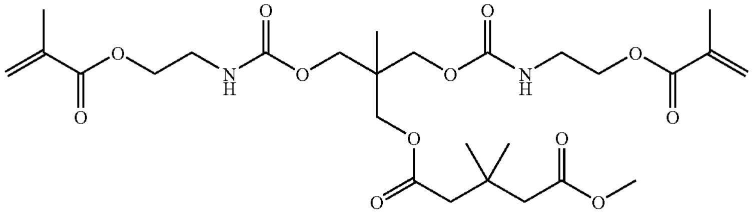
(37)
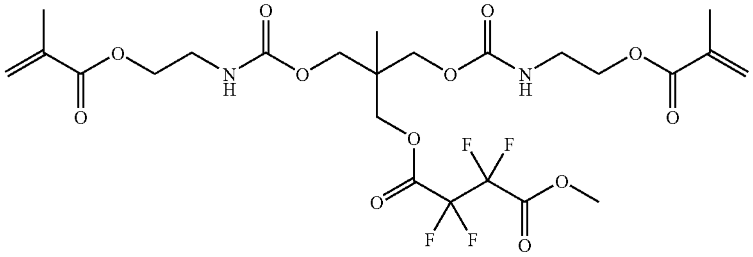
(38)
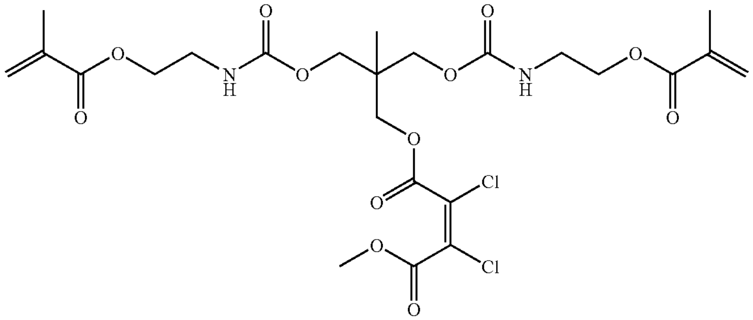
(39)
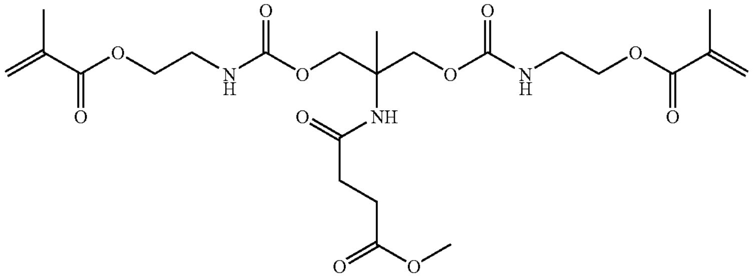

-continued
(40)
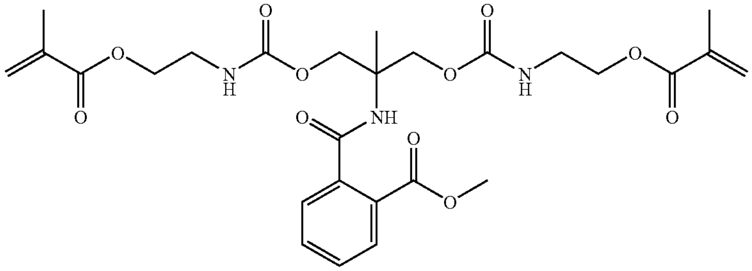
(41)
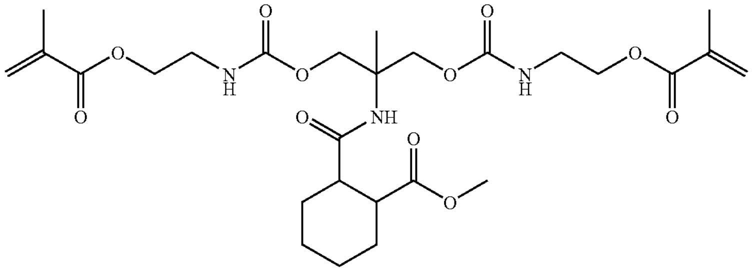
(42)
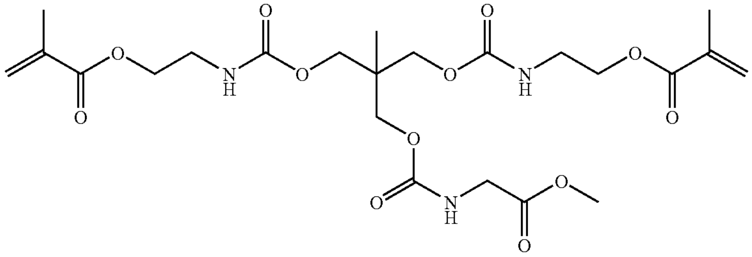
(43)
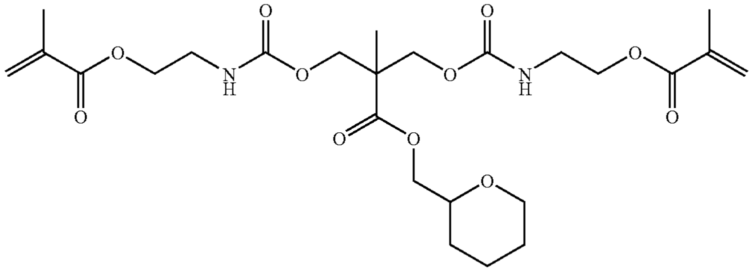
(44)
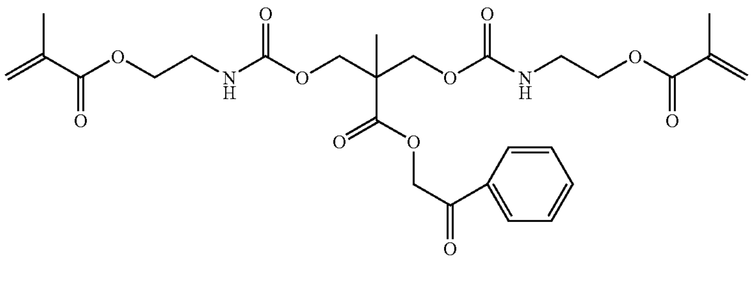

-continued
(45)
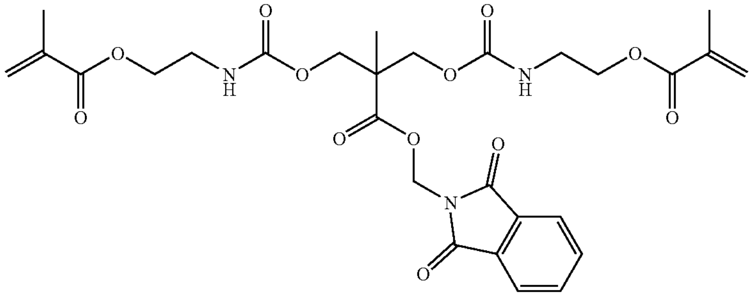
(46)
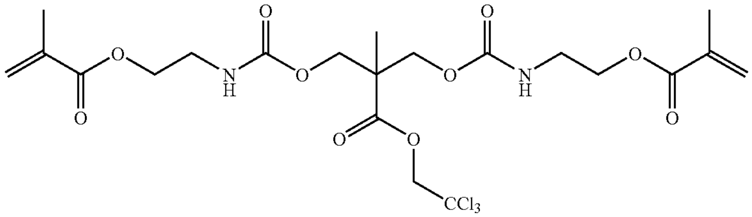
(47)
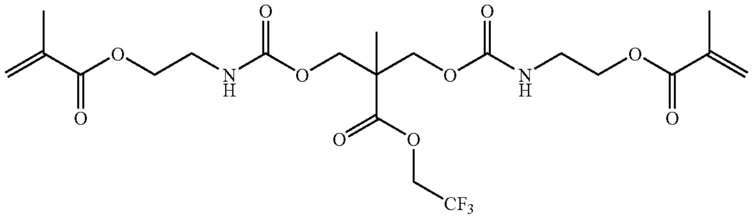
(48)
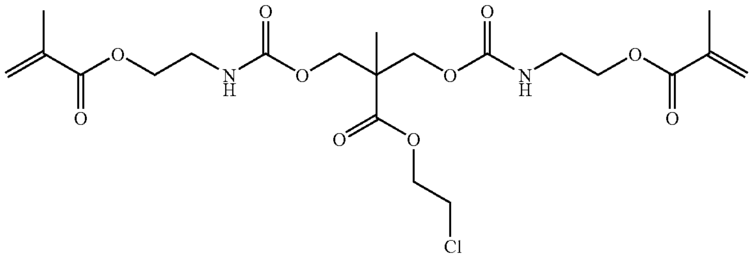
(49)
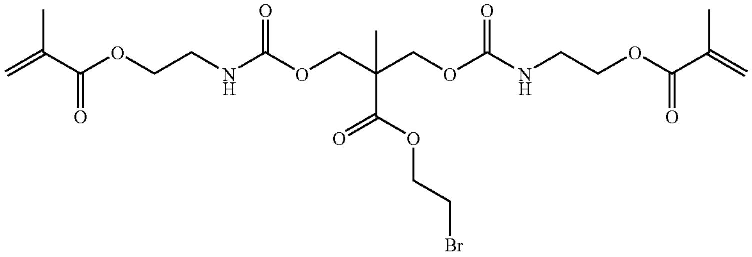
(50)
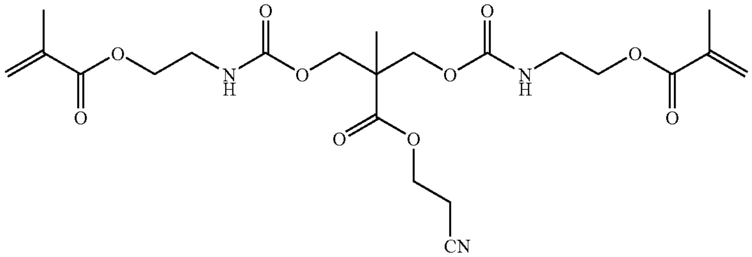

-continued
(51)
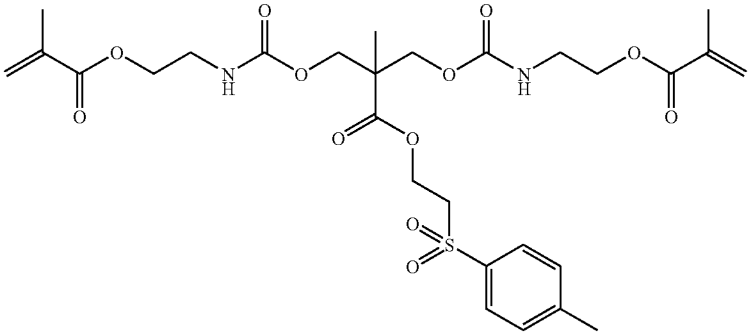
(52)
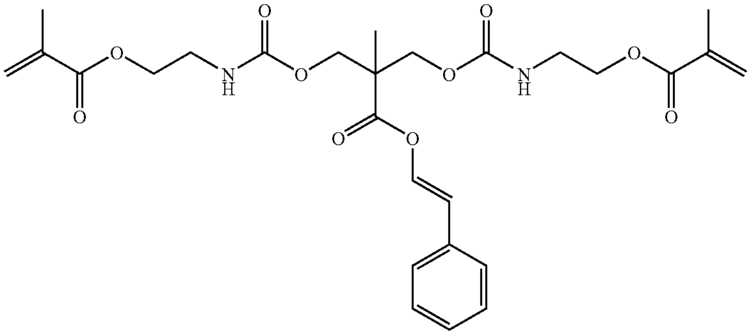
(53)
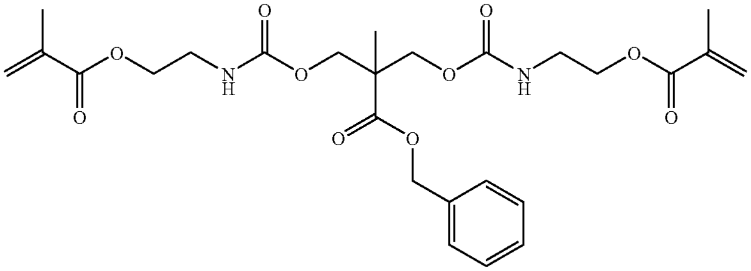
(54)
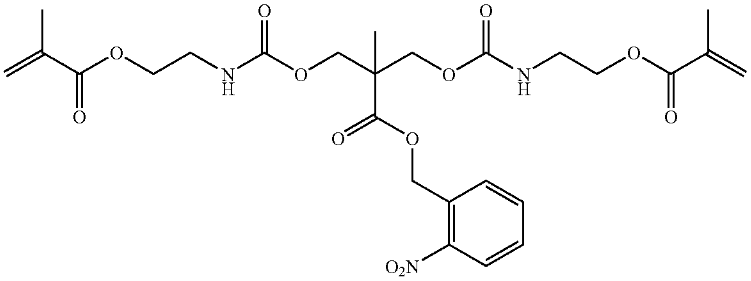
(55)
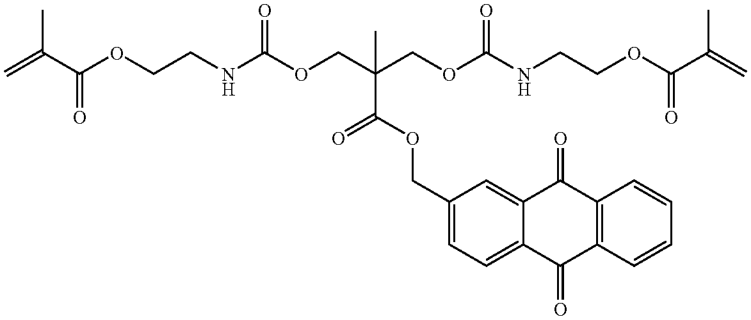

-continued
(56)
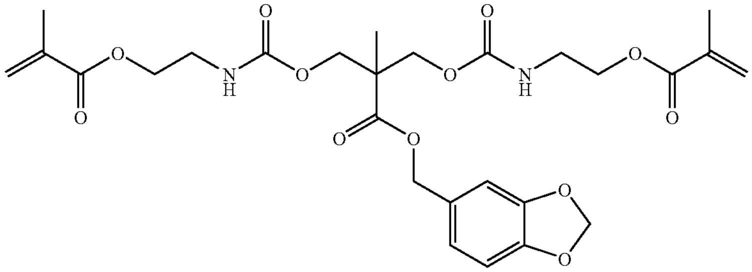
(57)
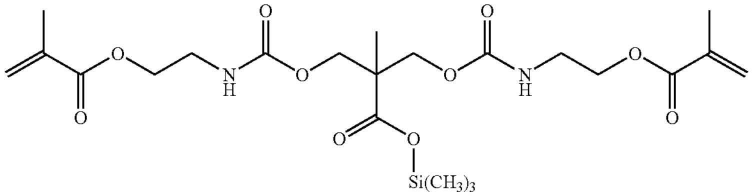
(58)
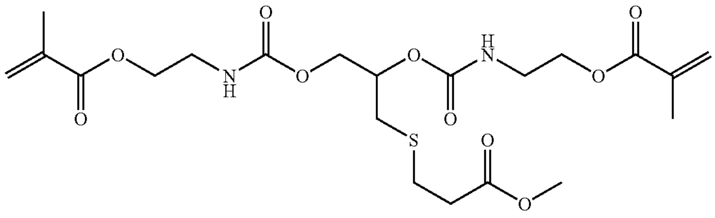
(59)
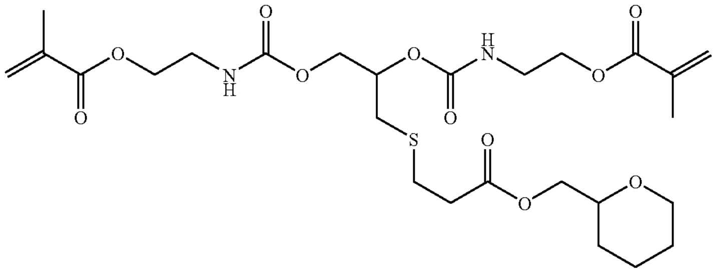
(60)
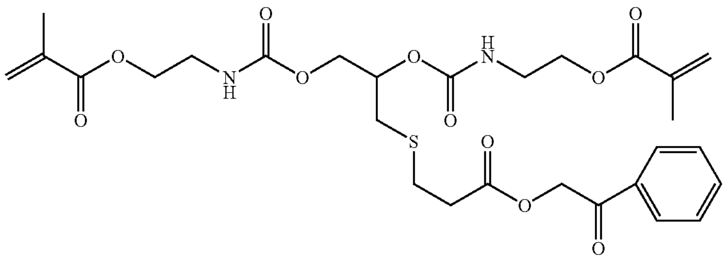
(61)
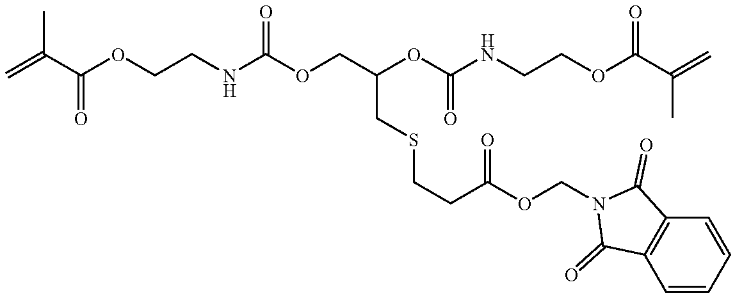

-continued
(62)
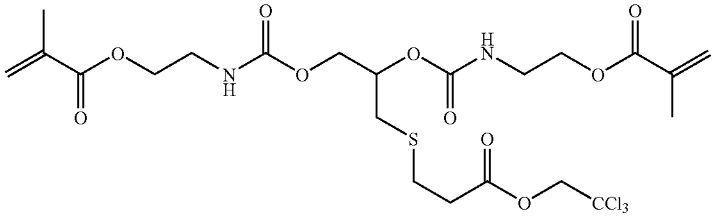
(63)
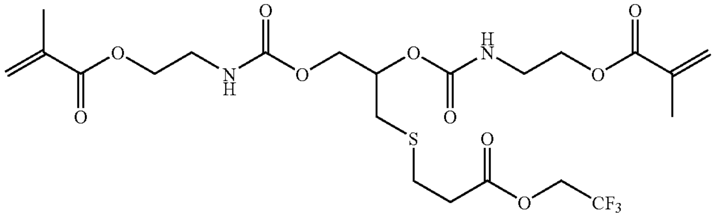
(64)
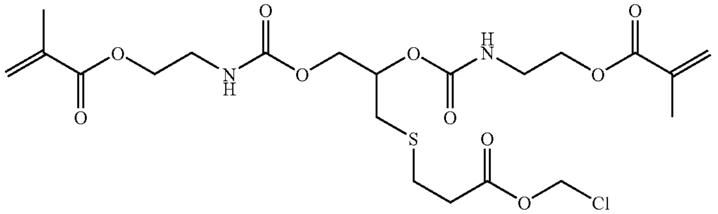
(65)
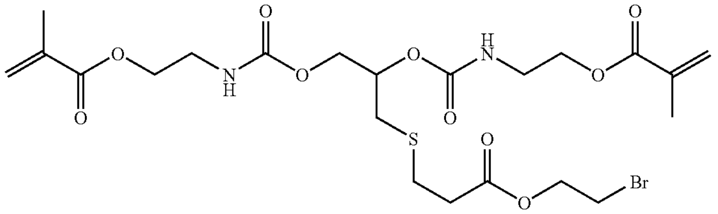
(66)
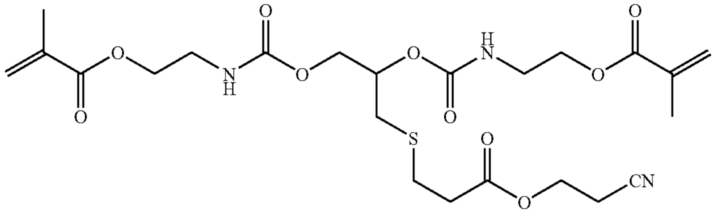
(67)
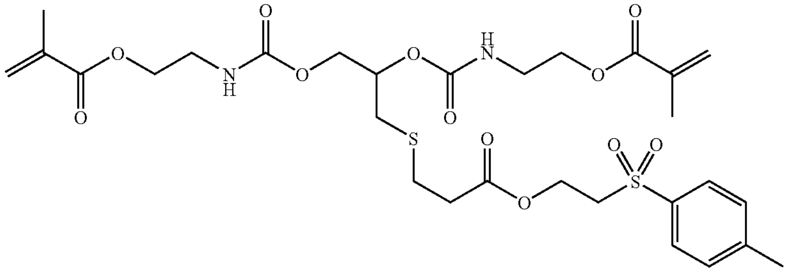
(68)
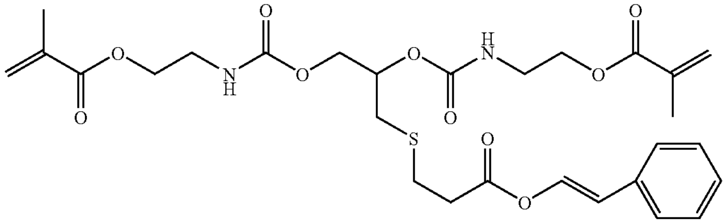

-continued
(69)
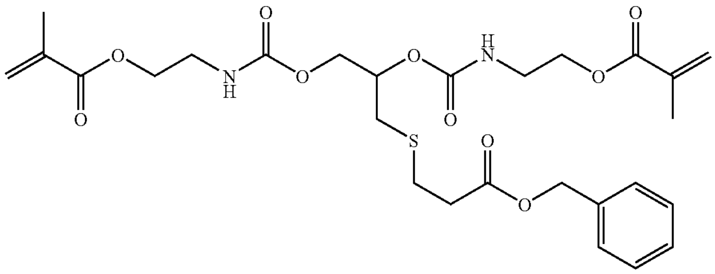
(70)
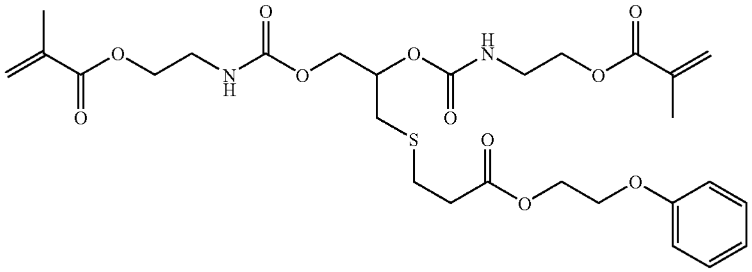
(71)
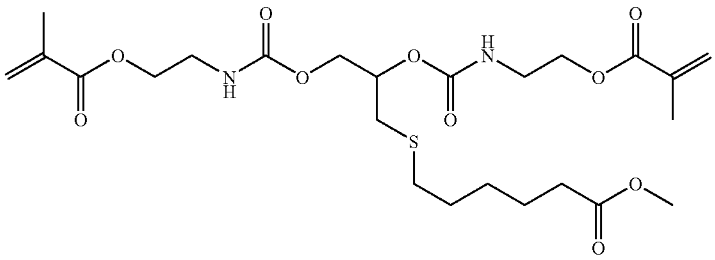
(72)
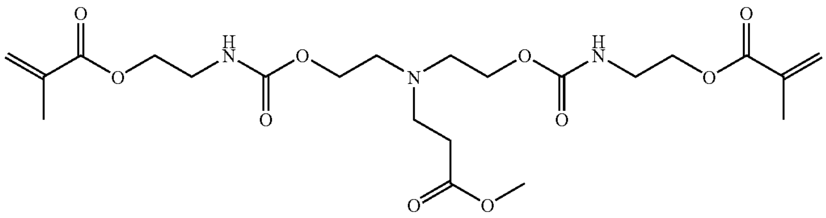
(73)
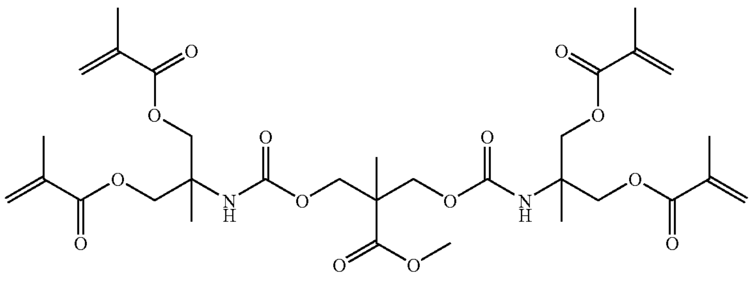

-continued
(74)
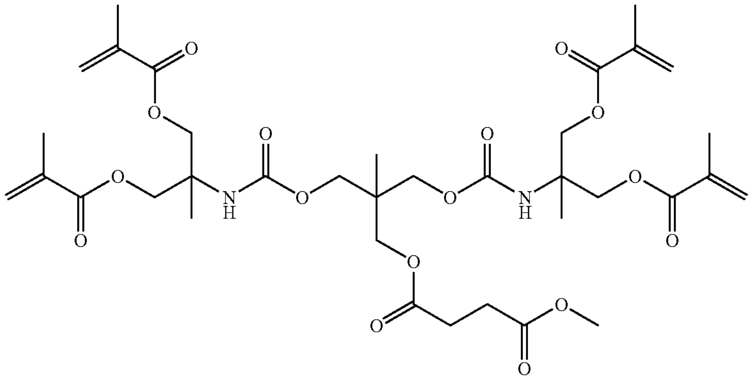
(75)
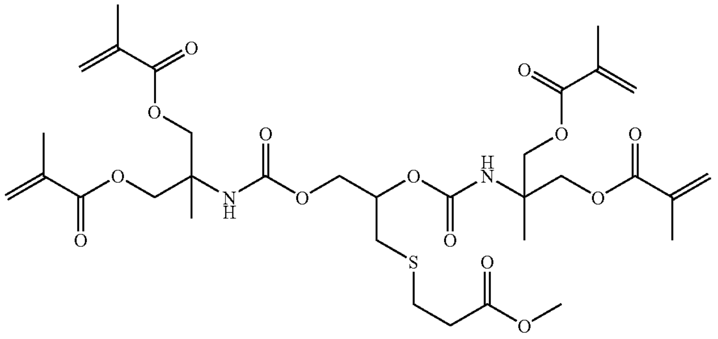
(76)
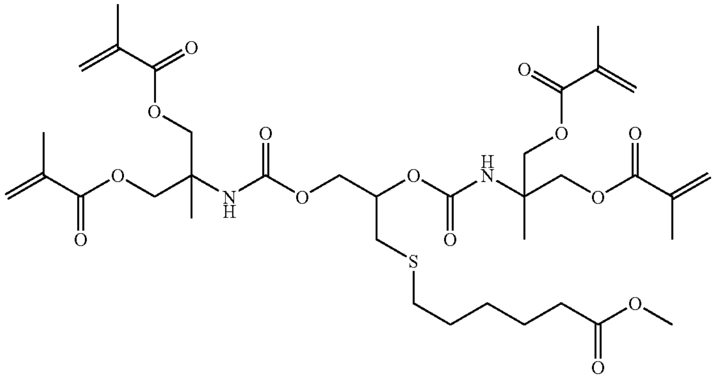
(77)
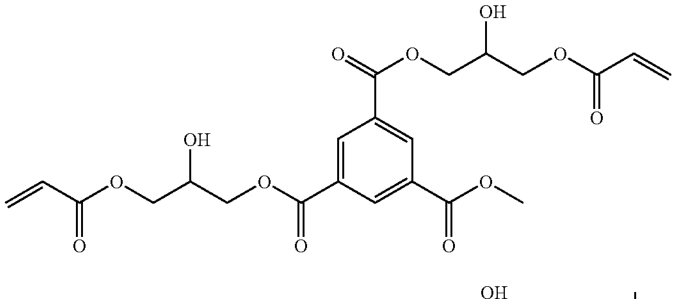
(78)
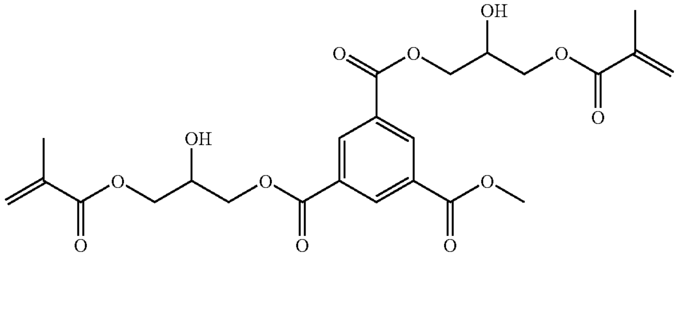

-continued
(79)
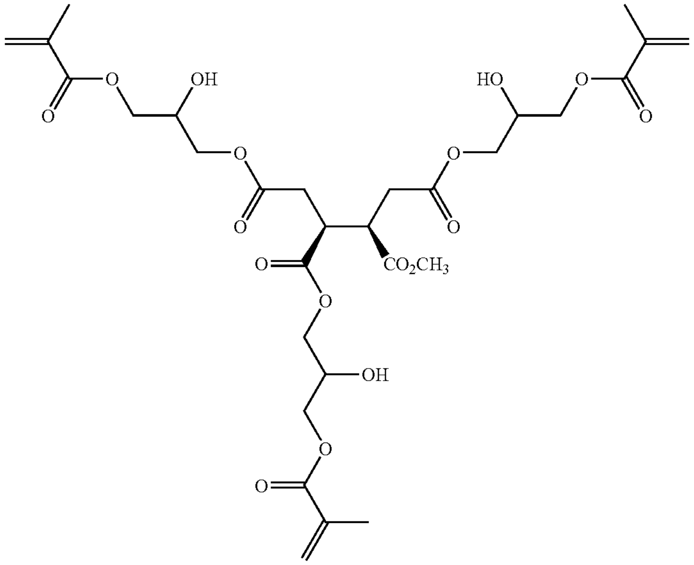
(80)
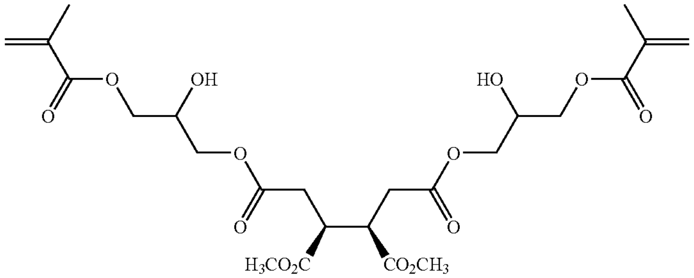
(81)
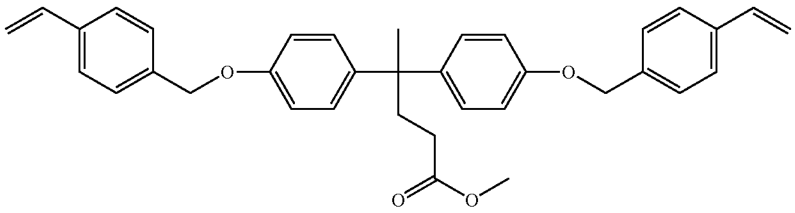
(82)
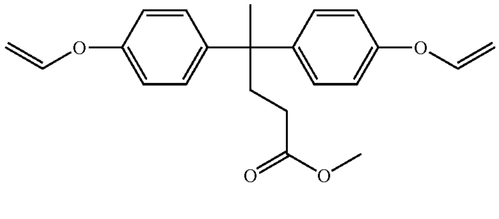
(83)
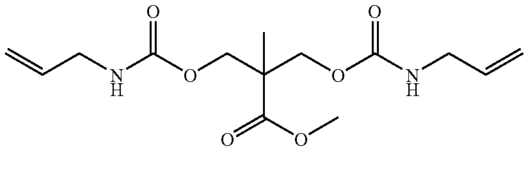
(84)
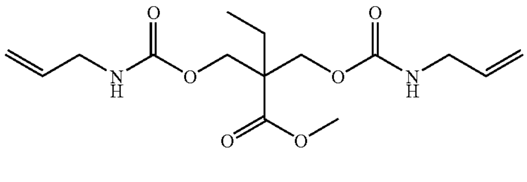
(85)
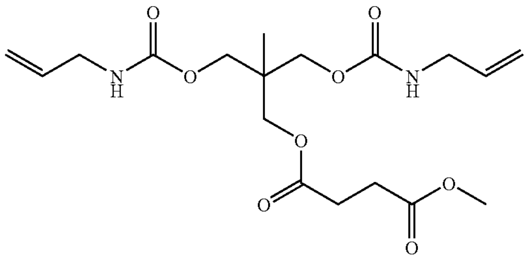

-continued
(86)
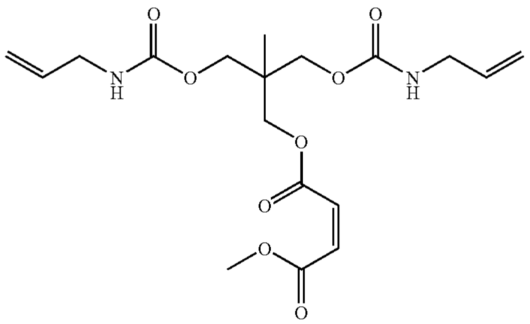
(87)
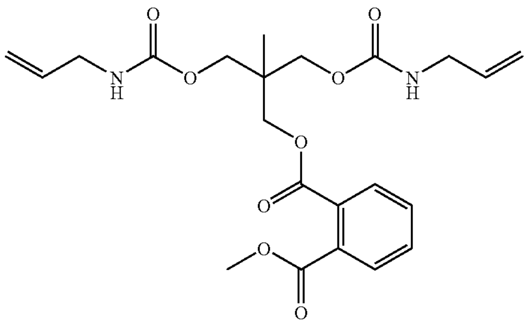
(88)
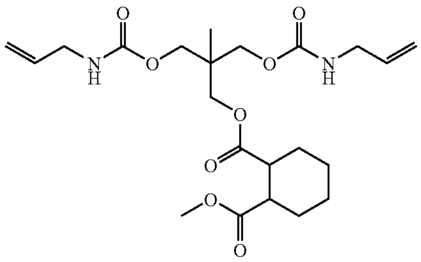
(89)
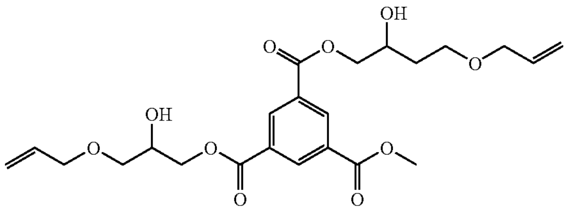
(90)
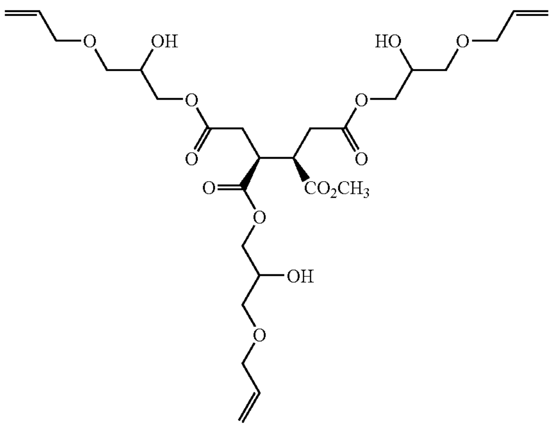
(91)
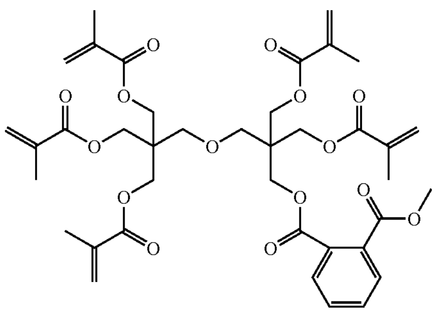
(92)
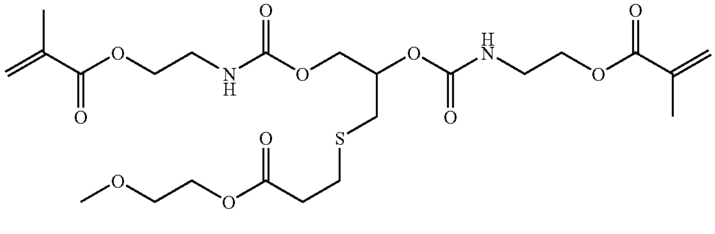
(93)
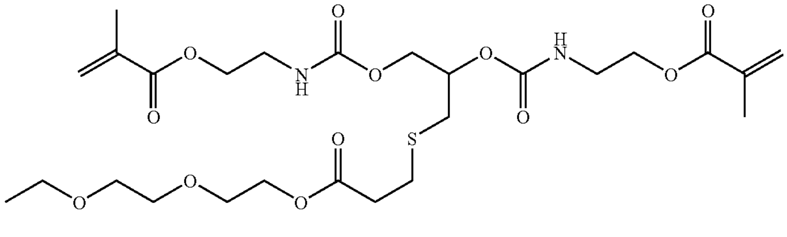

-continued (94)

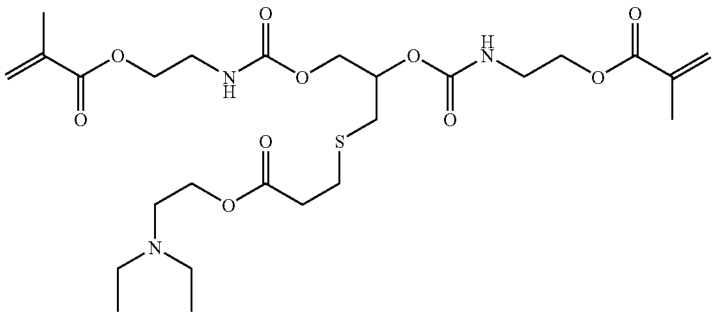

(95)

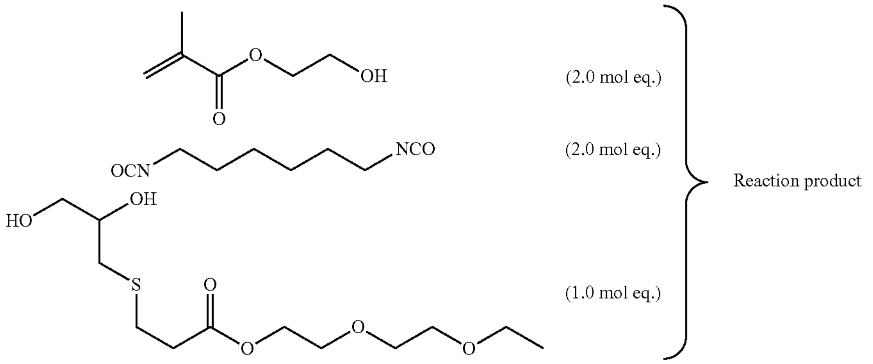

(96)

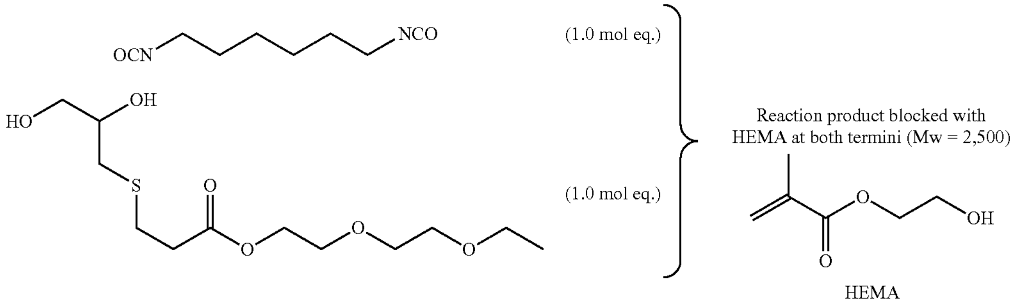

Among these specific examples of the compound represented by Formula (1), (1), (2), (24), (25), (27), (29), (34), (35), (39), (42), (46), (47), (49), (50), (51), (52), (53), (58), (63), (65), (66), (67), (69), (70), (71), (72), (73), (75), (76), (79), (81), (83), (86), (89), (90), (92), (93), (94), (95), and (96) are preferable, (29), (47) (50), (51), (53), (58), (72), (73), (75), (76), (92), (93), (94), (95), and (96) are more preferable, and (29) and (58) are particularly preferable.

The amount of ethylenically unsaturated compound used is preferably in the range of 5 to 90 wt % relative to the total solids content of the photosensitive layer, and more preferably in the range of 20 to 75 wt %.

With regard to the ethylenically unsaturated compound used in the photosensitive layer, it is preferable to use (ii) a compound represented by Formula (1) in combination with one or more type of other ethylenically unsaturated compound.

The content of the other ethylenically unsaturated compound used in combination is preferably 1 to 90 wt % relative to the total weight of the ethylenically unsaturated compound components, more preferably 20 to 85 wt %, and yet more preferably 50 to 80 wt %.

With regard to the other ethylenically unsaturated compound that can be used in combination, it may be freely selected from compounds having at least one, and preferably two or more ethylenically unsaturated double bonds. The compound has the chemical form of, for example, a monomer, a prepolymer such as a dimer, a trimer, or an oligomer, a copolymer thereof, or a mixture thereof.

Examples of the monomer include an ester of an unsaturated carboxylic acid (for example, acrylic acid, methacrylic acid, itaconic acid, crotonic acid, isocrotonic acid, or maleic acid) and an aliphatic polyhydric alcohol compound, and an amide of an unsaturated carboxylic acid and an aliphatic polyvalent amine compound.

As specific examples of the monomer that is an ester of an aliphatic polyhydric alcohol compound and an unsaturated carboxylic acid, the monomers below can be cited.

Examples of acrylic acid esters include ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl)ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol pentaacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate, and polyester acrylate oligomer.

Examples of methacrylic acid esters include tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, dipentaerythritol pentamethacrylate, sorbitol trimethacrylate, sorbitol tetramethacrylate, bis[p-(3-methacryloxy-2-hydroxypropoxy)phenyl]dimethylmethane, and bis[p-(methacryloxyethoxy)phenyl]dimethylmethane.

Examples of itaconic acid esters include ethylene glycol diitaconate, propylene glycol diitaconate, 1,3-butanediol diitaconate, 1,4-butanediol diitaconate, tetramethylene glycol diitaconate, pentaerythritol diitaconate, and sorbitol tetraitaconate.

Examples of crotonic acid esters include ethylene glycol dicrotonate, tetramethylene glycol dicrotonate, pentaerythritol dicrotonate, and sorbitol tetracrotonate.

As isocrotonic acid esters there can be cited ethylene glycol diisocrotonate, pentaerythritol diisocrotonate, and sorbitol tetraisocrotonate.

As maleic acid esters there can cited ethylene glycol dimaleate, triethylene glycol dimaleate, pentaerythritol dimaleate, and sorbitol tetramaleate.

Specific examples of monomers that are amides of an aliphatic polyvalent amine compound with an unsaturated carboxylic acid include methylenebisacrylamide, methylenebismethacrylamide, 1,6-hexamethylenebisacrylamide, 1,6-hexamethylenebismethacrylamide, diethylenetriaminetrisacrylamide, xylylenebisacrylamide, and xylylenebismethacrylamide.

There can also cited urethane acrylates described in JP-A-51-37193, and polyfunctional acrylates and methacrylates, for example, polyester acrylates and epoxy acrylates obtained by reacting an epoxy resin with (meth)acrylic acid, described in JP-A-48-64183, JP-B-49-43191, and JP-B-52-30490. Moreover, photocurable monomers or oligomers described in Nippon Secchaku Kyokaishi (Journal of Japan Adhesion Society), Vol. 20, No. 7, pp. 300-308 (1984) can also be used.

Specific examples thereof include NK OLIGO U-4HA, U-4H, U-6HA, U-6ELH, U-108A, U-1084A, U-200AX, U-122A, U-340A, U-324A, and UA-100 (Shin-Nakamura Chemical Co., Ltd.), UA-306H, Ai-600, UA-101T, UA-101I, UA-306T, and UA-306I (Kyoeisha Chemical Co., Ltd.), Art Resin UN-9200A, UN-3320HA, UN-3320HB, UN-3320HC, SH-380G, SH-500, and SH-9832 (Negami Chemical Industrial Co., Ltd.), and PLEX6661-O (Degussa, Germany).

(iii) Polymerization Initiator

A photosensitive layer in the lithographic printing plate precursor of the present invention contains a polymerization initiator (hereinafter, also called an 'initiator compound').

An initiator compound is a compound that undergoes chemical change by actions such as electron transfer, energy transfer, or generation of heat caused by the electronically excited state of a sensitizing dye to thus generate at least one type selected from a radical, an acid, or a base. Hereinafter, a radical, an acid, and a base thus generated are simply called 'active species'. When there is no initiator compound or only an initiator compound is used on its own, in practice sufficient sensitivity cannot be obtained. As one mode in which a sensitizing dye and an initiator compound are used in combination, they may be made into a single compound by an appropriate chemical method (linking the sensitizing dye and the initiator compound by a chemical bond, etc.) and used.

It is surmised that many of these initiator compounds usually form an active species via initial chemical processes represented by (1) to (3) below. That is, (1) reductive decomposition of an initiator compound based on an electron transfer reaction from a sensitizing dye in an electronically excited state to the initiator compound, (2) oxidative decomposition of an initiator compound based on electron transfer from the initiator compound to a sensitizing dye in an electronically excited state, and (3) decomposition of an initiator compound in an electronically excited state based on energy transfer from a sensitizing dye in an electronically excited state to the initiator compound. Although there is often some ambiguity with respect to which individual initiator compound belongs to which type of (1) to (3), the sensitizing dye in the present invention exhibits a very high sensitizing effect in combination with any type of these initiator compounds.

As the initiator compound, a compound known to a person skilled in the art may be used without any restrictions, and specific examples thereof include a trihalomethyl compound, a carbonyl compound, an organic peroxide, an azo type compound, an azide compound, a metallocene compound, a hexaarylbiimidazole compound, an organic boron compound, a disulfone compound, an oxime ester compound, an onium salt compound, and an iron arene complex. Among them, it is preferably at least one type selected from the group consisting of a hexaarylbiimidazole-based compound, an onium salt, a trihalomethyl compound, and a metallocene compound, and it is particularly preferably a hexaarylbiimidazole-based compound.

Furthermore, the polymerization initiator may be used in a combination of two or more types.

As the hexaarylbiimidazole compound, there can be cited lophine dimers described in JP-B-45-37377 and JP-B-44-86516 (JP-B denotes a Japanese examined patent application publication), and examples thereof include 2,2'-bis(o-chlorophenyl)-4,4',5,5'-tetraphenylbiimidazole, 2,2'-bis(o-bromophenyl)-4,4',5,5'-tetraphenylbiimidazole, 2,2'-bis(o,p-dichlorophenyl)-4,4',5,5'-tetraphenylbiimidazole, 2,2'-bis(o-chlorophenyl)-4,4',5,5'-tetra(m-methoxyphenyl) biimidazole, 2,2'-bis(o,o'-dichlorophenyl)-4,4',5,5'-tetraphenylbiimidazole, 2,2'-bis(o-nitrophenyl)-4,4',5,5'-tetraphenylbiimidazole, 2,2'-bis(o-methylphenyl)-4,4',5,5'-tetraphenylbiimidazole, and 2,2'-bis(o-trifluorophenyl)-4,4',5,5'-tetraphenylbiimidazole.

The hexaarylbiimidazole-based compound is particularly preferably used in a combination with a sensitizing dye having a maximum absorption at 300 to 450 nm.

The onium salt (functioning as an ionic polymerization initiator in the present invention, not as an acid generator) that is suitably used in the present invention is an onium salt represented by Formulae (RI-I) to (RI-III) below.

(RI-I)

(RI-II)

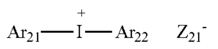

-continued (RI-III)

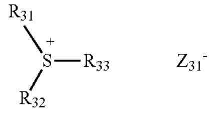

In formula (RI-I), $Ar_{11}$ denotes an aryl group that has no greater than 20 carbon atoms and that may have 1 to 6 substituents. Preferable examples of the substituent include an alkyl group having 1 to 12 carbon atoms, an alkenyl group having 2 to 12 carbon atoms, an alkynyl group having 2 to 12 carbon atoms, an aryl group having 6 to 12 carbon atoms, an alkoxy group having 1 to 12 carbon atoms, an aryloxy group having 6 to 12 carbon atoms, a halogen atom, an alkylamino group having 1 to 12 carbon atoms, a dialkylamino group having 2 to 12 carbon atoms, an alkylamide group or acrylamide group having 6 to 12 carbon atoms, a carbonyl group, a carboxy group, a cyano group, a sulfonyl group, a thioalkyl group having 1 to 12 carbon atoms, and a thioaryl group having 6 to 12 carbon atoms.

In Formula (RI-I), $Z_{11}^-$ denotes a monovalent anion. Specific examples of the monovalent anion include a halogen ion, a perchlorate ion, a hexafluorophosphate ion, a tetrafluoroborate ion, a sulfonate ion, a sulfinate ion, a thiosulfonate ion, or a sulfate ion. Among them, a perchlorate ion, a hexafluorophosphate ion, a tetrafluoroborate ion, a sulfonate ion, and a sulfinate ion are preferable from the viewpoint of stability.

In formula (RI-II), $Ar_{21}$ and $Ar_{22}$ independently denote an aryl group that has no greater than 20 carbon atoms and that may have 1 to 6 substituents. Preferable examples of the substituent include an alkyl group having 1 to 12 carbon atoms, an alkenyl group having 2 to 12 carbon atoms, an alkynyl group having 2 to 12 carbon atoms, an aryl group having 6 to 12 carbon atoms, an alkoxy group having 1 to 12 carbon atoms, an aryloxy group having 6 to 12 carbon atoms, a halogen atom, an alkylamino group having 1 to 12 carbon atoms, a dialkylamino group having 2 to 12 carbon atoms, an alkylamide group or acrylamide group having 6 to 12 carbon atoms, a carbonyl group, a carboxy group, a cyano group, a sulfonyl group, a thioalkyl group having 1 to 12 carbon atoms, or a thioaryl group having 6 to 12 carbon atoms.

In Formula (RI-II), $Z_{21}^-$ denotes a monovalent anion. Specific examples of the monovalent anion include a halogen ion, a perchlorate ion, a hexafluorophosphate ion, a tetrafluoroborate ion, a sulfonate ion, a sulfinate ion, a thiosulfonate ion, a sulfate ion, and a carboxylate ion. Among them, a perchlorate ion, a hexafluorophosphate ion, a tetrafluoroborate ion, a sulfonate ion, a sulfinate ion, and a carboxylate ion are preferable from the viewpoint of stability and reactivity.

In Formula (RI-III), $R_{31}$, $R_{32}$, and $R_{33}$ independently denote an aryl group that has no greater than 20 carbon atoms and that may have 1 to 6 substituents, an alkyl group, an alkenyl group, or an alkynyl group. Among them, the aryl group is preferable from the viewpoint of reactivity and stability.

Examples of the substituent include an alkyl group having 1 to 12 carbon atoms, an alkenyl group having 2 to 12 carbon atoms, an alkynyl group having 2 to 12 carbon atoms, an aryl group having 6 to 12 carbon atoms, an alkoxy group having 1 to 12 carbon atoms, an aryloxy group having 6 to 12 carbon atoms, a halogen atom, an alkylamino group having 1 to 12 carbon atoms, a dialkylamino group having 2 to 12 carbon atoms, an alkylamide group or acrylamide group having 6 to 12 carbon atoms, a carbonyl group, a carboxy group, a cyano group, a sulfonyl group, a thioalkyl group having 1 to 12 carbon atoms, and a thioaryl group having 6 to 12 carbon atoms.

In Formula (RI-III), $Z_{31}^-$ denotes a monovalent anion. Specific examples of the monovalent anion include a halogen ion, a perchlorate ion, a hexafluorophosphate ion, a tetrafluoroborate ion, a sulfonate ion, a sulfinate ion, a thiosulfonate ion, a sulfate ion, and a carboxylate ion. Among them, a perchlorate ion, a hexafluorophosphate ion, a tetrafluoroborate ion, a sulfonate ion, a sulfinate ion, and a carboxylate ion are preferable from the viewpoint of stability and reactivity. Carboxylate ions described in JP-A-2002-148790 and JP-A-2001-343742 are more preferable, and carboxylate ions described in JP-A-2002-148790 are yet more preferable.

The onium salt is particularly preferably used in combination with an IR absorber having a maximum absorption at 750 to 1,400 nm.

As other polymerization initiators, polymerization initiators described in JP-A-2007-171406, JP-A-2007-206216, JP-A-2007-206217, JP-A-2007-225701, JP-A-2007-225702, JP-A-2007-316582, and JP-A-2007-328243 may preferably be used.

With regard to the polymerization initiator in the present invention, one type thereof may suitably used on its own or two or more types thereof may be used in combination.

The amount of polymerization initiator used in the photosensitive layer in the present invention is preferably 0.01 to 20 wt % relative to the total weight of the solids content of the photosensitive layer, more preferably 0.1 to 15 wt %, and yet more preferably 1.0 to 10 wt %.

Sensitizing Dye

The photosensitive layer preferably comprises a sensitizing dye.

Adding, for example, a sensitizing dye having a maximum absorption at 300 to 450 nm, a sensitizing dye having a maximum absorption at 500 to 600 nm, or an IR absorber having a maximum absorption at 750 to 1,400 nm enables a high sensitivity lithographic printing plate precursor corresponding to a 405 nm violet laser, a 532 nm green laser, or an 803 nm IR laser, which are usually used in the present field, to be provided.

The sensitizing dye having a maximum absorption in the wavelength region of 350 to 450 nm is first explained.

Examples of such a sensitizing dye include a merocyanine dye, a benzopyran, a coumarin, an aromatic ketone, and an anthracene.

Among sensitizing dyes having an absorption maximum in the wavelength region of 360 to 450 nm, from the viewpoint of high sensitivity a dye represented by Formula (IX) below is preferable.

(IX)

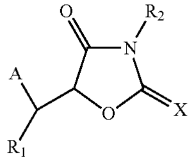

(In Formula (IX), A denotes an optionally substituted aromatic ring group or heterocyclic group, X denotes an oxygen atom, a sulfur atom, or N—($R_3$), $R_1$, $R_2$, and $R_3$ independently denote a monovalent non-metallic atomic group, and A and $R_1$, and $R_2$ and $R_3$ may be bonded to each other to form an aliphatic or aromatic ring.)

Formula (IX) is explained in further detail.

$R_1$, $R_2$, and $R_3$ in Formula (IX) are independently a monovalent non-metallic atomic group, and preferably a substituted or unsubstituted alkyl group, a substituted or unsubstituted alkenyl group, a substituted or unsubstituted aryl group, a substituted or unsubstituted aromatic heterocyclic residue, a substituted or unsubstituted alkoxy group, a substituted or unsubstituted alkylthio group, a hydroxyl group, or a halogen atom.

A in Formula (IX) is now explained.

A denotes an optionally substituted aromatic ring group or heterocyclic group.

Preferred specific examples of such a sensitizing dye include compounds described in paragraphs 0047 to 0053 of JP-A-2007-58170.

Furthermore, a sensitizing dye represented by Formulae (V) to (VII) below may also be used.

(V)

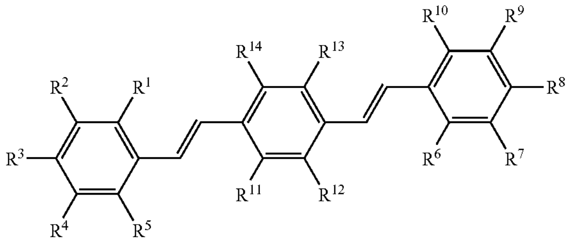

(VI)

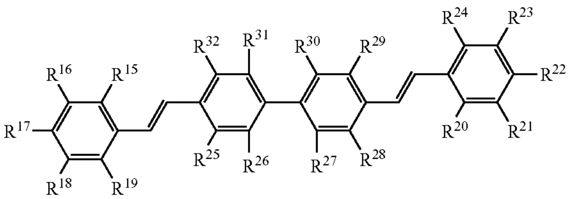

(VII)

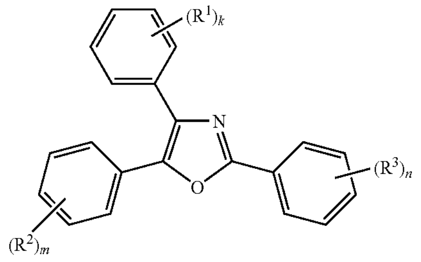

In Formula (V), $R^1$ to $R^{14}$ independently denote a hydrogen atom, an alkyl group, an alkoxy group, a cyano group, or a halogen atom. At least one of $R^1$ to $R^{10}$ denotes an alkoxy group having 2 or more carbons.

In Formula (VI), $R^{15}$ to $R^{32}$ independently denote a hydrogen atom, an alkyl group, an alkoxy group, a cyano group, or a halogen atom. At least one of $R^{15}$ to $R^{24}$ denotes an alkoxy group having 2 or more carbons.

In Formula (VII), $R^1$, $R^2$, and $R^3$ independently a halogen atom, an alkyl group, an aryl group, an aralkyl group, an —$NR^4R^5$ group, or an —$OR^6$ group, $R^4$, $R^5$, and $R^6$ independently denote a hydrogen atom, an alkyl group, an aryl group, or an aralkyl group, and k, m, and n independently denote an integer of 0 to 5.

Furthermore, sensitizing dyes described in JP-A-2007-171406, JP-A-2007-206216, JP-A-2007-206217, JP-A-2007-225701, JP-A-2007-225702, JP-A-2007-316582, and JP-A-2007-328243 may also be used.

The amount of sensitizing dye added is preferably 0.05 to 30 parts by weight relative to 100 parts by weight of the total solids content of the photosensitive layer, more preferably 0.1 to 20 parts by weight, and yet more preferably 0.2 to 10 parts by weight.

The sensitizing dye having a maximum absorption at 750 to 1,400 nm that is suitably used in the present invention is explained in detail below.

The sensitizing dye used here attains an electronically excited state with high sensitivity by irradiation with (exposure to) an IR laser, and it is surmised that electron transfer, energy transfer, generation of heat (photothermal conversion), etc. related to the electronically excited state acts on a polymerization initiator present in the photosensitive layer so as to cause a chemical change of the polymerization initiator, thus generating an active species such as a radial, an acid, or a base. Whichever is the case, adding a sensitizing dye having a maximum absorption at 750 to 1,400 nm is particularly suitable for production of a plate that is directly drawn using an IR laser having a wavelength of 750 nm to 1,400 nm, and compared with a conventional lithographic printing plate precursor, high image formation performance can be exhibited.

The IR absorber is preferably a dye having an absorption maximum at a wavelength of 750 nm to 1,400 nm.

As the dye, commercial dyes and known dyes described in the literature such as, for example, ‘Senryo Binran’ (Dye Handbook) (Ed. The Society of Synthetic Organic Chemistry, Japan, 1970) may be used. Specific examples thereof include an azo dye, a metal complex salt azo dye, a pyrazolone azo dye, a naphthoquinone dye, an anthraquinone dye, a phthalocyanine dye, a carbonium dye, a quinoneimine dye, a methine dye, a cyanine dye, a squarylium dye, a pyrylium salt, and a metal thiolate complex.

Among these dyes, a cyanine dye, a squarylium dye, a pyrylium salt, a nickel thiolate complex, and an indolenine cyanine dye are preferable, a cyanine dye and an indolenine cyanine dye are more preferable, and a cyanine dye represented by Formula (a) below is particularly preferable.

(a)

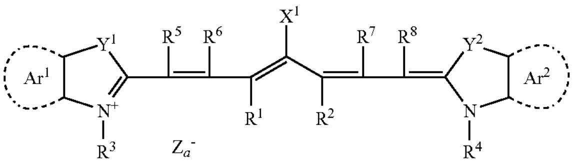

In Formula (a), $X^1$ denotes a hydrogen atom, a halogen atom, —$NPh_2$, $X^2$-$L^1$, or the group shown below. Here, $X^2$ denotes an oxygen atom, a nitrogen atom, or a sulfur atom, $L^1$ denotes a hydrocarbon group having 1 to 12 carbon atoms, a hetero atom-containing aromatic ring, or a hetero atom-containing hydrocarbon group having 1 to 12 carbon atoms. The hetero atom referred to here means N, S, O, a halogen atom, or Se, and Ph denotes a phenyl group.

$X_a^-$ is defined in the same manner as for $Z_a^-$, which is described later, and five $R^a$s independently denote a hydrogen atom or a substituent selected from the group consisting of an alkyl group, an aryl group, a substituted or unsubstituted amino group, and a halogen atom.

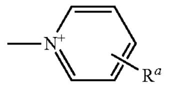

$X_a^-$ $R^1$ and $R^2$ independently denote a hydrocarbon group having 1 to 12 carbon atoms. From the viewpoint of storage stability of a photosensitive layer coating liquid, $R^1$ and $R^2$ are preferably hydrocarbon groups having two or more carbon atoms, and it is particularly preferable for $R^1$ and $R^2$ to be bonded to each other to form a 5-membered ring or a 6-membered ring.

$Ar^1$ and $Ar^2$ may be identical to or different from each other, and denote an optionally substituted aromatic hydrocarbon group. Preferred examples of the aromatic hydrocarbon group include a benzene ring and a naphthalene ring. Preferred examples of the substituent include a hydrocarbon group having no greater than 12 carbon atoms, a halogen atom, and an alkoxy group having no greater than 12 carbon atoms.

$Y^1$ and $Y^2$ may be identical to or different from each other, and denote a sulfur atom or a dialkylmethylene group having no greater than 12 carbon atoms.

$R^3$ and $R^4$ may be identical to or different from each other, and denote an optionally substituted hydrocarbon group having no greater than 20 carbon atoms. Preferred examples of the substituent include an alkoxy group having no greater than 12 carbon atoms, a carboxy group, and a sulfo group.

$R^5$, $R^6$, $R^7$, and $R^8$ may be identical to or different from each other, and denote a hydrogen atom or a hydrocarbon group having no greater than 12 carbon atoms. From the availability of starting materials, a hydrogen atom is preferable.

Furthermore, $Za^-$ denotes a counteranion. When a cyanine dye represented by Formula (a) has an anionic substituent in its structure and neutralization of charge is unnecessary, $Za^-$ is not required. From the viewpoint of storage stability of the photosensitive layer coating liquid, $Za^-$ is preferably a halogen ion, a perchlorate ion, a tetrafluoroborate ion, a hexafluorophosphate ion, or a sulfonate ion, and particularly preferably a perchlorate ion, a hexafluorophosphate ion, or an arylsulfonate ion. As a counterion, one not containing a halogen ion is particularly preferable.

As a pigment, commercial pigments and pigments described in 'Karaa Indekkusu' (C.I.) Binran (Handbook), 'Saishin Ganryo Binran' (Latest Pigments Handbook) (Ed. Nippon Ganryo Gijutsu Kyokai, 1977), 'Saishin Ganryo Ouyo Gijutsu' (Latest Pigment Application Techniques' (CMC Publishing, 1986), and 'Insatsu Inki Gijutsu' (Printing Ink Techniques) (CMC Publishing, 1984) may be used.

Examples of the type of pigment include a black pigment, a yellow pigment, an orange pigment, a brown pigment, a red pigment, a purple pigment, a blue pigment, a green pigment, a fluorescent pigment, a metal powder pigment and, in addition, polymer-binding dyes. Specifically, an insoluble azo pigment, an azo lake pigment, a condensed azo pigment, a chelate azo pigment, a phthalocyanine type pigment, an anthraquinone type pigment, perylene and perinone type pigments, a thioindigo type pigment, a quinacridone type pigment, a dioxazine type pigment, an isoindolinone type pigment, a quinophthalone type pigment, a dye lake pigment, an azine pigment, a nitroso pigment, a nitro pigment, a natural pigment, a fluorescent pigment, an inorganic pigment, carbon black, etc. may be used. Among these pigments, carbon black is preferable.

These pigments may be used with or without a surface treatment being carried out. As a method for the surface treatment, a method in which the surface is coated with a resin or wax, a method in which a surfactant is deposited, a method in which a reactive material (e.g. a silane coupling agent, an epoxy compound, a polyisocyanate, etc.) is bonded to the pigment surface, etc. can be considered. The above-mentioned surface treatment methods are described in 'Kinzoku Sekken no Seishitsu to Ouyo' (Properties and Applications of Metal Soaps) (SAIWAISHOBO), 'Insatsu Inki Gijutsu' (Printing Ink Techniques) (CMC Publishing, 1984), and 'Saishin Ganryo Ouyo Gijutsu' (Latest Pigment Application Techniques) (CMC Publishing, 1986).

The particle size of the pigment is preferably in the range of 0.01 μm to 10 μm, more preferably in the range of 0.05 μm to 1 μm, and particularly preferably in the range of 0.1 μm to 1 μm. When in this preferred particle size range, the dispersion stability of the pigment in the photosensitive layer is excellent and a uniform photosensitive layer can be obtained.

As a method for dispersing the pigment, a known dispersion technique used for ink production, toner production, etc. may be used. Examples of a dispersion machine include an ultrasonic disperser, a sand mill, an attritor, a pearl mill, a super mill, a ball mill, an impeller, a disperser, a KD mill, a colloidal mill, a dynatron, a three roll mill, and a pressure kneader. Details are described in 'Saishin Ganryo Ouyo Gijutsu' (Latest Pigment Application Techniques) (CMC Publishing, 1986).

These IR absorbers may be added to the same layer as other components or may be added to another layer provided separately.

From the viewpoint of uniformity in the photosensitive layer and durability of the photosensitive layer, the amount of these IR absorbers added is preferably 0.01 to 50 wt % relative to the total content of solids forming the photosensitive layer, and more preferably 0.1 to 10 wt %; in the case of a dye it is particularly preferably 0.5 to 10 wt %, and in the case of a pigment it is particularly preferably 0.1 to 10 wt %.

Microcapsules

In the present invention, as a method by which the above-mentioned constituents of the photosensitive layer and other constituents described hereinafter are contained in the photosensitive layer, part of the constituents may be encapsulated in microcapsules and added to the photosensitive layer as described in, for example, JP-A-2001-277740 and JP-A-2001-277742. In such a case, each constituent may be present inside or outside the microcapsule in any appropriate ratio.

As a method of microencapsulating the constituents of the photosensitive layer, known methods can be used.

Methods for the production of microcapsules include, for example, a method utilizing coacervation described in U.S. Pat. Nos. 2,800,457 and 2,800,458, a method using interfacial polymerization described in U.S. Pat. No. 3,287,154, JP-B-38-19574, and JP-B-42-446, a method using polymer deposition described in U.S. Pat. Nos. 3,418,250 and 3,660,304, a method using an isocyanate polyol wall material described in U.S. Pat. No. 3,796,669, a method using an isocyanate wall material described in U.S. Pat. No. 3,914,511, a method using a urea-formaldehyde type or urea-formaldehyde-resorcinol type wall-forming material described in U.S. Pat. Nos. 4,001,140, 4,087,376, and 4,089,802, a method using a wall material, for example, a melamine-formaldehyde resin or hydroxycellulose described in U.S. Pat. No. 4,025,445, an in-situ method by monomer polymerization described in JP-B-36-9163 and JP-B-51-9079, a spray drying method described in GB Patent No. 930,422 and U.S. Pat. No. 3,111,407, and an electrolytic dispersion cooling method described in GB Patents Nos. 952,807 and 967,074, but the present invention should not be construed as being limited thereto.

A preferred microcapsule wall used in the present invention has three-dimensional crosslinking and has the property of being swollen by solvent. From this point of view, preferred wall materials of the microcapsule include polyurea, polyurethane, polyester, polycarbonate, polyamide, and mixtures thereof, and polyurea and polyurethane are particularly preferred. Furthermore, a compound having a crosslinkable functional group such as an ethylenically unsaturated bond, capable of being introduced into above-mentioned water-insoluble polymer, may be introduced into the microcapsule wall.

The average particle size of the microcapsules is preferably 0.01 to 3.0 μm, more preferably 0.05 to 2.0 μm, and particularly preferably 0.10 to 1.0 μm. When in the above-mentioned range, good resolution and stability over time can be achieved.

Colorant

The photosensitive layer preferably employs a dye having a large absorption in the visible light region for a colorant in an image. As above-mentioned, a colorant may have a function as a sensitizing dye above-mentioned.

Specific examples of the dye include Oil Yellow #101, Oil Yellow #103, Oil Pink #312, Oil Green BG, Oil Blue BOS, Oil Blue #603, Oil Black BY, Oil Black BS, Oil Black 1-505 (all from Orient Chemical Industry Co., Ltd.), Victoria Pure Blue, Crystal Violet (CI42555), Methyl Violet (CI42535), Ethyl Violet, Rhodamine B (CI45170B), Malachite Green (CI42000), Methylene Blue (CI52015), and dyes described in JP-A-62-293247.

As the pigment, a pigment may suitably be used.

As the pigment, a pigment such as a phthalocyanine-based pigment, an azo-based pigment, carbon black, or titanium oxide may suitably be used, and a phthalocyanine-based pigment is most preferably used.

It is preferable to add these colorants because the image area and the non-image area after image formation can be easily differentiated. The amount of colorant added is preferably 0.01 to 10 wt % relative to the total solids content of image recording materials of the photosensitive layer.

Other Photosensitive Layer Components

The photosensitive layer may further contain various additives as necessary. As the additive, a surfactant for promoting developability and improving coated surface conditions, a hydrophilic polymer for improving developability and improving dispersion stability of microcapsules, a colorant and a printing out agent for making visible an image area and a non-image area, a polymerization inhibitor for inhibiting unwanted thermal polymerization of a radically polymerizable compound during production or storage of a photosensitive layer, a higher fatty derivative for preventing polymerization inhibition by oxygen, inorganic particles for improving cured film strength of an image area, a hydrophilic low molecular weight compound for improving developability, a co-sensitizer or a chain transfer agent for improving sensitivity, a plasticizer for improving plasticity, etc. may be added. These compounds may employ known substances such as compounds described in, for example, JP-A-2007-171406, JP-A-2007-206216, JP-A-2007-206217, JP-A-2007-225701, JP-A-2007-225702, JP-A-2007-316582, and JP-A-2007-328243.

As a compound functioning as a chain transfer agent, a group of compounds having SH, PH, SiH, or GeH in the molecules may be used. These compounds can donate hydrogen to a low activity radical species to generate a radical or are oxidized and then deprotonated to generate a radical.

The photosensitive layer of the present invention may preferably employ as a chain transfer agent a thiol compound (e.g. a 2-mercaptobenzimidazole, a 2-mercaptobenzothiazole, a 2-mercaptobenzoxazole, a 3-mercaptotriazole, a 5-mercaptotetrazole, etc.) in particular.

Among them, a thiol compound represented by Formula (S) below is particularly suitably used. In accordance with the use of a thiol compound represented by Formula (S) as a chain transfer agent, degradation of sensitivity due to evaporation from the photosensitive layer or diffusion to another layer can be avoided, the storage stability is excellent, and a lithographic printing plate precursor having high sensitivity and high plate life can be obtained.

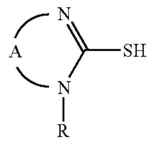

(S)

In Formula (S), R denotes hydrogen atom, an optionally substituted alkyl group, or an optionally substituted aryl group, A denotes an atomic group forming together with the N=C—N moiety a carbon atom-containing 5- or 6-membered heterocycle, and A may further have a substituent.

Formation of Photosensitive Layer

The photosensitive layer is formed by dispersing or dissolving each of the necessary components described above in a solvent to prepare a coating liquid and applying the liquid.

As the solvent used here, there can be cited for example ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethylsulfoxide, sulfolane, γ-butyrolactone, toluene, and water, but the present invention should not be construed as being limited thereto.

These solvents may be used singly or as a mixture.

The solids content concentration of the coating liquid is preferably 1 to 50 wt %.

The photosensitive layer may also be formed by preparing a plurality of coating liquids by dispersing or dissolving the same or different components described above in the same or different solvents and repeatedly coating and drying a plurality of times.

The amount (solids content) of the photosensitive layer that the support is coated with after coating and drying may be varied depending on the use, but normally it is preferably 0.3 to 3.0 $g/m^2$. In the above-mentioned range good sensitivity and good film properties of the photosensitive layer can be obtained.

Various methods can be used for the coating. Examples of the method include bar coater coating, spin coating, spray coating, curtain coating, dip coating, air knife coating, blade coating, and roll coating.

Protective Layer

In the lithographic printing plate precursor that can be used in the present invention, a protective layer (oxygen-blocking layer) is preferably provided on the photosensitive layer in order to prevent diffusion and penetration of oxygen, which inhibits a polymerization reaction at the time of exposure.

The protective layer preferably has an oxygen permeability (A) at 25° C. under one atmosphere of $1.0 \leqq (A) \leqq 20$ (mL/$m^2$·day). When the oxygen permeability (A) is at least 1.0 (mL/$m^2$·day), an undesirable polymerization reaction can be suppressed during production and during storage before image exposure, and the occurrence of the problems of undesirable fogging or widening of image lines during image exposure can be suppressed. When the oxygen permeability (A) is no greater than 20 (mL/$m^2$·day), the sensitivity is excellent. The oxygen permeability (A) is more preferably in the range of $1.5 \leqq (A) \leqq 12$ (mL/$m^2$·day), and yet more preferably in the range of $2.0 \leqq (A) \leqq 10.0$ (mL/$m^2$·day).

Apart from the above-mentioned oxygen permeability, as properties required of the protective layer it is desirable that the protective layer does not substantially hinder the transmission of light used for exposure, has excellent adhesion to the photosensitive layer, and can be easily removed during a development step after exposure. Protective layers have already been devised and described in detail in U.S. Pat. No. 3,458,311 and JP-B-55-49729.

As the material that can be used for the protective layer, for example, a water-soluble polymer compound with relatively good crystallinity is preferably used. Specifically, a water-soluble polymer such as polyvinyl alcohol (PVA), a vinyl alcohol/vinyl phthalate copolymer, a vinyl acetate/vinyl alcohol/vinyl phthalate copolymer, a vinyl acetate/crotonic acid copolymer, polyvinylpyrrolidone, an acidic cellulose, gelatin, gum Arabic, polyacrylic acid, or polyacrylamide can be cited. The water-soluble polymer compound may be used singly or as a mixture. Of these compounds, it is preferable to use polyvinyl alcohol as a main component since the best results can be obtained in fundamental properties such as oxygen-blocking properties and development removability.

The polyvinyl alcohol for use in the protective layer may be partially substituted with ester, ether or acetal as long as it contains unsubstituted vinyl alcohol units for achieving the necessary oxygen-blocking properties and water solubility. In the same way, part of the polyvinyl alcohol may have another copolymer component.

As specific examples of the polyvinyl alcohol, those with 71 to 100 mol % hydrolysis and 300 to 2,400 polymerization repeating units can be cited.

Specific examples thereof include PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613, and L-8 (Kuraray Co., Ltd.). They can be used singly or as a mixture. In a preferred embodiment, the polyvinyl alcohol content in the protective layer is 20 to 95 wt %, and more preferably 30 to 90 wt %.

Furthermore, a known modified polyvinyl alcohol may also be preferably used. For example, polyvinyl alcohols of various degrees of polymerization having at random various types of hydrophilic modified sites such as an anion-modified site modified with an anion such as a carboxy group or a sulfo group, a cation-modified site modified with a cation such as an amino group or an ammonium group, a silanol-modified site, and a thiol-modified site, and polyvinyl alcohols of various degrees of polymerization having at the terminal of the polymer chain various types of modified sites such as the above-mentioned anion-modified site, the above-mentioned cation-modified site, a silanol-modified site, and a thiol-modified site and, furthermore, an alkoxy-modified site, a sulfide-modified site, an ester-modified site of vinyl alcohol with various types of organic acids, an ester-modified site of the above-mentioned anion-modified site with an alcohol, and an epoxy-modified site can be cited.

Examples of an acid-modified polyvinyl alcohol suitably used in the protective layer include KL-118, KM-618, KM-118, SK-5102, MP-102, and R-2105 (Kuraray Co., Ltd.), GOHSENAL CKS-50, T-HS-1, T-215, T-350, T-330, and T-330H (The Nippon Synthetic Chemical Industry Co., Ltd.), and AF-17 and AT-17 (Japan VAM & POVAL Co., Ltd.).

As a component used as a mixture with polyvinyl alcohol, polyvinylpyrrolidone or a modified product thereof is preferable from the viewpoint of oxygen-blocking properties and development removability. The content thereof in the protective layer is preferably 3.5 to 80 wt %, more preferably 10 to 60 wt %, and yet more preferably 15 to 30 wt %.

The components of the protective layer (PVA selection and use of additives), the amount coated, etc. are determined taking into consideration fogging properties, adhesion, and scratch resistance in addition to oxygen-blocking properties and development removability. In general, the higher the degree of hydrolysis of the PVA used (the higher the unsubstituted vinyl alcohol unit content in the protective layer) and the thicker the film thickness, the higher are the oxygen-blocking properties, which is advantageous from the viewpoint of sensitivity.

The molecular weight of the (co)polymer of the above-mentioned polyvinyl alcohol (PVA), etc. is preferably 2,000 to 10,000,000 and more preferably 20,000 to 3,000,000.

As other components of the protective layer, glycerol, dipropylene glycol, etc. can be added in an amount corresponding to several wt % of the (co)polymer to impart flexibility. Furthermore, an anionic surfactant such as a sodium alkylsulfate or sodium alkylsulfonate; an amphoteric surfactant such as an alkylaminocarboxylic acid salt or an alkylaminodicarboxylic acid salt; or a nonionic surfactant such as a polyoxyethylene alkyl phenyl ether can be added in an amount corresponding to several wt % of the (co)polymer.

Furthermore, adhesion to an image area and scratch resistance are also extremely important for handling of a plate. That is, when a hydrophilic layer comprising a water-soluble polymer is layered on an oleophilic photosensitive layer, layer peeling due to insufficient adhesion is liable to occur, and the peeled portion causes defects such as incomplete film curing due to polymerization inhibition by oxygen. Various proposals have been made for improving the adhesion between these two layers. For example, it is known that sufficient adhesion can be obtained by mixing from 20 to 60 wt % of an acrylic-based emulsion or a water-insoluble vinylpyrrolidone/vinyl acetate copolymer with a hydrophilic polymer mainly comprising polyvinyl alcohol and layering the resulting mixture on the photosensitive layer. Any of these known techniques may be applied to the protective layer according to the present invention. Coating methods for such a protective layer are described in detail, for example, in U.S. Pat. No. 3,458,311 and JP-B-55-49729.

Furthermore, it is also preferable for an inorganic layered compound to be contained in the protective layer of the lithographic printing plate precursor for the purpose of improving the oxygen-blocking properties and the photosensitive layer surface protection properties.

The inorganic layered compound used here is a particle having a thin tabular shape and includes, for example, mica, for example, natural mica represented by the following formula:

$$A(B,C)_{2-5}D_4O_{10}(OH,F,O)_2$$

(in the formula A denotes any one of K, Na, and Ca, B and C denote any one of Fe (II), Fe(III), Mn, Al, Mg, and V, and D denotes Si or Al) or synthetic mica; talc represented by the following formula: $3MgO.4SiO.H_2O$; taeniolite; montmorillonite; saponite; hectorite; and zirconium phosphate.

Of the inorganic layered compounds, fluorine-based swellable synthetic mica, which is a synthetic inorganic layered compound, is particularly useful in the present invention.

The aspect ratio of the inorganic layered compound is preferably at least 20, more preferably at least 100, and yet more preferably at least 200. The aspect ratio is the ratio of thickness to major axis of a particle and can be determined, for example, from a projection drawing of a particle by microphotography. The larger the aspect ratio, the greater the effect obtained.

As for the particle size of the inorganic layered compound, the average major axis is preferably 0.3 to 20 μm, more preferably 0.5 to 10 μm, and yet more preferably 1 to 5 μm. The average thickness of the particle is preferably no greater than 0.1 μm, more preferably no greater than 0.05 μm, and yet more preferably no greater than 0.01 μm. For example, in the swellable synthetic mica that is a representative compound of the inorganic layered compound, the thickness is preferably on the order of from 1 to 50 nm and the plane size is preferably on the order of from 1 to 20 μm.

When such an inorganic layered compound particle having a large aspect ratio is contained in the protective layer, the coated film strength increases and, furthermore, since penetration of oxygen or moisture can be inhibited effectively deterioration of the protective layer due to deformation, etc. can be prevented, and even when the lithographic printing plate precursor is stored for a long period of time under high humidity conditions there is no degradation in the image-forming properties thereof due to change in humidity and the storage stability is excellent.

The content of the inorganic layered compound in the protective layer is preferably 5/1 to 1/00 as a ratio by weight relative to the amount of binder used in the protective layer. When a plurality of inorganic layered compounds are used in combination, it is also preferable that the total amount of the inorganic layered compounds is in the above-mentioned weight ratio range.

A method for dispersing the inorganic layered compound used in the protective layer may employ a method described in JP-A-2007-171406, JP-A-2007-206216, JP-A-2007-206217, JP-A-2007-225701, JP-A-2007-225702, JP-A-2007-316582, JP-A-2007-328243, etc.

The coat weight of the protective layer is preferably in the range of 0.05 to 10 $g/m^2$ as a coat weight after drying. When the protective layer contains the inorganic layered compound, it is more preferably in the range of 0.1 to 0.5 $g/m^2$, and when the protective layer does not contain the inorganic layered compound, it is more preferably in the range of 0.5 to 5 $g/m^2$.

Undercoat Layer

In the lithographic printing plate precursor of the present invention, it is preferable to provide, above a support, an undercoat layer of a compound containing a polymerizable group. When an undercoat layer is used, the photosensitive layer is provided above the undercoat layer. The undercoat layer has the effects of strengthening adhesion between the support and the photosensitive layer in exposed areas and facilitating separation of the photosensitive layer from the support in unexposed areas, so that the developability can be improved.

Specific preferred examples of the undercoat layer include a silane coupling agent having an addition-polymerizable ethylenic double bond reactive group described in JP-A-10-282679, and a phosphorus compound having an ethylenic double bond reactive group described in JP-A-2-304441. A particularly preferred compound is a compound having both a polymerizable group such as a methacrylic group or an allyl group and a support-adsorptive group such as a sulfonic acid group, a phosphoric acid group, or a phosphoric acid ester group. A compound having a hydrophilicity-imparting group such as an ethylene oxide group, in addition to the polymerizable group and the support-adsorptive group may also be cited as a preferable compound.

The coat weight (solids content) of the undercoat layer is preferably 0.1 to 100 $mg/m^2$, and more preferably 1 to 30 $mg/m^2$.

Backcoat Layer

After applying a surface treatment to the support or forming the undercoat layer above the support, a backcoat layer may as necessary be provided on the back surface of the support.

As the backcoat layer, there can preferably be cited, for example, a coating layer comprising an organic polymer compound described in JP-A-5-45885, and a coating layer comprising a metal oxide obtained by hydrolysis and polycondensation of an organic metal compound or an inorganic metal compound described in JP-A-6-35174. Among them, use of an alkoxy compound of silicon such as $Si(OCH_3)_4$, $Si(OC_2H_5)_4$, $Si(OC_3H_7)_4$, or $Si(OC_4H_9)_4$ is preferable since starting materials are inexpensive and readily available.

Process for Producing Lithographic Printing Plate

The process for producing a lithographic printing plate using the lithographic printing plate precursor of the present invention is now explained in detail.

The process for producing a lithographic printing plate of the present invention comprises an exposure step of imagewise exposing the lithographic printing plate precursor of the present invention and a development step of removing the photosensitive layer of a non-exposed portion in the presence of a developer having buffering capacity.

Furthermore, it may comprise as necessary a step of exposing and/or heating the entire surface of the lithographic printing plate precursor between the exposure step and the development step and/or subsequent to the development step.

Imagewise exposure of the lithographic printing plate precursor is carried out by a method in which exposure is carried out through a transparent original having a line image, a halftone dot image, etc., a method in which laser beam scanning is carried out based on digital data, etc. Among them, in the exposure step, it is preferable to carry out imagewise exposure by means of a laser.

The wavelength of an exposure light source is not particularly limited, and it may be appropriately selected according to a polymerization initiator or a sensitizing dye, and is preferably 300 nm to 450 nm or 760 nm to 1,200 nm.

As an available laser light source for emitting light at 300 nm to 450 nm, those below may be used.

Examples of a gas laser include an Ar ion laser (364 nm, 351 nm, 10 mW to 1 W), a Kr ion laser (356 nm, 351 nm, 10 mW to 1 W), and a He—Cd laser (441 nm, 325 nm, 1 mW to 100 mW), examples of a solid-state laser include a combination of Nd:YAG ($YVO_4$) and SHG crystal ×2 (355 nm, 5 mW to 1 W) and a combination of Cr:LiSAF and SHG crystal (430 nm, 10 mW), examples of a semiconductor laser system include a $KNbO_3$ ring resonator (430 nm, 30 mW), a combination of a waveguide wavelength converter and AlGaAs and InGaAs semiconductors (380 nm to 450 nm, 5 mW to 100 mW), a combination of a waveguide wavelength converter and AlGaInP and AlGaAs semiconductors (300 nm to 350 nm, 5 mW to 100 mW), and AlGaInN (350 nm to 450 nm, 5 mW to 30 mW) and, in addition, examples of a pulse laser include an $N_2$ laser (337 nm, 0.1 to 10 mJ pulse) and XeF (351 nm, 10 to 250 mJ pulse). Among them, an AlGaInN semiconductor laser (commercial InGaN-based semiconductor laser 400 to 410 nm, 5 to 30 mW) is suitable in terms of wavelength characteristics and cost.

With regard to lithographic printing plate precursor exposure equipment of a scanning exposure method, as a exposure mechanism any of an internal drum system, an external drum system, and a flatbed system may be used, and as a light source among the above-mentioned light sources a continuous-wave type may preferably be used.

Furthermore, as another exposure light source that can be used in the present invention, super high pressure, high pressure, medium pressure, and low pressure mercury lamps, a chemical lamp, a carbon arc lamp, a xenon lamp, a metal halide lamp, various visible and UV laser lamps, a fluorescent lamp, a tungsten lamp, sunlight, etc. can be cited.

As an available laser light source for emitting light at 760 nm to 1,200 nm, although not particularly limited, a solid-state laser and a semiconductor laser that radiate IR rays at a wavelength of 760 to 1,200 nm can be cited suitably. The output of an IR laser is preferably at least 100 mW. Furthermore, in order to reduce exposure time, a multibeam laser device is preferably used. The exposure time per pixel is preferably within 20 μsec. Furthermore, the amount of irradiation energy is preferably 10 to 300 mJ/$cm^2$. As a light source, an AlGaInN semiconductor laser (commercial InGaN-based semiconductor laser 5 to 30 mW) is suitable in terms of wavelength characteristics and cost.

The development step is now explained in detail.

In a development step using a conventional lithographic printing plate precursor, strongly alkaline development is carried out, whereas in accordance with the lithographic printing plate precursor of the present invention, weakly alkaline development is also possible.

Furthermore, compared with a case in which conventional strongly alkaline development is carried out, in a case in which weakly alkaline development is carried out the lithographic printing plate precursor of the present invention can give a lithographic printing plate having excellent developability, etc.

Furthermore, the development step is preferably a step in which removal of the photosensitive layer of a non-exposed portion and a gumming treatment are carried out using a single liquid. Moreover, when the lithographic printing plate precursor of the present invention has a protective layer, the development step is preferably a step of carrying out using a single liquid removal of the protective layer, removal of the photosensitive layer of a non-exposed portion, and a gumming treatment.

'Gumming' in the present invention means a treatment of a plate surface in order to make it hydrophilic by means of a surfactant and/or a water-soluble polymer compound.

With regard to the developer in the above development step a water-soluble polymer compound is preferably added to the developer. In a development step employing a conventional lithographic printing plate precursor, the protective layer is removed by a water washing pre-step, alkali development is then carried out, the alkali is removed by a water washing post-step, a gumming treatment is carried out by a gumming step, and drying is carried out by a drying step, whereas by adding a water-soluble polymer compound to the developer it also becomes possible to carry out development and gumming at the same time. Furthermore, when a water-soluble polymer compound is added to the developer in this way, a water washing post-step is not particularly required, and after development and gumming are carried out using a single liquid, a drying step may be carried out. Moreover, since removal of the protective layer can also be carried out at the same time as development and gumming, this is the most preferred mode due to a water washing pre-step being not required either. Furthermore, it is preferable that, subsequent to development and gumming, surplus developer is removed using a squeegee roller, etc., and drying is then carried out.

The developer in the development step may be any as long as it is a developer having pH buffering capacity, and it is preferable to use an aqueous solution having pH buffering capacity. By exhibiting a buffer action, even if the developer is used for a long period of time, variation in pH can be suppressed, and degradation of developability, formation of development residue, etc. due to variation in pH can be suppressed.

The pH of the developer is preferably 7.0 to 12.0, more preferably 7.5 to 11.0 and, in terms of developability and the environment, is most preferably 8.0 to 10.5.

The pH buffer agent that can be used in the present invention is not particularly limited as long as it is a buffer agent exhibiting a buffering action.

In the present invention, an alkaline buffer agent is preferably used, and examples thereof include (a) carbonate ion and hydrogen carbonate ion, (b) borate ion, (c) a water-soluble amine compound and an ion of the amine compound, and the combined use thereof. That is, for example, (a) a combination of carbonate ion-hydrogen carbonate ion, (b) borate ion, or (c) a combination of water-soluble amine compound-ion of the amine compound can exhibit a pH buffering action in the developer, can suppress change in pH when the developer is used for a long period of time, and can suppress degradation of developability, the occurrence of development residue, etc. due to change in pH. A combination of carbonate ion and hydrogen carbonate ion is particularly preferable.

In order to make (a) carbonate ion and hydrogen carbonate ion present in the developer, a carbonate salt and a hydrogen carbonate salt may be added to the developer, or carbonate ion and hydrogen carbonate ion may be formed by adjusting the pH after a carbonate salt or a hydrogen carbonate salt is added.

The carbonate salt and the hydrogen carbonate salt are not particularly limited, but an alkali metal salt is preferable. As the alkali metal, lithium, sodium, and potassium can be cited, and sodium is particularly preferable. They may be used singly or in a combination of two or more types.

In order to make (b) borate ion present in the developer, after boric acid and/or a boric acid salt is added to the developer, the pH is adjusted using an alkali or an alkali and an acid, thus forming an appropriate amount of borate ion.

The boric acid or the boric acid salt used here is not particularly limited, and known boric acid and boric acid salt may be used.

Examples of the boric acid include orthoboric acid, metaboric acid, and tetraboric acid, and among them orthoboric acid and tetraboric acid are preferable. The boric acid may be used singly or in a combination of two or more types.

Furthermore, examples of the boric acid salt include an alkali metal salt and an alkaline earth metal salt; an orthoboric acid salt, a diboric acid salt, a metaboric acid salt, a tetraboric acid salt, a pentaboric acid salt, and an octaboric acid salt can be cited, and among them an orthoboric acid salt and a tetraboric acid salt, in particular an alkali metal tetraboric acid salt, are preferable. Preferred examples of the tetraboric acid salt include sodium tetraborate, potassium tetraborate, and lithium tetraborate, and among them sodium tetraborate is preferable. The boric acid salt may be used singly or in a combination of two or more types.

As the boric acid and/or boric acid salt that can be used in the present invention, orthoboric acid, tetraboric acid, and/or sodium tetraborate are particularly preferable. The developer may use boric acid and a boric acid salt in combination.

The ion of the water-soluble amine compound (c) can be generated in an aqueous solution of the water-soluble amine compound, an alkali or an acid may further be added to the aqueous solution of the water-soluble amine compound, or it can be made present in an aqueous solution by adding a compound that is a salt of the amine compound itself.

The water-soluble amine compound is not particularly limited, but is preferably a water-soluble amine compound having a group that promotes water-solubility. Examples of the group that promotes water-solubility include a carboxylic acid group, a sulfonic acid group, a sulfinic acid group, a phosphonic acid group, and a hydroxy group. The water-soluble amine compound may contain a plurality of these groups in combination.

When the water-solubility of an amine compound is promoted by a carboxylic acid group, a sulfonic acid group, a sulfinic acid group, or a phosphonic acid group, it corresponds to an amino acid. An amino acid is in equilibrium in an aqueous solution, and when the acid group is for example a carboxylic acid group, the equilibrium can be expressed as shown below. The amino acid referred to in the present invention means state B below, and the ion of an amino acid referred to means state C. As a counterion in state C, sodium ion or potassium ion is preferable. The state B below need not be a zwitterionic state, and may be a state in which neither the amino group nor the carboxy group is charged.

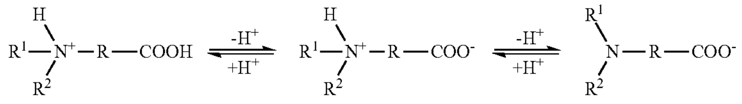

A B C

<Equilibrium of amino acid (when acid group is carboxylic acid)>

(For example, $R^1$ and $R^2$ independently denote a hydrogen atom, an alkyl group, an aryl group, etc., and R denotes a linking group.)

Specific examples of the water-soluble amine compound having a carboxylic acid group, a sulfonic acid group, or a sulfinic acid group include amino acids such as glycine, iminodiacetic acid, lysine, threonine, serine, aspartic acid, parahydroxyphenylglycine, dihydroxyethylglycine, alanine, anthranilic acid, and tryptophan, sulfamic acid, fatty acid aminesulfonic acids such as cyclohexylsulfamic acid and taurine, and fatty acid aminesulfinic acids such as aminoethanesulfinic acid. Among them, glycine and iminodiacetic acid are preferable.

Specific examples of the water-soluble amine compound having a phosphonic acid group (including a phosphinic acid group) include 2-aminoethylphosphonic acid, 1-aminoethane-1,1-diphosphonic acid, 1-amino-1-phenylmethane-1,1-diphosphonic acid, 1-dimethylaminoethane-1,1-diphosphonic acid, and ethylenediaminopentamethylenephosphonic acid. 2-Aminoethylphosphonic acid is particularly preferable.

The water-soluble amine compound having a hydroxy group as the group promoting water-solubility means an alkylamine having a hydroxy group on the alkyl group (state B' below), and an ion thereof means an ammonium ion of the amino group (state A' below).

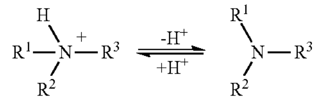

A' B'

(For example, $R^1$, $R^2$, and $R^3$ independently denote a hydrogen atom, an alkyl group, an aryl group, etc. At least one of $R^1$, $R^2$, and $R^3$ is an alkyl group having a hydroxy group.)

Specific examples of the water-soluble amine compound having a hydroxy group include monoethanolamine, diethanolamine, trimethanolamine, triethanolamine, tripropanolamine, and triisopropanolamine. Among them, triethanolamine and diethanolamine are preferable. As the ammonium ion counterion, chloride ion is preferable.

Examples of an alkali that can be used for adjustment of pH include sodium hydroxide, potassium hydroxide, lithium hydroxide, sodium carbonate, potassium carbonate, ammonium carbonate, sodium hydrogen carbonate, potassium hydrogen carbonate, ammonium hydrogen carbonate, an organic alkali agent, and a combination thereof. Furthermore, as an acid an inorganic acid such as, for example, hydrochloric acid, sulfuric acid, or nitric acid may be used. Adding such an alkali or acid enables the pH to be finely adjusted.

The pH of the developer (a) containing carbonate ion and hydrogen carbonate ion that can be used in the present invention is preferably in the range of 8.5 to 10.8. When the pH is at least 8.5 the developability of a non-image area can be improved, whereas when it is no greater than 10.8 the influence of carbon dioxide in the air can be reduced and degradation of processing capacity due to the influence of carbon dioxide can be suppressed. The pH is more preferably in the range of 8.8 to 10.2, and particularly preferably in the range of 9.0 to 10.0.

When as the pH buffer agent the combination (a) carbonate ion and hydrogen carbonate ion is used, the total amount of carbonate ion and hydrogen carbonate ion is preferably 0.05 to 5 mol/L relative to the total amount of developer, more preferably 0.1 to 2 mol/L, and particularly preferably 0.2 to 1 mol/L. When the total amount is at least 0.05 mol/L the developability and processing capacity do not deteriorate, and when it is no greater than 5 mol/L there is hardly any formation of a precipitate or crystals, there is hardly any gelling when carrying out neutralization during waste solution treatment for the developer, and waste solution treatment can be carried out without problems.

Furthermore, for the purpose of finely adjusting the alkali concentration or assisting dissolution of a non-image area of the photosensitive layer, an alkali agent, for example, an organic alkali agent, may be added supplementarily.

Examples of the organic alkali agent include monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, pyridine, and tetramethylammonium hydroxide. These alkali agents may be used singly or in a combination of two or more types.

When (b) borate ion is used as the pH buffer agent, the total amount of borate ion is preferably 0.05 to 5 mol/L relative to the total weight of the developer, more preferably 0.1 to 2 mol/L, and particularly preferably 0.2 to 1 mol/L. When the total amount of boric acid salt is at least 0.05 mol/L, the developability and processing capacity do not deteriorate, and when it is no greater than 5 mol/L there is hardly any formation of a precipitate or crystals, there is hardly any gelling when carrying out neutralization during waste solution processing for the developer, and waste solution processing can be carried out without problems.

When as a pH buffer agent (c) a water-soluble amine compound and an ion of the amine compound are used, the total amount of water-soluble amine compound and ion of the amine compound is preferably 0.01 to 1 mol/L relative to the total weight of the developer, more preferably 0.03 to 0.7 mol/L, and particularly preferably 0.05 to 0.5 mol/L. When in the above-mentioned range, the developability and processing capacity do not degrade, and waste solution processing is easy.

Specific examples of the developer having buffering capacity includes those below, but are not limited thereto.

A maleic acid/trishydroxymethylaminomethane (Tris)/sodium hydroxide buffer, a disodium hydrogen phosphate/sodium dihydrogen phosphate buffer, a potassium dihydrogen phosphate/sodium hydroxide buffer, a 2,4,6-trimethylpyridine/hydrochloric acid buffer, a triethanolamine hydrochloride/sodium hydroxide buffer, a sodium 5,5-diethylbarbiturate/hydrochloric acid buffer, an N-ethylmorpholine/hydrochloric acid buffer, a sodium pyrophosphate/hydrochloric acid buffer, a Tris/hydrochloric acid buffer, an N,N-bis(2-hydroxyethyl)glycine (Bicine)/sodium hydroxide buffer, a 2-amino-2-methylpropane-1,3-diol/hydrochloric acid buffer, a diethanolamine/hydrochloric acid buffer, a potassium p-phenolsulfonate/sodium hydroxide buffer, a boric acid/sodium hydroxide buffer, a sodium borate/hydrochloric acid buffer, an ammonia/ammonium chloride buffer, a glycine/sodium hydroxide buffer, a sodium carbonate/sodium hydrogen carbonate buffer, a sodium borate/sodium hydroxide buffer, a sodium hydrogen carbonate/sodium hydroxide buffer, a disodium hydrogen phosphate/sodium hydroxide buffer, a sodium hydroxide/potassium chloride buffer, a citric acid/disodium hydrogen phosphate buffer, a piperazine dihydrochloride/glycylglycine/sodium hydroxide buffer, a citric acid monohydrate/potassium dihydrogen phosphate/boric acid/diethylbarbituric acid/sodium hydroxide buffer, and a boric acid/citric acid/sodium phosphate 12-hydrate buffer.

Among them, from the viewpoint of developability, a sodium 5,5-diethylbarbiturate/hydrochloric acid buffer, a Tris/hydrochloric acid buffer, a 2-amino-2-methylpropane-1,3-diol/hydrochloric acid buffer, a diethanolamine/hydrochloric acid buffer, a potassium p-phenolsulfonate/sodium hydroxide buffer, a boric acid/sodium hydroxide buffer, a sodium borate/hydrochloric acid buffer, an ammonia/ammonium chloride buffer, a glycine/sodium hydroxide buffer, a sodium carbonate/sodium hydrogen carbonate buffer, a sodium borate/sodium hydroxide buffer, a sodium hydrogen carbonate/sodium hydroxide buffer, a disodium hydrogen phosphate/sodium hydroxide buffer, a sodium hydroxide/potassium chloride buffer, a piperazine dihydrochloride/glycylglycine/sodium hydroxide buffer, a citric acid monohydrate/potassium dihydrogen phosphate/boric acid/diethylbarbituric acid/sodium hydroxide buffer, and a boric acid/citric acid/sodium phosphate 12-hydrate buffer are preferable, and a potassium p-phenolsulfonate/sodium hydroxide buffer, a boric acid/sodium hydroxide buffer, an ammonia/ammonium chloride buffer, a glycine/sodium hydroxide buffer, a sodium carbonate/sodium hydrogen carbonate buffer, a sodium borate/sodium hydroxide buffer, a sodium hydrogen carbonate/sodium hydroxide buffer, a disodium hydrogen phosphate/sodium hydroxide buffer, a sodium hydroxide/potassium chloride buffer, a piperazine dihydrochloride/glycylglycine/sodium hydroxide buffer, a citric acid monohydrate/potassium dihydrogen phosphate/boric acid/diethylbarbituric acid/sodium hydroxide buffer, and a boric acid/citric acid/sodium phosphate 12-hydrate buffer are more preferable.

The developer that can be used in the present invention preferably comprises a surfactant.

The surfactant that can be used in the present invention may comprise any of anionic, nonionic, cationic, and amphoteric surfactants.

Examples of the anionic surfactant include a fatty acid salt, an abietic acid salt, a hydroxyalkanesulfonic acid salt, an alkanesulfonic acid salt, a dialkylsulfosuccinic acid salt, a straight-chain alkylbenzenesulfonic acid salt, a branched alkylbenzenesulfonic acid salt, an alkylnaphthalenesulfonic acid salt, an alkylphenoxypolyoxyethylene propylsulfonic acid salt, a polyoxyethylene alkylsulfophenyl ether salt, sodium N-methyl-N-oleyltaurine, a disodium N-alkylsulfosuccinic acid monoamide, a petroleum sulfonic acid salt, sulfated castor oil, sulfated tallow oil, a sulfate ester of a fatty acid alkyl ester, an alkylsulfate ester, a polyoxyethylene alkyl ether sulfate ester, a fatty acid monoglyceride sulfate ester, a polyoxyethylene alkyl phenyl ether sulfate ester, a polyoxyethylene styrylphenyl ether sulfate ester, an alkyl phosphate ester, a polyoxyethylene alkyl ether phosphate ester, a polyoxyethylene alkyl phenyl ether phosphate ester, a partially saponified styrene-maleic anhydride copolymer, a partially saponified olefin-maleic anhydride copolymer, a naphthalenesulfonic acid salt formalin condensate, an aromatic sulfonic acid salt, and an aromatic substituted polyoxyethylenesulfonic acid salt. Among them, a dialkylsulfosuccinic acid salt, an alkylsulfate ester, and an alkylnaphthalenesulfonic acid salt are particularly preferably used.

The cationic surfactant is not particularly limited, and a conventionally known cationic surfactant may be used. Examples thereof include an alkylamine salt, a quaternary ammonium salt, a polyoxyethylene alkylamine salt, and a polyethylene polyamine derivative.

Examples of the nonionic surfactant include a polyethylene glycol type higher alcohol ethylene oxide adduct, an alkylphenol ethylene oxide adduct, an aromatic compound polyethylene glycol adduct, a fatty acid ethylene oxide adduct, a polyhydric alcohol fatty acid ester ethylene oxide adduct, a higher alkylamine ethylene oxide adduct, a fatty acid amide ethylene oxide adduct, an ethylene oxide adduct of an oil or fat, a polypropylene glycol ethylene oxide adduct, a dimethylsiloxane-ethylene oxide block copolymer, a dimethylsiloxane-(propylene oxide-ethylene oxide) block copolymer, a polyhydric alcohol type glycerol fatty acid ester, a pentaerythritol fatty acid ester, sorbitol and sorbitan fatty acid esters, a sucrose fatty acid ester, a polyhydric alcohol alkyl ether, and an alkanolamine fatty acid amide.

In the present invention, a polyethylene glycol type higher alcohol ethylene oxide adduct, an aromatic compound polyethylene glycol adduct, a sorbitol and/or sorbitan fatty acid ester ethylene oxide adduct, a polypropylene glycol ethylene oxide adduct, a dimethylsiloxane-ethylene oxide block copolymer, a dimethylsiloxane-(propylene oxide-ethylene oxide) block copolymer, and a polyhydric alcohol fatty acid ester are preferable.

Furthermore, from the viewpoint of stable solubility in water and turbidity, for the nonionic surfactant the HLB (Hydrophile-Lipophile Balance) value is preferably at least 6, and more preferably at least 8. It is also possible to similarly use acetylene glycol type and acetylene alcohol type oxyethylene adducts, fluorine type, silicone type etc. surfactants.

The surfactant may be used singly or in a combination of two or more types.

The content of the surfactant in the developer is preferably 0.01 to 10 wt %, and more preferably 0.01 to 5 wt %.

As is well known in the surfactant field, an amphoteric surfactant is a compound having an anionic portion and a cationic portion in a single molecule, and includes amphoteric surfactants of the amino acid type, betaine type, amine oxide type, etc.

As the amphoteric surfactant that can be used in the developer of the present invention, a compound represented by Formula <1> below and a compound represented by Formula <2> below are preferable.

<1>

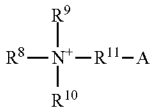

<2>

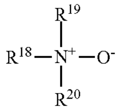

In Formula <1>, $R^8$ denotes an alkyl group, $R^9$ and $R^{10}$ independently denote a hydrogen atom or an alkyl group, $R^{11}$ denotes an alkylene group, and A denotes a carboxylic acid ion or a sulfonic acid ion.

In Formula <2>, $R^{18}$, $R^{19}$, and $R^{20}$ independently denote a hydrogen atom or an alkyl group, but not all of $R^{18}$, $R^{19}$, and $R^{20}$ are hydrogen atoms.

In Formula <1> above, the alkyl group denoted by $R^8$, $R^9$, or $R^{10}$ and the alkylene group denoted by $R^{11}$ may be a straight chain or a branched chain, may have a linking group in the chain, and may further have a substituent. As the linking group, one containing a hetero atom, such as an ester bond, an amide bond, or an ether bond is preferable. Furthermore, as the substituent a hydroxyl group, an ethylene oxide group, a phenyl group, an amide group, a halogen atom, etc. are preferable.

In the compound represented by Formula <1>, the sum total of the carbons of $R^8$ to $R^{11}$ is preferably 8 to 25, and more preferably 11 to 21. When in this range, a hydrophobic portion is appropriate, and the solubility in an aqueous developer is excellent.

Furthermore, by adding an organic solvent such as an alcohol as a dissolution adjuvant, the solubility of a surfactant in an aqueous developer can be improved.

In Formula <2> above, the alkyl group denoted by $R^{18}$, $R^{19}$, or $R^{20}$ may be a straight chain or a branched chain, may have a linking group in the chain, and may further have a substituent. As the linking group, one containing a hetero atom, such as an ester bond, an amide bond, or an ether bond is preferable. Furthermore, as the substituent a hydroxyl group, an ethylene oxide group, a phenyl group, an amide group, a halogen atom, etc. are preferable.

In the compound represented by Formula <2>, the sum total of the carbons of $R^{18}$ to $R^{20}$ is preferably 8 to 22, and more preferably 10 to 20. When in this range, a hydrophobic portion is appropriate, and the solubility in an aqueous developer is excellent.

The total number of carbons of the amphoteric surfactant might depend on the properties of a material used in the photosensitive layer, in particular a binder. In the case of a highly hydrophilic binder, one in which the total number of carbons is relatively small is preferable, and when the binder used has a low degree of hydrophilicity one in which the total number of carbons is large tends to be preferable.

Preferred specific examples of the amphoteric surfactant that can be used in the developer are listed below, but the present invention is not limited thereto.

W-1

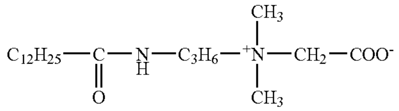

W-2

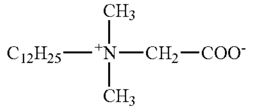

W-3

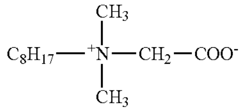

W-4

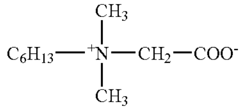

W-5

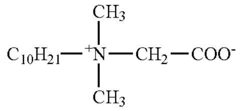

W-6

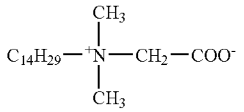

W-7

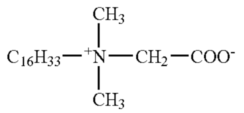

W-8

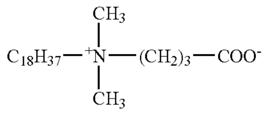

-continued

W-9

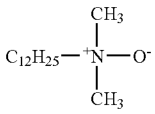

W-10

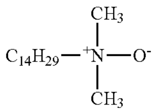

W-11

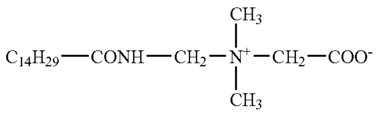

W-12

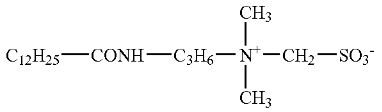

W-13

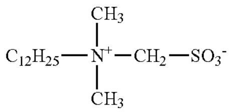

W-14

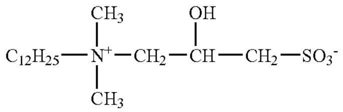

W-15

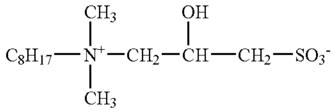

W-16

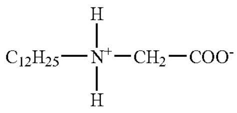

W-17

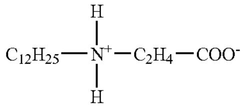

The developer used in the present invention may contain, in addition to the above-mentioned components, a wetting agent, a preservative, a chelating compound, an antifoaming agent, an organic solvent, an inorganic acid, an inorganic salt, a water-soluble resin, etc.

As the wetting agent, ethylene glycol, propylene glycol, triethylene glycol, butylene glycol, hexylene glycol, diethylene glycol, dipropylene glycol, glycerol, trimethylolpropane, diglycerol, etc. are suitably used. The wetting agent may be used singly or in a combination of two or more types.

The content of the wetting agent is preferably 0.1 to 5 wt % relative to the total weight of the developer.

As the antiseptic agent, for example, phenol or a derivative thereof, formalin, an imidazole derivative, sodium dehydroacetate, a 4-isothiazolin-3-one derivative, benzisothiazolin-3-one, 2-methyl-4-isothiazolin-3-one, a benzotriazole derivative, an amidine guanidine derivative, a quaternary ammonium salt, a pyridine derivative, a quinoline derivative, a guanidine derivative, diazine, a triazole derivative, oxazole, an oxazine derivative, or a nitrobromoalcohol such as 2-bromo-2-nitropropane-1,3-diol, 1,1-dibromo-1-nitro-2-ethanol, or 1,1-dibromo-1-nitro-2-propanol is preferably used. It is preferable to use in combination at least two types of preservatives so as to exhibit efficacy toward various types of molds and bacteria.

The amount of preservative added is an amount that exhibits stable efficacy toward bacteria, molds, yeasts, etc., and depends on the type of bacterium, mold, or yeast, but is preferably in the range of 0.01 to 4 wt % relative to the developer.

As the chelating compound, for example, ethylenediaminetetraacetic acid, the potassium salt thereof, or the sodium salt thereof; diethylenetriaminepentaacetic acid, the potassium salt thereof, or the sodium salt thereof; triethylenetetraminehexaacetic acid, the potassium salt thereof, or the sodium salt thereof; hydroxyethylethylenediaminetriacetic acid, the potassium salt thereof, or the sodium salt thereof; nitrilotriacetic acid or the sodium salt thereof; an organic phosphonic acid, for example, 1-hydroxyethane-1,1-diphosphonic acid, the potassium salt thereof, or the sodium salt thereof; or aminotri(methylenephosphonic acid), the potassium salt thereof, or the sodium salt thereof; or a phosphonoalkanetricarboxylic acid can be cited. An organic amine salt is also effective instead of the sodium salt or potassium salt of the chelating compounds.

As the chelating agent, one that is present stably in the processing liquid composition and does not inhibit printing properties is selected.

The amount of chelating agent added is suitably 0.001 to 1.0 wt % relative to the developer.

As the antifoaming agent, a normal silicone-based self emulsifying type, emulsifying type, nonionic, etc. compound having an HLB of no greater than 5 may be used. Among them, a silicone antifoaming agent is preferable.

Furthermore, any of an emulsifying dispersion type and a solubilizing type antifoaming agent may be used.

The content of the antifoaming agent is suitably in the range of 0.001 to 1.0 wt % relative to the developer.

Examples of the organic solvent include an aliphatic hydrocarbon (e.g. hexane, heptane, Isopar E, H, G (Esso Chemical Co., Ltd.), gasoline, or kerosene), an aromatic hydrocarbon (e.g. toluene or xylene), a halogenated hydrocarbon (e.g. methylene dichloride, ethylene dichloride, triclene, or monochlorobenzene), and a polar solvent.

Examples of the polar solvent include an alcohol (e.g. methanol, ethanol, propanol, isopropanol, benzyl alcohol, ethylene glycol monomethyl ether, 2-ethyoxyethanol, diethylene glycol monoethyl ether, diethylene glycol monohexyl ether, triethylene glycol monomethyl ether, propylene glycol monoethyl ether, propylene glycol monomethyl ether, polyethylene glycol monomethyl ether, polypropylene glycol, tetraethylene glycol, ethylene glycol monobutyl ether, ethylene glycol monobenzyl ether, ethylene glycol monophenyl ether, methylphenylcarbinol, n-amyl alcohol, or methylamyl alcohol), a ketone (e.g. acetone, methyl ethyl ketone, ethyl butyl ketone, methyl isobutyl ketone, or cyclohexanone), an ester (e.g. ethyl acetate, propyl acetate, butyl acetate, amyl acetate, benzyl acetate, methyl lactate, butyl lactate, ethylene glycol monobutyl acetate, propylene glycol monomethyl ether acetate, diethylene glycol acetate, diethyl phthalate, or butyl levulinate), and others (e.g. triethyl phosphate, tricresyl phosphate, N-phenylethanolamine, or N-phenyldiethanolamine).

Furthermore, when the organic solvent is insoluble in water, it may be employed by being solubilized in water using a surfactant, etc. In the case where the developer contains an organic solvent, the concentration of the organic solvent is preferably less than 40 wt % from the viewpoint of safety and inflammability.

As the inorganic acid and an inorganic salt, for example, phosphoric acid, metaphosphoric acid, monoammonium phosphate, diammonium phosphate, monosodium phosphate, disodium phosphate, monopotassium phosphate, dipotassium phosphate, sodium tripolyphosphate, potassium pyrophosphate, sodium hexametaphosphate, magnesium nitrate, sodium nitrate, potassium nitrate, ammonium nitrate, sodium sulfate, potassium sulfate, ammonium sulfate, sodium sulfite, ammonium sulfite, sodium hydrogen sulfate, and nickel sulfate can be cited.

The content of the inorganic salt is preferably 0.01 to 0.5 wt % relative to the total weight of the developer.

The developer that can be used in the present invention preferably contains a water-soluble polymer (also called a 'water-soluble resin').

The water-soluble resin that can be contained in the developer includes, for example, soybean polysaccharide, modified starch, gum Arabic, dextrin, a cellulose derivative (for example, carboxymethylcellulose, carboxyethylcellulose or methylcellulose) or a modified product thereof, pullulan, polyvinyl alcohol or a derivative thereof, polyvinylpyrrolidone, polyacrylamide, an acrylamide copolymer, a vinyl methyl ether/maleic anhydride copolymer, a vinyl acetate/maleic anhydride copolymer, and a styrene/maleic anhydride copolymer.

Furthermore, the acid value of the water-soluble resin is preferably 0 to 3.0 meq/g.

As the soybean polysaccharide, those conventionally known may be used. For example, as a commercial product, Soyafibe (Fuji Oil Co., Ltd.) is available, and various product grades can be used. The soybean polysaccharide preferably used has a viscosity in the range of 10 to 100 mPa/sec in a 10 wt % aqueous solution thereof.

As the modified starch, there is, for example, one represented by Formula (III) below. As the starch represented by Formula (III), any starch from corn, potato, tapioca, rice, wheat, etc. may be used. Modification of these starches may be carried out by, for example, a method in which they are decomposed with, for example, an acid or an enzyme to the extent that the number of glucose residues per molecule is from 5 to 30 and then oxypropylene is added thereto in an alkali.

(III)

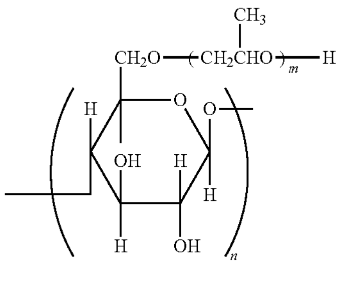

In Formula (III), the degree of etherification (degree of substitution) is in the range of 0.05 to 1.2 per glucose unit, n denotes an integer of 3 to 30, and m denotes an integer of 1 to 3.

Examples of modified starch and derivatives thereof include roasted starch such as British gum, enzymatically-modified dextrin such as enzyme dextrin and Shardinger dextrin, oxidized starch such as solubilized starch, pregelatinized starch such as modified pregelatinized starch and unmodified pregelatinized starch, esterified starch such as starch phosphate, fatty starch, starch sulfate, starch nitrate, starch xanthate, and starch carbamate, etherified starch such as carboxyalkyl starch, hydroxyalkyl starch, sulfoalkyl starch, cyanoethyl starch, allyl starch, benzyl starch, carbamylethyl starch, and dialkylamino starch, crosslinked starch such as methylol-crosslinked starch, hydroxyalkyl-crosslinked starch, phosphoric acid-crosslinked starch, and dicarboxylic acid-crosslinked starch, and starch graft polymers such as starch polyacrylamide copolymer, starch polyacrylic acid copolymer, starch polyvinyl acetate copolymer, starch polyacrylonitrile copolymer, cationic starch polyacrylic acid ester copolymer, cationic starch vinyl polymer copolymer, starch polystyrene maleic acid copolymer, starch polyethylene oxide copolymer, and starch polypropylene copolymer.

Among the water-soluble resins, soybean polysaccharide, modified starch, gum Arabic, dextrin, carboxymethylcellulose, polyvinyl alcohol, etc. are preferable. The water-soluble resin may be used in a combination of two or more types. The content of the water-soluble resin in the processing liquid is preferably 0.1 to 20 wt %, and more preferably 0.5 to 10 wt %.

The development temperature is preferably no greater than 60° C., and more preferably on the order of 15° C. to 40° C. In development processing using an automatic processor, since the developer might be exhausted depending on the amount processed, the processing performance may be recovered by use of a replenisher or fresh developer.

After the development step is carried out, the developer may be dried by natural drying, but it is preferable to provide a drying step employing hot air, etc.

In the process for producing a lithographic printing plate of the present invention, the entire surface may be heated from exposure to development as necessary. By heating in this way, an image-forming reaction in the image recording layer is accelerated and advantages in terms of, for example, improvement in sensitivity and plate life and stabilization of sensitivity are achieved.

Heating conditions may be appropriately set within a range that exhibits these effects.

As heating means, a commonly used convection oven, IR irradiator, IR laser, microwave device, Wisconsin oven, etc. can be cited. It may be carried out by holding the plate at a surface temperature of 70° C. to 150° C. for 1 sec to 5 min, preferably at 80° C. to 140° C. for 5 sec to 1 min, and more preferably at 90° C. to 130° C. for 10 to 30 sec. It is preferable for the conditions to be in these ranges since the above-mentioned effects can be obtained efficiently and adverse effects such as deformation of the printing plate due to heat can be prevented.

Heating means used in the heating treatment is preferably connected to a plate setter used in the exposure step and a developing machine used in the development step, thus carrying out automatic continuous processing. Specific examples thereof include a plate making line in which a plate setter and a developing machine are connected via transport means such as a conveyor. The heating means may be placed between the plate setter and the developing machine, or the heating means and the developing machine may be integrated.

When a lithographic printing plate precursor used is susceptible to ambient light in the operating environment, the above-mentioned plate making line is preferably shielded from light by a filter or a cover.

The printing plate after development may be subjected to overall exposure using actinic radiation such as UV rays so as to promote curing of an image area. Examples of a light source used for overall exposure include a carbon arc lamp, a mercury lamp, a gallium lamp, a metal halide lamp, a xenon lamp, a tungsten lamp, and various types of laser light. In order to obtain sufficient plate life, the exposure is preferably at least 10 mJ/cm$^2$, and more preferably at least 100 mJ/cm$^2$.

Heating may be carried out at the same time as overall exposure, and it is observed that plate life is further improved by heating. As a heating device, a commonly used convection oven, IR irradiator, IR laser, microwave device, Wisconsin oven, etc. can be cited.

In this process, the plate surface temperature is preferably 30° C. to 150° C., more preferably 35° C. to 130° C., and yet more preferably 40° C. to 120° C. Specifically, a method described in JP-A-2000-89478 may be utilized.

Furthermore, for the purpose of improving plate life, etc., the printing plate after development may be heated under very severe conditions. The heating temperature is preferably in the range of 200° C. to 500° C. When in the above-mentioned range, a sufficient image strengthening effect is obtained, and it is possible to prevent occurrence of problems such as degradation of a support or thermal decomposition of an image area.

The lithographic printing plate thus obtained is set in an offset printer, and used for printing of a large number of sheets.

In accordance with the present invention, there can be provided a lithographic printing plate precursor that has excellent halftone dot reproduction and that suppresses the formation of development residue in a developer during development, and a process for producing a lithographic printing plate.

EXAMPLES

The present invention is explained below by way of Examples, but the present invention should not be construed as being limited thereto.

Examples 1 to 38 and Comparative Examples 1 to 3

Preparation of Support

A 0.03 mm thick aluminum plate (JIS A1050) was subjected to the surface treatment below.

(a) Mechanical Roughening Treatment

The surface of the aluminum plate was subjected to a mechanical roughening treatment by means of a rotating roll-shaped nylon brush while supplying a suspension of an abrasive (pumice) having a specific gravity of 1.12 in water as an abrasive slurry to the surface of the aluminum plate. The abrasive had an average particle size of 30 μm and a maximum particle size of 100 μm. The material of the nylon brush was nylon 6,10, the bristle length was 45 mm, and the diameter of the bristles was 0.3 mm. The nylon brush was formed by making holes in a stainless steel tube having a diameter of 300 mm and densely implanting the bristles. Three rotating brushes were used. The distance of two support rollers (ϕ 200 mm) below the brush was 300 mm. The brush rollers were pressed against the aluminum plate so that the load on a drive motor for rotating the brushes increased by 7 kW from the load before pressing the brush rollers. The direction of rotation of the brushes was the same as the direction in which the aluminum plate moved. The rotational speed of the brushes was 200 rpm.

(b) Alkali Etching Treatment

The aluminum plate was subjected to an etching treatment by spraying an aqueous solution (sodium hydroxide concentration 2.6 wt %, aluminum ion concentration 6.5 wt %) at 70° C. so as to dissolve 10 g/m$^2$ of the aluminum plate. Subsequently, washing with water was carried out by means of a spray.

(c) Desmutting Treatment

A desmutting treatment was carried out by means of a spray using an aqueous solution having a nitric acid concentration of 1 wt % and a temperature of 30° C. (containing 0.5 wt % of aluminum ion), and following this washing with water was carried out by means of a spray. The aqueous solution of nitric acid used in the desmutting treatment employed liquid waste from a step involving carrying out the electrochemical roughening treatment using alternating current in an aqueous solution of nitric acid, which is described below.

(d) Electrochemical Surface Roughening Treatment

A consecutive electrochemical surface roughening treatment was carried out using an AC voltage of 60 Hz. An electrolytic liquid used here was a 10.5 g/L aqueous solution of nitric acid (containing 5 g/L of aluminum ion and 0.007 wt % of ammonium ion) at a liquid temperature of 50° C. The electrochemical surface roughening treatment was carried out using a trapezoidal rectangular wave alternating current having a duty ratio of 1:1 and a time TP from zero to peak current value of 0.8 msec, with a carbon electrode as the counter electrode. Ferrite was used as an auxiliary anode. The electrolytic vessel used was of a radial cell type. The current density was 30 A/dm$^2$ as a peak current value, and the quantity of electricity as a total quantity of electricity when the aluminum plate was the anode was 220 C/dm$^2$. 5% of the current flowing from the power source was diverted to the auxiliary anode. Subsequently, washing with water was carried out by means of a spray.

(e) Alkali Etching Treatment

The aluminum plate was subjected to an etching treatment at 32° C. by means of a spray with an aqueous solution having a sodium hydroxide concentration of 26 wt % and an aluminum ion concentration of 6.5 wt % so as to dissolve 0.50 g/m$^2$ of the aluminum plate, remove a smut component containing aluminum hydroxide as a main component formed in the previous stage when carrying out the electrochemical roughening treatment using alternating current, and dissolve an edge portion of a pit formed to thus make the edge portion smooth. Subsequently, washing with water was carried out by means of a spray.

(f) Desmutting Treatment

A desmutting treatment was carried out by means of a spray using an aqueous solution having a sulfuric acid concentration of 15 wt % and a temperature of 30° C. (containing 4.5 wt % of aluminum ion), and following this washing with water was carried out by means of a spray. The aqueous solution of sulfuric acid used in the desmutting treatment employed liquid waste from the step involving carrying out the electrochemical roughening treatment using alternating current in an aqueous solution of sulfuric acid.

(g) Electrochemical Surface Roughening Treatment

A consecutive electrochemical surface roughening treatment was carried out using an AC voltage of 60 Hz. An electrolytic liquid used here was a 5.0 g/L aqueous solution of hydrochloric acid (containing 5 g/L of aluminum ion) at a liquid temperature of 35° C. The electrochemical surface roughening treatment was carried out using a trapezoidal rectangular wave alternating current having a duty ratio of 1:1 and a time TP from zero to peak current value of 0.8 msec, with a carbon electrode as the counter electrode. Ferrite was used as an auxiliary anode. The electrolytic vessel used was of a radial cell type. The current density was 25 A/dm$^2$ as a peak current value, and the quantity of electricity as a total quantity of electricity when the aluminum plate was the anode was 50 C/dm$^2$. Following this, washing with water was carried out by means of a spray.

(h) Anodizing Treatment

An anodizing treatment was carried out using a two-stage power supply electrolytic method anodizing system (first and second electrolysis section lengths 6 m each, first and second power supply section lengths 3 m each, first and second power supply electrode section lengths 2.4 m each). As electrolytic liquids supplied to the first and second electrolysis sections, both had a sulfuric acid concentration of 50 g/L (containing 0.5 wt % aluminum ion) and a temperature of 20° C. Subsequently, washing with water was carried out by means of a spray. The final amount of oxidized film was 2.7 g/m$^2$.

An aluminum plate that had been subjected to all of steps (a) to (h) above was defined as support 1, an aluminum plate that had been subjected only to steps (d) to (h) was defined as support 2, and an aluminum plate that had been subjected only to steps (d) to (f) and (h) was defined as support 3. When the center line average roughness (as Ra in accordance with JIS B0601) of each support was measured using a stylus having a diameter of 2 μm, support 1 was 0.52 μm, support 2 was 0.28 μm, and support 3 was 0.25 μm.

Furthermore, supports 1 to 3 were immersed in an aqueous solution containing 4 g/L of polyvinylphosphonic acid at 40° C. for 10 sec, washed with tap water at 20° C. for 2 sec, and dried, thus preparing supports 4 to 6 having an undercoat layer applied thereto.

Formation of Photosensitive Layer and Protective Layer

The aluminum support having the undercoat layer applied thereto was bar-coated with photosensitive layer coating liquid 1 having the composition below and dried in an oven at 70° C. for 60 sec, thus forming a photosensitive layer with a dry coat weight of 1.1 g/m$^2$, and protective layer coating liquid 1 having the composition below was applied thereonto by means of a bar coater so as to give a dry coat weight of 1.25 g/m$^2$ and dried at 125° C. for 70 sec, thus forming a protective layer and thereby giving a lithographic printing plate precursor.

Photosensitive Layer Coating Liquid 1

| | |
|---|---|
| Binder polymer (B-1) | 0.52 parts by weight |
| Ethylenically unsaturated bond-containing compound (compound example in Table 9) | x parts by weight |
| Ethylenically unsaturated bond-containing compound (M-1) | (0.50 − x) parts by weight |
| Radical polymerization initiator (I-1) | 0.08 parts by weight |
| Sensitizing dye (D-1) | 0.06 parts by weight |
| Chain transfer agent (S-2) | 0.07 parts by weight |
| ε-Phthalocyanine pigment dispersion | 0.40 parts by weight |
| (pigment: 15 parts by weight, allyl methacrylate/methacrylic acid copolymer (Mw = 50,000, molar ratio of allyl methacrylate/methacrylic acid = 80/20): 10 parts by weight as dispersant, cyclohexanone/methoxypropyl acetate/1-methoxy-2-propanol = 15 parts by weight/20 parts by weight/40 parts by weight as solvent) | |
| Thermal polymerization inhibitor | 0.01 parts by weight |
| (N-Nitrosophenylhydroxylamine aluminum salt) | |
| Fluorine-based surfactant (1) above | 0.001 parts by weight |
| (Megafac F-780-F, Dai-Nippon Ink & Chemicals,Inc., methyl isobutyl ketone (MIBK) 30 wt % solution) | |
| Polyoxyethylene-polyoxypropylene condensate | 0.04 parts by weight |
| (Pluronic L44, ADEKA Corp.) | |
| 1-Methoxy-2-propanol | 3.5 parts by weight |
| Methyl ethyl ketone | 8.0 parts by weight |

(B-1)

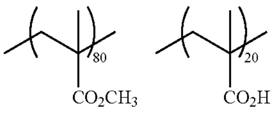

Mw = 50,000

(M-1)

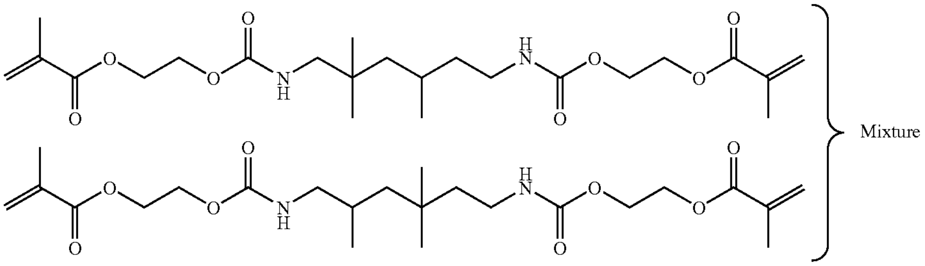

(S-2)

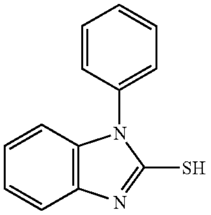

-continued (D-1)

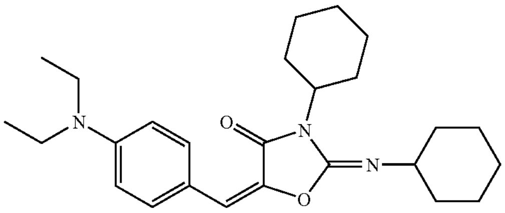

(I-1)

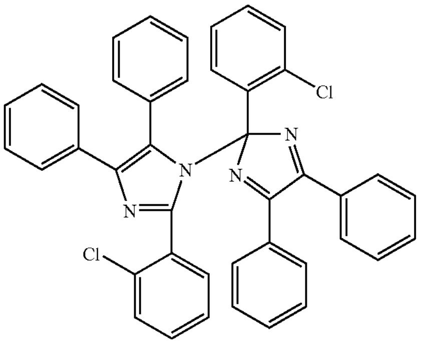

Protective Layer Coating Liquid

| | |
|---|---|
| Mica dispersion below | 0.6 parts by weight |
| Sulfonic acid-modified polyvinyl alcohol (GOHSERAN CKS-50, The Nippon Synthetic Chemical Industry Co., Ltd. (degree of saponification: 99 mol %, average degree of polymerization: 300, degree of modification: about 0.4 mol %) | 0.8 parts by weight |
| Poly(vinylpyrrolidone/vinyl acetate (1/1)) (molecular weight: 70,000) | 0.001 parts by weight |
| Surfactant (Emalex 710, Nihon-Emulsion Co., Ltd.) | 0.002 parts by weight |
| Water | 13 parts by weight |

Preparation of Mica Dispersion 32 parts of synthetic mica ('SOMASIF ME-100': CO-OP Chemical Co., Ltd.; aspect ratio: 1,000 or greater) was added to 368 parts of water and dispersed using a homogenizer until the average particle size (laser scattering method) became 0.5 μm, thus giving a mica dispersion.

Exposure, Development, and Printing

Each of the lithographic printing plate precursors above was imagewise exposed using a Violet semiconductor laser plate setter Vx9600 (equipped with an InGaN semiconductor laser, emission wavelength: 405 nm±10 nm/output: 30 mW, FUJIFILM Electronic Imaging, Ltd. (FFEI)). An image was drawn using an FM screen (TAFFETA 20, Fujifilm Corporation) with a plate surface exposure of 0.05 mJ/cm$^2$ at a resolution of 2,438 dpi so that the halftone dot area percentage was 50%.

Subsequently, after pre-heating was carried out at 100° C. for 30 sec, development processing was carried out in an automatic development processor having the type of structure shown in FIG. 1 using each of the developers having the compositions below. The automatic development processor had one brush roller having an outer diameter of 50 mm and having implanted therein fibers of polybutylene terephthalate (bristle diameter: 200 μm, bristle length: 17 mm), and the brush roller was rotated at 200 rpm in the same direction as the transport direction (peripheral speed at brush tip: 0.52 m/sec). The processing liquid temperature was 30° C. Transport of the lithographic printing plate precursor was carried out at a transport speed of 100 cm/min. After development processing, drying was carried out in a drying section. The drying temperature was 80° C.

The compositions of developers 1 to 8 used in the Examples and Comparative Examples are shown in Tables 1 to 8 below. Newcol B13 (Nippon Nyukazai Co., Ltd.) is a polyoxyethylene β-naphthyl ether (average oxyethylene number n=13), and the gum Arabic used was one having a weight-average molecular weight of 200,000.

TABLE 1

| (Developer 1; pH = 9.80) | |
|---|---|
| 0.2 M Boric acid aqueous solution | 25.00 parts by weight |
| 0.2 M Potassium chloride aqueous solution | 25.00 parts by weight |
| 0.1 M Sodium hydroxide aqueous solution | 40.60 parts by weight |
| Water | 9.40 parts by weight |
| Newcol B13 (Nippon Nyukazai Co., Ltd.) | 5.00 parts by weight |
| Gum Arabic | 2.50 parts by weight |
| Hydroxyalkylated starch (Nippon Starch Chemical Co., Ltd: Penon JE-66) | 7.00 parts by weight |

TABLE 2

| (Developer 2; pH = 9.80) | |
|---|---|
| 0.2 M Glycine aqueous solution | 25.00 parts by weight |
| 0.2 M Sodium hydroxide aqueous solution | 13.60 parts by weight |
| Water | 62.4 parts by weight |
| Newcol B13 (Nippon Nyukazai Co., Ltd.) | 5.00 parts by weight |
| Gum Arabic | 2.50 parts by weight |
| Hydroxyalkylated starch (Nippon Starch Chemical Co., Ltd: Penon JE-66) | 7.00 parts by weight |

TABLE 3

| (Developer 3; pH = 9.80) | |
|---|---|
| 0.1 M Sodium carbonate decahydrate aqueous solution | 60.00 parts by weight |
| 0.1 M Sodium hydrogen carbonate aqueous solution | 40.00 parts by weight |
| Newcol B13 (Nippon Nyukazai Co., Ltd.) | 5.00 parts by weight |
| Gum Arabic | 2.50 parts by weight |
| Hydroxyalkylated starch (Nippon Starch Chemical Co., Ltd: Penon JE-66) | 7.00 parts by weight |

TABLE 4

| (Developer 4; pH = 9.80) | |
|---|---|
| 0.05 M Sodium hydrogen carbonate aqueous solution | 50.00 parts by weight |
| 0.1 M Sodium hydroxide aqueous solution | 7.60 parts by weight |
| Water | 42.4 parts by weight |
| Newcol B13 (Nippon Nyukazai Co., Ltd.) | 5.00 parts by weight |
| Gum Arabic | 2.50 parts by weight |
| Hydroxyalkylated starch (Nippon Starch Chemical Co., Ltd: Penon JE-66) | 7.00 parts by weight |

TABLE 5

| (Developer 5; pH = 9.80) | |
|---|---|
| 0.02 M Piperazine dihydrochloride aqueous solution | 50 parts by weight |
| 0.02 M Glycylglycine aqueous solution | 50 parts by weight |
| 1 M Sodium hydroxide aqueous solution | 2.59 parts by weight |
| Newcol B13 (Nippon Nyukazai Co., Ltd.) | 5.00 parts by weight |
| Gum Arabic | 2.50 parts by weight |
| Hydroxyalkylated starch (Nippon Starch Chemical Co., Ltd: Penon JE-66) | 7.00 parts by weight |

TABLE 6

| (Developer 6; pH = 9.80) | |
|---|---|
| 0.20 M Diethanolamine aqueous solution | 25 parts by weight |
| 0.20 M Hydrochloric acid aqueous solution | 2.87 parts by weight |
| Water | 72.13 parts by weight |
| Newcol B13 (Nippon Nyukazai Co., Ltd.) | 5.00 parts by weight |
| Gum Arabic | 2.50 parts by weight |
| Hydroxyalkylated starch (Nippon Starch Chemical Co., Ltd: Penon JE-66) | 7.00 parts by weight |

TABLE 7

| (Developer 7; pH = 11.0) | |
|---|---|
| Sodium carbonate monohydrate | 3.00 parts by weight |
| Water | 97.00 parts by weight |
| Newcol B13 (Nippon Nyukazai Co., Ltd.) | 5.00 parts by weight |
| Gum Arabic | 2.50 parts by weight |
| Hydroxyalkylated starch (Nippon Starch Chemical Co., Ltd: Penon JE-66) | 7.00 parts by weight |

TABLE 8

| (Developer 8; pH = 12.0) | |
|---|---|
| Potassium hydroxide | 0.20 parts by weight |
| Water | 93.00 parts by weight |
| Newcol B13 (Nippon Nyukazai Co., Ltd.) | 5.00 parts by weight |
| Gum Arabic | 2.50 parts by weight |
| Hydroxyalkylated starch (Nippon Starch Chemical Co., Ltd: Penon JE-66) | 7.00 parts by weight |

The lithographic printing plate thus obtained was mounted on a SOR-M printing machine (Heidelberg), and printing was carried out at a printing speed of 6,000 sheets per hour using dampening water (EU-3 (etching liquid, Fujifilm Corporation))/water/isopropyl alcohol=1/89/10 (ratio by volume)) and TRANS-G(N) black ink (Dai-Nippon Ink & Chemicals, Inc.).

Evaluation

Developability, sensitivity, plate life, development residue, and halftone dot reproduction were evaluated as follows using the lithographic printing plates obtained.

Developability

Development was carried out at various transport speeds as described above, and the cyan density of a non-image area was measured using a Macbeth densitometer. The transport speed at which the cyan density of a non-image area became the same as the cyan density of an aluminum substrate was determined and defined as the developability. Evaluation of developability was expressed as a relative developability, defined below, with Comparative Example 1 as a reference (1.0). The larger the value of the relative developability, the higher the developability and the better the performance. There is not a problem in practical use at all if the value of the relative developability is at least 0.9.

Relative developability=(transport speed of target sensitive material)/(transport speed of reference sensitive material)

Sensitivity 100 sheets were printed as described above, and after confirming that a printed material free from ink staining in a non-image area was obtained, 500 sheets were subsequently printed. The 600th sheet of the total printed material was used, and the exposure that gave uniform ink density in an image area was determined and defined as the sensitivity. Evaluation of sensitivity was expressed as a relative sensitivity, defined below, with Comparative Example 1 as a reference (1.0). The larger the value of the relative sensitivity, the higher the sensitivity and the better the performance. There is not a problem in practical use at all if the value of the relative sensitivity is at least 0.7.

Relative sensitivity=(sensitivity of reference sensitive material/sensitivity of target sensitive material)

Plate Life

Since as the number of prints increases the photosensitive layer is gradually abraded and the ink receiving properties are degraded, the ink density on the printing sheet decreases. For printing plates that had been exposed with the same exposure, the plate life was evaluated using the number of sheets printed before the ink density (reflection density) decreased by 0.1 from that when printing started. Evaluation of plate life was expressed as a relative plate life, defined below, with Comparative Example 1 as a reference (1.0). The larger the value of the relative plate life, the higher the plate life. There is not a problem in practical use at all if the value of the relative plate life is at least 0.7.

Relative plate life=(plate life of target sensitive material/plate life of reference sensitive material)

Development Residue 0.4 g of the photosensitive layer, or when there was a protective layer the photosensitive layer and the protective layer in total, was scraped off from the lithographic printing plate precursor and dispersed in 10 mL of developer (amount of photosensitive layer (and protective layer) dissolved per L when development processing 20 $m^2$ lithographic printing plate precursor), and a residue in the developer was visually examined when stored at 30° C. for 1 week. When a uniform dispersion was obtained it was evaluated as 'excellent', when it was inferior to 'excellent' but there were no problems in practice it was evaluated as 'good', when a cloudy component was observed but there were no problems in practice it was evaluated as 'fair', and when there was precipitation it was evaluated as 'poor'.

Halftone Dot Reproduction 1,000 sheets were printed as described above; a change in halftone dot area on the lithographic printing plate between that before and that after printing of less than 1% was evaluated as 'good', when it was at least 1% but less than 2% it was evaluated as 'fair', and when it was 2% or greater it was evaluated as 'poor'. There is not a problem in practical use at all if the change in halftone dot area on the lithographic printing plate between that before and that after printing of less than 2%.

Evaluation results for Examples 1 to 38 and Comparative Examples 1 to 3 are given in Table 9 below.

As shown in Table 9, by introducing the specific ethylenically unsaturated compound into the photosensitive layer, development residue could be improved while maintaining sensitivity and plate life. Furthermore, halftone dot reproduction could be improved.

It has also been found that from the viewpoint of sensitivity and plate life, a methacryloyl group (group represented by Formula (A)) is most preferable and, moreover, from the viewpoint of sensitivity and plate life, a compound containing a urethane skeleton in the molecule is preferable.

Comparing Example 37 and Example 10, it was better from the viewpoint of halftone dot reproduction for a developer having buffering capacity to be used.

Examples 39 to 76 and Comparative Examples 4 to 6

Preparation of Support

A support was prepared in the same manner as in Example 1.

Formation of Photosensitive Layer

The aluminum support having the undercoat layer applied thereto was bar-coated with photosensitive layer coating liquid 2 having the composition below and dried in an oven at 90° C. for 60 sec, thus forming a photosensitive layer with a

TABLE 9

| | Ethylenically Unsaturated Compound | Amount Added (Parts By Weight) | Developer | Developability | Sensitivity | Plate Life | Development Residue | Halftone Dot Reproduction |
|---|---|---|---|---|---|---|---|---|
| Example 1 | (1) | 0.50 | Developer 3 | 1.2 | 0.9 | 0.7 | Good | Good |
| Example 2 | (2) | 0.50 | Developer 3 | 1.2 | 1.1 | 0.8 | Good | Good |
| Example 3 | (24) | 0.50 | Developer 3 | 1.4 | 1.0 | 0.8 | Good | Good |
| Example 4 | (27) | 0.50 | Developer 3 | 1.3 | 1.0 | 1.0 | Excellent | Good |
| Example 5 | (29) | 0.50 | Developer 1 | 1.3 | 1.0 | 1.2 | Excellent | Good |
| Example 6 | (29) | 0.50 | Developer 2 | 1.3 | 0.9 | 1.2 | Excellent | Good |
| Example 7 | (29) | 0.10 | Developer 3 | 1.1 | 1.1 | 1.3 | Fair | Fair |
| Example 8 | (29) | 0.20 | Developer 3 | 1.2 | 1.1 | 1.3 | Good | Fair |
| Example 9 | (29) | 0.40 | Developer 3 | 1.3 | 1.1 | 1.3 | Excellent | Good |
| Example 10 | (29) | 0.50 | Developer 3 | 1.4 | 1.0 | 1.3 | Excellent | Good |
| Example 11 | (29) | 0.50 | Developer 4 | 1.4 | 1.0 | 1.3 | Excellent | Good |
| Example 12 | (29) | 0.50 | Developer 5 | 1.4 | 1.0 | 1.2 | Excellent | Good |
| Example 13 | (29) | 0.50 | Developer 6 | 1.3 | 1.0 | 1.1 | Excellent | Good |
| Example 14 | (34) | 0.50 | Developer 3 | 1.2 | 1.1 | 1.1 | Good | Fair |
| Example 15 | (42) | 0.50 | Developer 3 | 1.2 | 1.1 | 1.2 | Excellent | Good |
| Example 16 | (47) | 0.50 | Developer 3 | 1.6 | 1.0 | 1.3 | Excellent | Good |
| Example 17 | (50) | 0.50 | Developer 3 | 1.6 | 1.1 | 1.3 | Excellent | Good |
| Example 18 | (51) | 0.50 | Developer 3 | 1.6 | 1.1 | 1.3 | Excellent | Good |
| Example 19 | (58) | 0.50 | Developer 3 | 1.3 | 1.2 | 1.2 | Excellent | Good |
| Example 20 | (63) | 0.50 | Developer 3 | 1.6 | 1.1 | 1.2 | Excellent | Good |
| Example 21 | (66) | 0.50 | Developer 3 | 1.6 | 1.0 | 1.3 | Excellent | Good |
| Example 22 | (67) | 0.50 | Developer 3 | 1.6 | 1.1 | 1.3 | Excellent | Good |
| Example 23 | (71) | 0.50 | Developer 3 | 1.2 | 1.1 | 1.3 | Good | Good |
| Example 24 | (72) | 0.50 | Developer 3 | 1.2 | 1.1 | 1.2 | Excellent | Good |
| Example 25 | (73) | 0.50 | Developer 3 | 1.3 | 1.3 | 1.4 | Good | Good |
| Example 26 | (75) | 0.50 | Developer 3 | 1.3 | 1.3 | 1.4 | Good | Good |
| Example 27 | (76) | 0.50 | Developer 3 | 1.2 | 1.3 | 1.4 | Good | Good |
| Example 28 | (79) | 0.50 | Developer 3 | 1.2 | 1.1 | 1.3 | Excellent | Good |
| Example 29 | (81) | 0.50 | Developer 3 | 1.2 | 0.8 | 0.8 | Excellent | Fair |
| Example 30 | (83) | 0.50 | Developer 3 | 1.2 | 0.7 | 0.7 | Excellent | Fair |
| Example 31 | (89) | 0.50 | Developer 3 | 1.2 | 0.7 | 0.7 | Excellent | Fair |
| Example 32 | (92) | 0.50 | Developer 3 | 1.5 | 1.0 | 1.4 | Excellent | Good |
| Example 33 | (93) | 0.50 | Developer 3 | 1.5 | 1.0 | 1.4 | Excellent | Good |
| Example 34 | (94) | 0.50 | Developer 3 | 1.6 | 0.8 | 1.0 | Excellent | Good |
| Example 35 | (95) | 0.50 | Developer 3 | 1.3 | 1.1 | 1.4 | Excellent | Good |
| Example 36 | (96) | 0.50 | Developer 3 | 1.3 | 1.1 | 1.4 | Excellent | Good |
| Comp. Ex. 1 | None | 0.00 | Developer 1 | 1.0 | 1.0 | 1.0 | Poor | Poor |
| Comp. Ex. 2 | None | 0.00 | Developer 3 | 1.0 | 1.1 | 1.1 | Poor | Poor |
| Comp. Ex. 3 | None | 0.00 | Developer 5 | 1.0 | 1.1 | 1.1 | Poor | Poor |
| Example 37 | (29) | 0.50 | Developer 7 | 0.9 | 1.0 | 1.2 | Good | Fair |
| Example 38 | (29) | 0.50 | Developer 8 | 1.4 | 1.0 | 1.0 | Excellent | Good |

dry coat weight of 1.1 $g/m^2$, and the protective layer coating liquid 1 above was applied thereonto by means of a bar coater so as to give a dry coat weight of 0.75 $g/m^2$ and dried at 125° C. for 70 sec, thus forming a protective layer and thereby giving a lithographic printing plate precursor.

Photosensitive Layer Coating Liquid 2

| | |
|---|---|
| Binder polymer (B-2) (Mw = 120,000) | 0.52 parts by weight |
| Ethylenically unsaturated bond-containing compound (compound example in Table 10) | x parts by weight |
| Ethylenically unsaturated bond-containing compound (M-1) | (0.50 − x) parts by weight |
| Radical polymerization initiator (I-1) | 0.08 parts by weight |
| Sensitizing dye (D-1) | 0.06 parts by weight |
| Chain transfer agent (S-2) | 0.07 parts by weight |
| ϵ-Phthalocyanine pigment dispersion (pigment: 15 parts by weight, allyl methacrylate/methacrylic acid copolymer (Mw = 50,000, molar ratio of allyl methacrylate/methacrylic acid = 80/20): 10 parts by weight as dispersant, cyclohexanone/methoxypropyl acetate/1-methoxy-2-propanol = 15 parts by weight/20 parts by weight/40 parts by weight as solvent) | 0.40 parts by weight |
| Thermal polymerization inhibitor (N-Nitrosophenylhydroxylamine aluminum salt) | 0.01 parts by weight |
| Fluorine-based surfactant (Megafac F-780-F, Dai-Nippon Ink & Chemicals,Inc., methyl isobutyl ketone (MIBK) 30 wt % solution) | 0.001 parts by weight |
| Polyoxyethylene-polyoxypropylene condensate (Pluronic L44, ADEKA Corp.) | 0.04 parts by weight |
| 1-Methoxy-2-propanol | 3.5 parts by weight |
| Methyl ethyl ketone | 8.0 parts by weight |

(B-2)

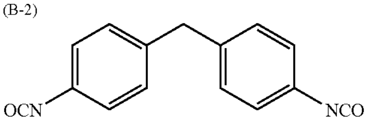

40 mol %

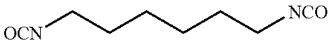

10 mol %

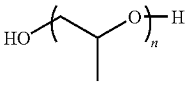

PPG1000
Mn = 1,000
15 mol %

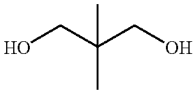

25 mol %

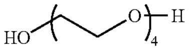

10 mol %

Reaction product of these compounds Mw = 60,000

The photosensitive layer components other than binder polymer (B-2) were the same as in Example 1.

Formation of Protective Layer

A protective layer was prepared by the same method as in Example 1.

Exposure, Development, and Printing

Exposure, development, and printing were carried out in the same manner as in Example 1.

Evaluation

Developability, sensitivity, plate life, development residue, and halftone dot reproduction were evaluated using the lithographic printing plate obtained in the same manner as in Example 1.

Evaluation results for Examples 39 to 76 and Comparative Examples 4 to 6 are given in Table 10 below.

TABLE 10

| | Ethylenically Unsaturated Compound | Amount Added (Parts By Weight) | Developer | Develop-ability | Sensi-tivity | Plate Life | Development Residue | Halftone Dot Reproduction |
|---|---|---|---|---|---|---|---|---|
| Example 39 | (1) | 0.50 | Developer 3 | 1.1 | 0.9 | 0.7 | Good | Good |
| Example 40 | (2) | 0.50 | Developer 3 | 1.1 | 1.1 | 0.8 | Good | Good |
| Example 41 | (25) | 0.50 | Developer 3 | 1.2 | 1.1 | 1.0 | Good | Good |
| Example 42 | (27) | 0.50 | Developer 3 | 1.2 | 1.0 | 1.0 | Excellent | Good |
| Example 43 | (29) | 0.50 | Developer 1 | 1.2 | 1.0 | 1.2 | Excellent | Good |

TABLE 10-continued

| | Ethylenically Unsaturated Compound | Amount Added (Parts By Weight) | Developer | Develop-ability | Sensi-tivity | Plate Life | Development Residue | Halftone Dot Reproduction |
|---|---|---|---|---|---|---|---|---|
| Example 44 | (29) | 0.50 | Developer 2 | 1.2 | 0.9 | 1.2 | Excellent | Good |
| Example 45 | (29) | 0.10 | Developer 3 | 1.0 | 1.1 | 1.3 | Fair | Fair |
| Example 46 | (29) | 0.20 | Developer 3 | 1.1 | 1.1 | 1.3 | Good | Fair |
| Example 47 | (29) | 0.40 | Developer 3 | 1.2 | 1.1 | 1.3 | Excellent | Good |
| Example 48 | (29) | 0.50 | Developer 3 | 1.3 | 1.0 | 1.3 | Excellent | Good |
| Example 49 | (29) | 0.50 | Developer 4 | 1.3 | 1.0 | 1.3 | Excellent | Good |
| Example 50 | (29) | 0.50 | Developer 5 | 1.3 | 1.0 | 1.2 | Excellent | Good |
| Example 51 | (29) | 0.50 | Developer 6 | 1.2 | 1.0 | 1.1 | Excellent | Good |
| Example 52 | (35) | 0.50 | Developer 3 | 1.1 | 1.1 | 1.1 | Good | Fair |
| Example 53 | (39) | 0.50 | Developer 3 | 1.1 | 1.1 | 1.1 | Excellent | Good |
| Example 54 | (46) | 0.50 | Developer 3 | 1.5 | 1.0 | 1.3 | Excellent | Good |
| Example 55 | (49) | 0.50 | Developer 3 | 1.4 | 1.1 | 1.3 | Excellent | Good |
| Example 56 | (53) | 0.50 | Developer 3 | 1.3 | 1.1 | 1.3 | Excellent | Good |
| Example 57 | (58) | 0.50 | Developer 3 | 1.2 | 1.2 | 1.2 | Excellent | Good |
| Example 58 | (65) | 0.50 | Developer 3 | 1.3 | 1.1 | 1.2 | Excellent | Good |
| Example 59 | (69) | 0.50 | Developer 3 | 1.2 | 1.0 | 1.3 | Excellent | Good |
| Example 60 | (70) | 0.50 | Developer 3 | 1.2 | 1.1 | 1.3 | Excellent | Good |
| Example 61 | (71) | 0.50 | Developer 3 | 1.1 | 1.1 | 1.3 | Good | Good |
| Example 62 | (72) | 0.50 | Developer 3 | 1.1 | 1.1 | 1.2 | Excellent | Good |
| Example 63 | (73) | 0.50 | Developer 3 | 1.2 | 1.3 | 1.4 | Good | Good |
| Example 64 | (75) | 0.50 | Developer 3 | 1.2 | 1.3 | 1.4 | Good | Good |
| Example 65 | (76) | 0.50 | Developer 3 | 1.1 | 1.3 | 1.4 | Good | Good |
| Example 66 | (78) | 0.50 | Developer 3 | 1.0 | 1.2 | 1.2 | Excellent | Good |
| Example 67 | (81) | 0.50 | Developer 3 | 1.1 | 0.8 | 0.8 | Excellent | Fair |
| Example 68 | (86) | 0.50 | Developer 3 | 1.1 | 0.7 | 0.7 | Good | Fair |
| Example 69 | (90) | 0.50 | Developer 3 | 1.1 | 0.7 | 0.7 | Excellent | Fair |
| Example 70 | (92) | 0.50 | Developer 3 | 1.3 | 1.0 | 1.3 | Excellent | Good |
| Example 71 | (93) | 0.50 | Developer 3 | 1.3 | 1.0 | 1.3 | Excellent | Good |
| Example 72 | (94) | 0.50 | Developer 3 | 1.4 | 0.8 | 1.0 | Excellent | Good |
| Example 73 | (95) | 0.50 | Developer 3 | 1.0 | 1.1 | 1.2 | Excellent | Good |
| Example 74 | (96) | 0.50 | Developer 3 | 1.0 | 1.1 | 1.2 | Excellent | Good |
| Comp. Ex. 4 | None | 0.00 | Developer 1 | 1.0 | 1.0 | 1.0 | Poor | Poor |
| Comp. Ex. 5 | None | 0.00 | Developer 3 | 1.0 | 1.0 | 1.1 | Poor | Poor |
| Comp. Ex. 6 | None | 0.00 | Developer 5 | 1.0 | 1.1 | 1.1 | Poor | Poor |
| Example 75 | (29) | 0.50 | Developer 7 | 0.9 | 1.0 | 1.2 | Good | Fair |
| Example 76 | (29) | 0.50 | Developer 8 | 1.3 | 1.1 | 1.0 | Excellent | Good |

As shown in Table 10, by introducing the specific ethylenically unsaturated compound into the photosensitive layer, development residue could be improved while maintaining sensitivity and plate life. Furthermore, halftone dot reproduction could be improved.

It has also been found that from the viewpoint of sensitivity and plate life, a methacryloyl group (group represented by Formula (A)) is most preferable and, moreover, from the viewpoint of sensitivity and plate life, a compound containing a urethane skeleton in the molecule is preferable.

Comparing Example 75 and Example 48, it was better from the viewpoint of halftone dot reproduction for a developer having buffering capacity to be used.

Examples 77 to 100 and Comparative Examples 7 to 9

Preparation of Support

A support was prepared in the same manner as in Example 1.

Formation of Photosensitive Layer

Photosensitive layer coating liquid 3 was prepared as follows and applied onto the support formed as above by means of a wire-wound bar. Drying was carried out using a hot air dryer at 100° C. for 60 sec. The dry coat weight was 1.4 $g/m^2$.

Photosensitive Layer Coating Liquid 3

| | | |
|---|---|---|
| IR absorber (IR-1) | 0.030 | parts by weight |
| Polymerization initiator A (I-2) | 0.069 | parts by weight |

-continued

| | | |
|---|---|---|
| Polymerization initiator B (I-3) | 0.094 | parts by weight |
| Mercapto compound (E-1) | 0.020 | parts by weight |
| Ethylenically unsaturated compound (compound example in Table 11) | x | parts by weight |
| Ethylenically unsaturated compound (M-2) (A-BPE-4, Shin-Nakamura Chemical Co., Ltd.) | (0.500 − x) | parts by weight |
| Binder polymer A (B-3) (Mw = 110,000) | 0.250 | parts by weight |
| Binder polymer B (B-4) (Mw = 100,000) | 0.200 | parts by weight |
| Binder polymer C (B-5) (Mw = 120,000) | 0.150 | parts by weight |
| Additive (T-1) | 0.080 | parts by weight |
| Polymerization inhibitor (Q-1) | 0.0012 | parts by weight |
| Ethyl Violet (EV-1) | 0.021 | parts by weight |
| Fluorine-based surfactant (Megafac F-780-F, Dai-Nippon Ink & Chemicals, Inc., methyl isobutyl ketone (MIBK) 30 wt % solution) | 0.0081 | parts by weight |
| Methyl ethyl ketone | 5.886 | parts by weight |
| Methanol | 2.733 | parts by weight |
| 1-Methoxy-2-propanol | 5.886 | parts by weight |

The structures of the IR absorber (IR-1), polymerization initiator A (I-2), polymerization initiator B (I-3), the mercapto compound (E-1), the polymerizable compound (M-2), binder polymer A (B-3), binder polymer B (B-4), binder polymer C (B-5), the additive (T-1), the polymerization inhibitor (Q-1), and ethyl violet (EV-1) used in photosensitive layer coating liquid 3 are shown below.

(IR-1)
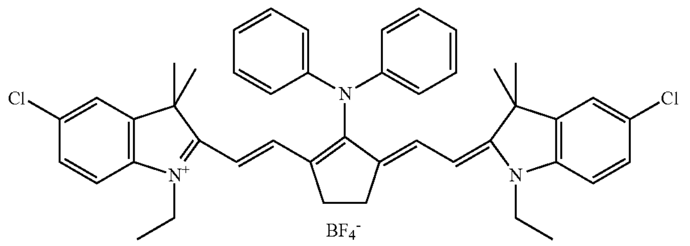
(I-2)
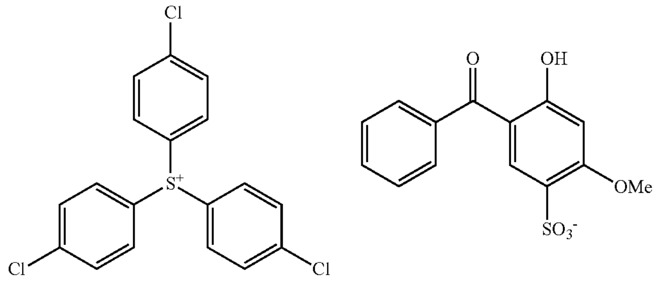
(I-3)
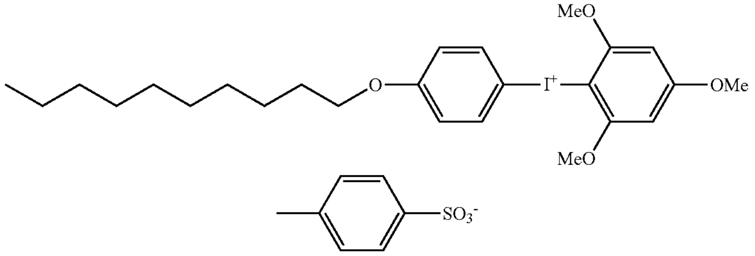
(E-1)
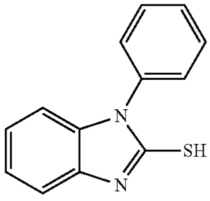
(M-2)
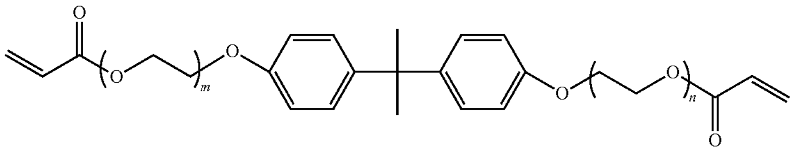
$m + n = 4$
(B-3)
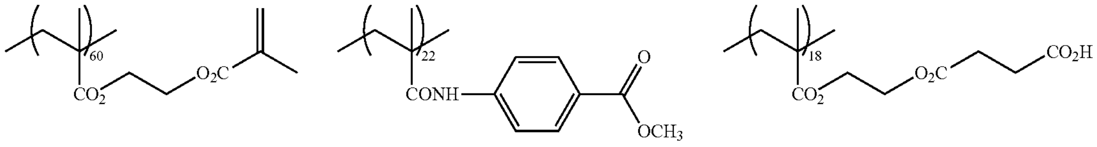
(B-4)
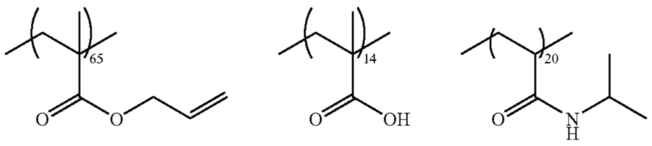

-continued (B-5)

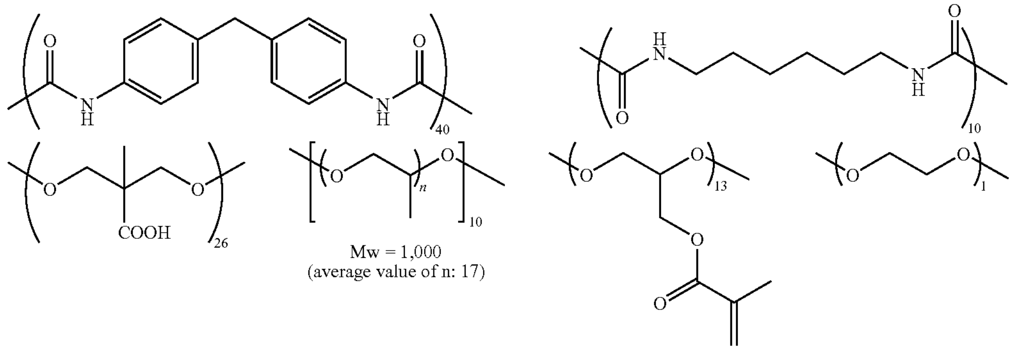

Mw = 1,000
(average value of n: 17)

(T-1)

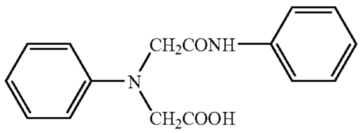

(Q-1)

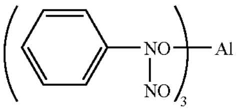

(EV-1)

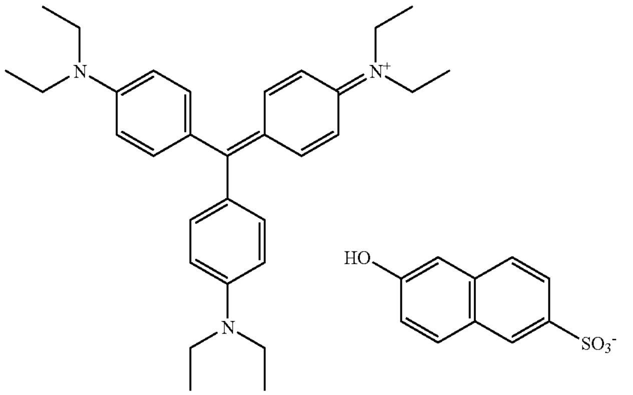

Formation of Protective Layer

A protective layer was formed in the same manner as in Example 1.

Exposure, Development, and Printing

The lithographic printing plate precursor thus obtained was subjected to exposure, development processing, and drying steps in sequence.

Imagewise exposure was carried out using as a light source (setter) used in exposure an IR semiconductor laser (Creo Trendsetter 3244VX: equipped with a water-cooled 40 W IR semiconductor laser) under conditions of an output of 9 W, an exterior drum rotational speed of 210 rpm, a resolution of 2,400 dpi, and a halftone dot area percentage of 50%. Subsequently, after pre-heating was carried out at 100° C. for 30 sec within 30 sec after the exposure, development processing was carried out in an automatic development processor having the structure shown in FIG. 1 using each developer described above in the same manner as in Example 1.

The lithographic printing plate thus obtained was mounted on a SOR-M printing machine (Heidelberg), and printing was carried out at a printing speed of 6,000 sheets per hour using dampening water (EU-3 (etching liquid, Fujifilm Corporation))/water/isopropyl alcohol=1/89/10 (ratio by volume)) and TRANS-G(N) black ink (Dai-Nippon Ink & Chemicals, Inc.).

Evaluation

Developability, sensitivity, plate life, development residue, and halftone dot reproduction were evaluated using the lithographic printing plates obtained in the same manner as in Example 1.

TABLE 11

| | Ethylenically Unsaturated Compound | Amount Added (Parts By Weight) | Developer | Developability | Sensitivity | Plate Life | Development Residue | Halftone Dot Reproduction |
|---|---|---|---|---|---|---|---|---|
| Example 77 | (1) | 0.50 | Developer 3 | 1.2 | 1.0 | 0.7 | Good | Good |
| Example 78 | (2) | 0.50 | Developer 3 | 1.2 | 1.2 | 0.8 | Good | Good |
| Example 79 | (27) | 0.50 | Developer 3 | 1.3 | 1.1 | 1.0 | Excellent | Good |
| Example 80 | (29) | 0.50 | Developer 1 | 1.3 | 1.1 | 1.2 | Excellent | Good |
| Example 81 | (29) | 0.50 | Developer 2 | 1.3 | 1.0 | 1.2 | Excellent | Good |
| Example 82 | (29) | 0.25 | Developer 3 | 1.2 | 1.2 | 1.3 | Good | Fair |
| Example 83 | (29) | 0.50 | Developer 3 | 1.4 | 1.1 | 1.3 | Excellent | Good |
| Example 84 | (29) | 0.50 | Developer 4 | 1.4 | 1.1 | 1.3 | Excellent | Good |

TABLE 11-continued

| | Ethylenically Unsaturated Compound | Amount Added (Parts By Weight) | Developer | Develop-ability | Sensi-tivity | Plate Life | Development Residue | Halftone Dot Reproduction |
|---|---|---|---|---|---|---|---|---|
| Example 85 | (29) | 0.50 | Developer 5 | 1.4 | 1.1 | 1.2 | Excellent | Good |
| Example 86 | (29) | 0.50 | Developer 6 | 1.3 | 1.1 | 1.1 | Excellent | Good |
| Example 87 | (47) | 0.50 | Developer 3 | 1.6 | 1.1 | 1.3 | Excellent | Good |
| Example 88 | (50) | 0.50 | Developer 3 | 1.6 | 1.2 | 1.3 | Excellent | Good |
| Example 89 | (52) | 0.50 | Developer 3 | 1.6 | 1.2 | 1.3 | Excellent | Good |
| Example 90 | (58) | 0.50 | Developer 3 | 1.3 | 1.3 | 1.2 | Excellent | Good |
| Example 91 | (63) | 0.50 | Developer 3 | 1.6 | 1.2 | 1.2 | Excellent | Good |
| Example 92 | (66) | 0.50 | Developer 3 | 1.6 | 1.1 | 1.3 | Excellent | Good |
| Example 93 | (71) | 0.50 | Developer 3 | 1.2 | 1.2 | 1.3 | Good | Good |
| Example 94 | (72) | 0.50 | Developer 3 | 1.2 | 1.2 | 1.2 | Excellent | Good |
| Example 95 | (73) | 0.50 | Developer 3 | 1.3 | 1.4 | 1.4 | Good | Good |
| Example 96 | (75) | 0.50 | Developer 3 | 1.3 | 1.4 | 1.4 | Good | Good |
| Example 97 | (81) | 0.50 | Developer 3 | 1.2 | 0.9 | 0.8 | Excellent | Fair |
| Example 98 | (83) | 0.50 | Developer 3 | 1.2 | 0.8 | 0.7 | Excellent | Fair |
| Comp. Ex. 7 | None | 0.00 | Developer 1 | 1.0 | 1.0 | 1.0 | Poor | Poor |
| Comp. Ex. 8 | None | 0.00 | Developer 3 | 1.0 | 1.1 | 1.1 | Poor | Poor |
| Comp. Ex. 9 | None | 0.00 | Developer 5 | 1.0 | 1.0 | 1.1 | Poor | Poor |
| Example 99 | (29) | 0.50 | Developer 7 | 0.9 | 1.0 | 1.2 | Good | Fair |
| Example 100 | (29) | 0.50 | Developer 8 | 1.4 | 1.0 | 1.0 | Excellent | Good |

As shown in Table 11, by introducing the specific ethylenically unsaturated compound into the photosensitive layer, development residue could be improved while maintaining sensitivity and plate life. Furthermore, halftone dot reproduction could be improved.

It has also been found that from the viewpoint of sensitivity and plate life, a methacryloyl group (group represented by Formula (A)) is most preferable and, moreover, from the viewpoint of sensitivity and plate life, a compound containing a urethane skeleton in the molecule is preferable.

Comparing Example 99 and Example 83, it was better from the viewpoint of halftone dot reproduction for a developer having buffering capacity to be used.

Examples 101 to 107 and Comparative Example 10

Preparation of Lithographic Printing Plate Precursor (101)

Preparation of Support 101

A 0.24 mm thick aluminum plate (material 1050, temper H16) was immersed for 1 min in a 5% aqueous solution of sodium hydroxide kept at 65° C. so as to carry out degreasing, and then washed with water. This degreased aluminum plate was neutralized by immersion for 1 min in a 10% aqueous solution of hydrochloric acid kept at 25° C., and then washed with water. Subsequently, this aluminum plate was subjected to electrolytic surface roughening for 60 sec in a 0.3 wt % aqueous solution of hydrochloric acid at 25° C. using AC with a current density of 100 A/dm$^2$, and then subjected to a desmutting treatment for 10 sec in a 5% aqueous solution of sodium hydroxide kept at 60° C. The aluminum plate that had been subjected to the surface roughening and the desmutting treatment was subjected to an anodizing treatment for 1 min in a 15% aqueous solution of sulfuric acid under conditions of 25° C., a current density of 10 A/dm$^2$, and a voltage of 15 V, and further subjected to a hydrophilization treatment using a 1% aqueous solution of polyvinylphosphonic acid at 75° C., thus giving a support. The surface roughness thereof was measured and found to be 0.44 μm (as Ra in accordance with JIS B0601).

Formation of Photosensitive Layer 101

Support 101 above was bar-coated with photosensitive layer coating liquid 4 having the composition below and dried in an oven at 90° C. for 60 sec, thus giving photosensitive layer 101 with a dry coat weight of 1.3 g/m$^2$.

Photosensitive Layer Coating Liquid 4

| | |
|---|---|
| Binder polymer (1) below (weight-average molecular weight: 50,000) | 0.04 parts by weight |
| Binder polymer (2) below (weight-average molecular weight: 80,000) | 0.30 parts by weight |
| Ethylenically unsaturated compound in Table 12 | 0.68 parts by weight |
| Sensitizing dye (1) below | 0.03 parts by weight |
| Sensitizing dye (2) below | 0.015 parts by weight |
| Sensitizing dye (3) below | 0.015 parts by weight |
| Polymerization initiator (1) below | 0.13 parts by weight |
| Chain transfer agent: mercaptobenzothiazole | 0.01 parts by weight |
| ε-Phthalocyanine pigment dispersion | 0.40 parts by weight |
| (pigment: 15 parts by weight, allyl methacrylate/methacrylic acid copolymer (weight-average molecular weight: 60,000, copolymerization molar ratio: 83/17): 10 parts by weight as dispersant, cyclohexanone: 15 parts by weight) | |
| Thermopolymerization inhibitor | 0.01 parts by weight |
| aluminum N-nitrosophenylhydroxylamine | |

-continued
| | |
|---|---|
| Water-soluble fluorine-based surfactant (1) below (Mw = 11,000) | 0.001 parts by weight |
| 1-Methoxy-2-propanol | 3.5 parts by weight |
| Methyl ethyl ketone | 8.0 parts by weight |
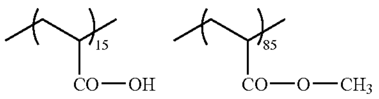
Binder polymer (1)
The acid value of binder polymer (1) was 85 mg KOH/g.
Binder polymer (2)
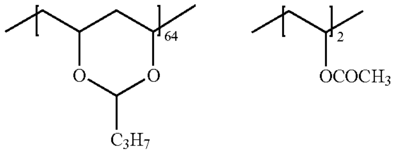
-continued
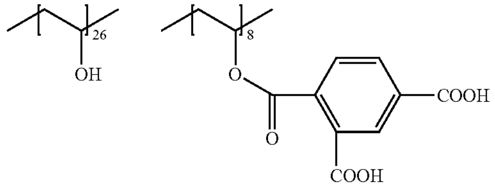
The acid value of binder polymer (2) was 66 mgKOH/g.
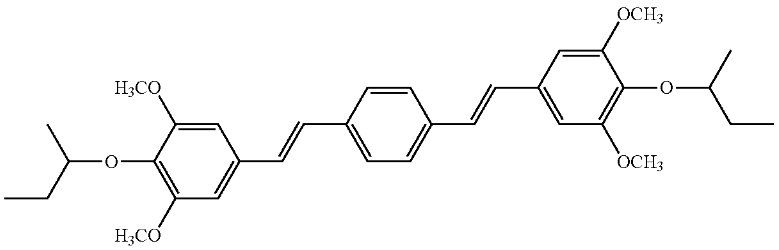
Sensitizing dye (1)
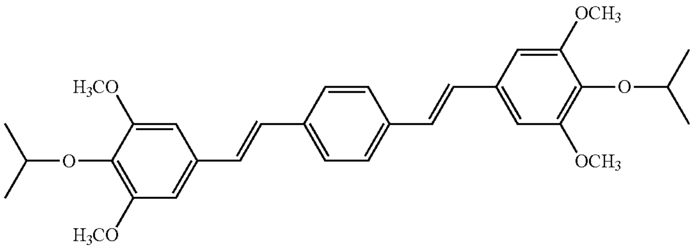
Sensitizing dye (2)
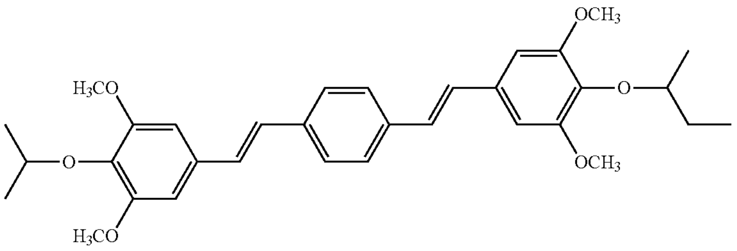
Sensitizing dye (3)

-continued

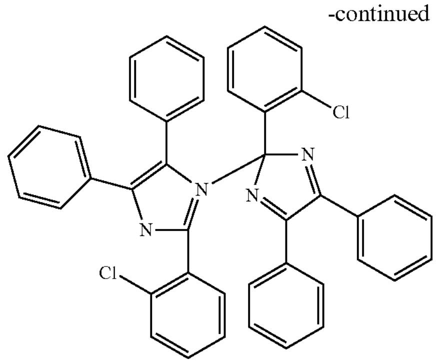

Polymerization initiator (1)

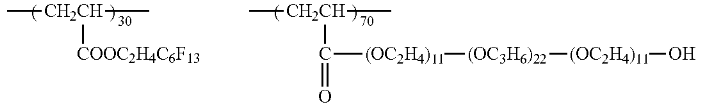

Water-soluble fluorine-based surfactant (1)

Formation of Protective Layer 101

Photosensitive layer 101 above was coated with protective layer coating liquid 2 having the composition below by means of a bar coater and dried in an oven at 125° C. for 70 sec, thus forming protective layer 101 with a dry coat weight of 1.2 $g/m^2$ and thereby giving lithographic printing plate precursor (101).

Protective Layer Coating Liquid 2

| | | |
|---|---|---|
| PVA-205 (partially hydrolyzed polyvinyl alcohol, Kuraray Co., Ltd., degree of saponification = 86.5 to 89.5 mol %, viscosity = 4.6 to 5.4 mPa · s (20° C. in 4 wt % aqueous solution)) | 0.658 | parts by weight |
| PVA-105 (fully hydrolyzed polyvinyl alcohol, Kuraray Co., Ltd., degree of saponification = 98.0 to 99.0 mol %, viscosity = 5.2 to 6.0 mPa · s (20° C., in 4 wt % aqueous solution)) | 0.142 | parts by weight |
| Poly(vinylpyrrolidone/vinyl acetate (1/1)) (molecular weight 70,000) | 0.001 | parts by weight |
| Surfactant (Emalex 710, Nihon-Emulsion Co., Ltd) | 0.002 | parts by weight |
| Water | 13 | parts by weight |

Developer 9

| | | |
|---|---|---|
| Water | 88.6 | parts by weight |
| Nonionic surfactant (W-1) | 2.4 | parts by weight |
| Nonionic surfactant (W-2) | 2.4 | parts by weight |
| Nonionic surfactant (Emalex 710, Nihon-Emulsion Co., Ltd) | 1.0 | part by weight |

-continued

| | | |
|---|---|---|
| Phenoxypropanol | 1.0 | part by weight |
| Octanol | 0.6 | part by weight |
| N-(2-Hydroxyethyl)morpholine | 1.0 | part by weight |
| Triethanolamine | 0.5 | parts by weight |
| Sodium gluconate | 1.0 | part by weight |
| Trisodium citrate | 0.5 | parts by weight |
| Tetrasodium ethylenediamine tetraacetate | 0.05 | parts by weight |
| Polystyrenesulfonic acid (Versa TL77 (30% solution), Alco chemical) | 1.0 | part by weight |

The pH of the developer having the composition above was adjusted to 7.0 by adding phosphoric acid.

(W-1)

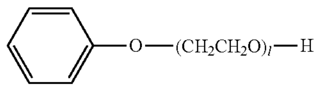

$l$ = 13-28

(W-2)

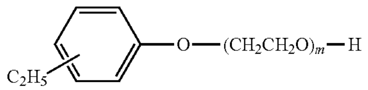

$m$ = 12-26

Evaluation of developability, sensitivity, plate life, development residue, and halftone dot reproduction was carried out in the same manner as in Example 1. The evaluation results are shown together in Table 12 below.

TABLE 12

| | Ethylenically Unsaturated Compound | Developer | Develop-ability | Sensi-tivity | Plate Life | Development Residue | Halftone Dot Reproduction |
|---|---|---|---|---|---|---|---|
| Example 101 | (29) | Developer 9 | 1.3 | 1.0 | 1.1 | Excellent | Good |
| Example 102 | (58) | Developer 9 | 1.3 | 1.0 | 1.1 | Excellent | Good |
| Example 103 | (92) | Developer 9 | 1.5 | 1.0 | 1.2 | Excellent | Good |
| Example 104 | (93) | Developer 9 | 1.5 | 1.0 | 1.2 | Excellent | Good |
| Example 105 | (94) | Developer 9 | 1.6 | 0.8 | 1.0 | Excellent | Good |
| Example 106 | (95) | Developer 9 | 1.3 | 1.1 | 1.2 | Excellent | Good |

TABLE 12-continued

| | Ethylenically Unsaturated Compound | Developer | Develop-ability | Sensi-tivity | Plate Life | Development Residue | Halftone Dot Reproduction |
|---|---|---|---|---|---|---|---|
| Example 107 | (96) | Developer 9 | 1.3 | 1.1 | 1.2 | Excellent | Good |
| Comp. Ex. 10 | Compound below | Developer 9 | 1.0 | 1.0 | 1.0 | Poor | Good |

The ethylenically unsaturated compound used in Comparative Example 10 was the compound below.

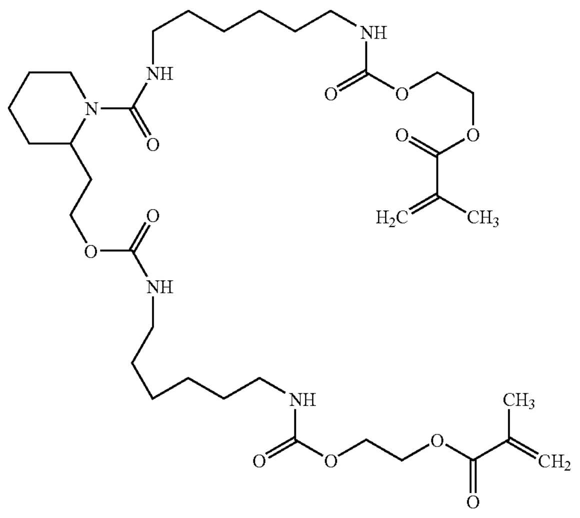

The invention claimed is:

1. A lithographic printing plate precursor comprising above a support a photosensitive layer comprising (i) a binder polymer, (ii) an ethylenically unsaturated compound, and (iii) a polymerization initiator, the ethylenically unsaturated compound (ii) comprising a compound selected from the group consisting of compounds represented by Formulae (2) to (4) below, (2)

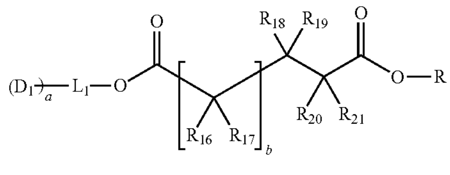

(3)

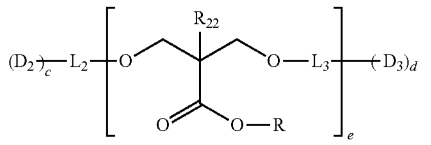

-continued (4)

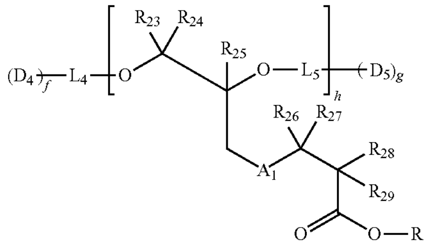

wherein $L_1$ denotes an (a+1)-valent linking group having a urethane bond, $L_2$ denotes a (c+1)-valent linking group having a urethane bond, $L_3$ denotes a (d+1)-valent linking group having a urethane bond. $L_4$ denotes an (f+1)-valent linking group having a urethane bond, $L_5$ denotes a (g+1)-valent linking group having a urethane bond, $A_1$ denotes an oxygen atom, a sulfur atom, or $NR_{30}$ wherein $R_{30}$ denotes a monovalent substituent, $D_1$ to $D_5$ each independently denotes a group selected from the group consisting of groups represented by Formulae (A) to (D) below, the Rs each independently denotes a monovalent substituent, $R_{16}$ to $R_{29}$ each independently denotes a monovalent substituent, a, c, d, f and g each independently denotes an integer of 1 to 19, b denotes an integer of 0 to 3, e denotes an integer of 1 to 10, and h denotes an integer of 1 to 10, (A)

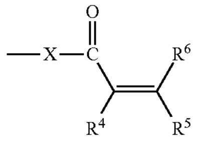

(B)

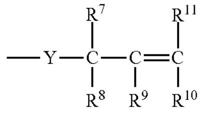

(C)

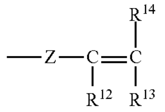

(D)

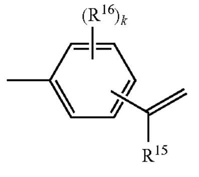

wherein X, Y, and Z each independently denotes an oxygen atom, a sulfur atom, or $NR^{17}$, $R^4$ to $R^{14}$ and $R^{17}$ each independently denotes a hydrogen atom or a monovalent substituent, $R^{15}$ denotes a hydrogen atom or a methyl group, $R^{16}$ denotes a monovalent substituent, and k denotes an integer of 0 to 4.

2. The lithographic printing plate precursor according to claim 1, wherein $D_1$ to $D_5$ in Formulae (2) to (4) above each independently is a group represented by Formula (A).

3. The lithographic printing plate precursor according to claim 1, wherein the Rs in Formulae (2) to (4) above each independently is a methyl group, a tetrahydropyranylmethyl group, a phenacyl group, an N-phthalimidomethyl group, a chloromethyl group, a 2-chloroethyl group, a 2-bromoethyl group, a 2-cyanoethyl group, a 2,2,2-trichloroethyl group, a 2,2,2-trifluoroethyl group, a 2-(p-toluenesulfonyl)ethyl group, a phenoxyethyl group, a cinnamyl group, a benzyl group, a triphenylmethyl group, an o-nitrobenzyl group, a bis(o-nitrophenyl)methyl group, a 2-(9,10-dioxo)anthrylmethyl group, a piperonyl group, a trimethylsilyl group, or a triisopropylsilyl group.

4. The lithographic printing plate precursor according to claim 1, wherein the Rs in Formulae (2) to (4) above each independently is a group represented by Formula (R-1) below, (R-1)

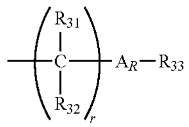

wherein $A_R$ denotes an oxygen atom, a sulfur atom, or $NR_{34}$, $R_{31}$ to $R_{34}$ each independently denotes a monovalent substituent, and r denotes an integer of 1 or greater.

5. The lithographic printing plate precursor according to claim 1, wherein the Rs in Formulae (2) to (4) above each independently is a methyl group, a methoxyethyl group, an ethoxyethyl group, a methoxyethoxyethyl group, an ethoxyethoxyethyl group, a methoxypoly(ethyleneoxy)ethyl group, a methylsulfanylethyl group, an ethylsulfanylethyl group, a dimethylaminoethyl group, or a diethylaminoethyl group.

6. The lithographic printing plate precursor according to claim 1, wherein the binder polymer (i) comprises at least an acrylic resin, a polyurethane resin, or a butyral resin.

7. The lithographic printing plate precursor according to claim 1, wherein the lithographic printing plate precursor comprises a protective layer above the photosensitive layer.

8. The lithographic printing plate precursor according to claim 7, wherein the protective layer comprises an inorganic layered compound.

9. A process for producing a lithographic printing plate comprising: an exposure step of imagewise exposing the lithographic printing plate precursor according to claim 1; and a development step of removing the photosensitive layer of a non-exposed portion in the presence of a developer having buffering capacity.

10. The process for producing a lithographic printing plate according to claim 9, wherein the developer having buffering capacity has a pH of 7.5 to 11.0.

11. The process for producing a lithographic printing plate according to claim 9, wherein the developer having buffering capacity is a developer comprising (a) a combination of carbonate ion-hydrogen carbonate ion, (b) borate ion, or (c) a combination of water-soluble amine compound-ion of the amine compound.

12. The process for producing a lithographic printing plate according to claim 9, wherein the developer having buffering capacity is a developer comprising (a) a combination of carbonate ion-hydrogen carbonate ion.

13. The process for producing a lithographic printing plate according to claim 9, wherein the developer having buffering capacity comprises a water-soluble polymer compound.

14. The process for producing a lithographic printing plate according to claim 9, wherein the development step is a step of carrying out using a single liquid removal of the photosensitive layer of a non-exposed portion and a gumming treatment.

15. The process for producing a lithographic printing plate according to claim 9, wherein a water-washing step is not carried out either prior to or subsequent to the development step.

16. The lithographic printing plate precursor according to claim 1, wherein the Rs in Formulae (2) to (4) above each independently is a methyl group.

17. The lithographic printing plate precursor according to claim 1, wherein the ethylenically unsaturated compound comprises a compound selected from the group consisting of compounds represented by Formulae (3) and (4) above.

18. The lithographic printing plate precursor according to claim 1, wherein the ethylenically unsaturated compound comprises a compound represented by Formula (4) above.

* * * * *